United States Patent
Kang et al.

(10) Patent No.: US 12,100,689 B2
(45) Date of Patent: Sep. 24, 2024

(54) APPARATUS AND METHOD FOR MANUFACTURING LIGHT-EMITTING DISPLAY DEVICE

(71) Applicant: SAMSUNG DISPLAY CO., LTD., Yongin-si (KR)

(72) Inventors: Jong Hyuk Kang, Yongin-si (KR); Hae Yun Choi, Yongin-si (KR); Han Su Kim, Yongin-si (KR); Eun A Yang, Yongin-si (KR); Hyun Min Cho, Yongin-si (KR); Keun Kyu Song, Yongin-si (KR); Jin Oh Kwag, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 618 days.

(21) Appl. No.: 17/276,776

(22) PCT Filed: Mar. 21, 2019

(86) PCT No.: PCT/KR2019/003328
§ 371 (c)(1),
(2) Date: Mar. 16, 2021

(87) PCT Pub. No.: WO2020/059988
PCT Pub. Date: Mar. 26, 2020

(65) Prior Publication Data
US 2021/0320089 A1     Oct. 14, 2021

(30) Foreign Application Priority Data

Sep. 21, 2018    (KR) ........................ 10-2018-0114425

(51) Int. Cl.
*H01L 25/075*     (2006.01)
*B05C 13/02*     (2006.01)
(Continued)

(52) U.S. Cl.
CPC .......... *H01L 25/0753* (2013.01); *B05C 13/02* (2013.01); *H01L 21/67259* (2013.01); *H05K 13/027* (2013.01); *H05K 13/04* (2013.01)

(58) Field of Classification Search
None
See application file for complete search history.

(56) References Cited

U.S. PATENT DOCUMENTS

| 7,008,811 B2 | 3/2006 | Park et al. |
| 7,111,755 B2 | 9/2006 | Koyama et al. |

(Continued)

FOREIGN PATENT DOCUMENTS

| CN | 1653620 | 8/2005 |
| CN | 107584885 | 1/2018 |

(Continued)

OTHER PUBLICATIONS

International Search Report, with English translation, corresponding to International Application No. PCT/ KR2019/003328 dated Jul. 3, 2019.

(Continued)

*Primary Examiner* — Jethro M. Pence
(74) *Attorney, Agent, or Firm* — KILE PARK REED & HOUTTEMAN PLLC

(57) ABSTRACT

An apparatus for manufacturing a light emitting display device includes a substrate transfer stage including a plurality of support plates arranged at an interval in a first direction, each of the plurality of support plates extending in a second direction; and at least one electric-field application module disposed on at least one side of the substrate transfer stage. The at least one electric-field application module includes a probe head including at least one probe pin; and a driver connected to the probe head to move the probe head at least up and down.

14 Claims, 41 Drawing Sheets

(51) Int. Cl.
*H01L 21/67* (2006.01)
*H01L 33/00* (2010.01)
*H05K 13/02* (2006.01)
*H05K 13/04* (2006.01)

(56) References Cited

U.S. PATENT DOCUMENTS

| | | | |
|---|---|---|---|
| 8,877,636 B1 | 11/2014 | Hunter et al. | |
| 9,181,630 B2 | 11/2015 | Shibata et al. | |
| 9,525,030 B2 | 12/2016 | Hwang et al. | |
| 10,249,603 B2 | 4/2019 | Cho et al. | |
| 10,340,419 B2 | 7/2019 | Kim et al. | |
| 10,438,834 B2* | 10/2019 | Matsuura | H01L 21/68 |
| 10,453,695 B2* | 10/2019 | Eto | H01L 21/3065 |
| 10,910,251 B2* | 2/2021 | Matsuura | H01L 21/68 |
| 11,005,009 B2* | 5/2021 | Kim | H01L 33/44 |
| 11,600,472 B2* | 3/2023 | Isomura | H01L 21/67184 |
| 11,685,154 B2* | 6/2023 | Lee | H01L 25/0753 347/14 |
| 11,728,196 B2* | 8/2023 | Lee | H01L 25/0753 438/28 |
| 2003/0108804 A1 | 6/2003 | Cheng et al. | |
| 2006/0263705 A1 | 11/2006 | Kim et al. | |
| 2007/0184363 A1 | 8/2007 | Kim et al. | |
| 2013/0168708 A1 | 7/2013 | Shibata et al. | |
| 2015/0276639 A1 | 10/2015 | Spath et al. | |
| 2017/0136700 A1 | 5/2017 | Li et al. | |
| 2018/0138157 A1 | 5/2018 | Im et al. | |
| 2021/0090929 A1* | 3/2021 | Yang | H01L 33/0095 |
| 2021/0126158 A1* | 4/2021 | Kang | B41J 3/407 |
| 2021/0265529 A1* | 8/2021 | Kim | H01L 33/0075 |
| 2021/0320089 A1* | 10/2021 | Kang | H05K 13/04 |
| 2022/0165911 A1* | 5/2022 | Kang | H01L 33/005 |
| 2022/0165928 A1* | 5/2022 | Baek | H01L 25/167 |
| 2022/0254657 A1* | 8/2022 | Choi | H01L 33/0095 |
| 2022/0254753 A1* | 8/2022 | Lee | H01L 21/6715 |
| 2022/0320365 A1* | 10/2022 | Ryu | B41J 2/06 |
| 2022/0352042 A1 | 11/2022 | Lee et al. | |
| 2022/0388303 A1* | 12/2022 | Cho | B41J 2/04501 |
| 2022/0396073 A1* | 12/2022 | Park | B41J 2/06 |
| 2023/0025604 A1* | 1/2023 | Im | B41J 2/14072 |
| 2023/0047796 A1* | 2/2023 | Ryu | B41J 2/0456 |
| 2023/0145433 A1* | 5/2023 | Kang | B41J 2/04586 347/85 |
| 2023/0150277 A1* | 5/2023 | Lee | B41J 11/00216 347/102 |
| 2023/0256735 A1* | 8/2023 | Hong | B41J 2/195 347/17 |
| 2023/0268454 A1* | 8/2023 | Han | H01L 33/24 438/35 |
| 2023/0286292 A1* | 9/2023 | Lee | B41J 11/0095 |

FOREIGN PATENT DOCUMENTS

| | | | | |
|---|---|---|---|---|
| CN | 108389965 | | 8/2018 | |
| EP | 3 270 413 | | 1/2018 | |
| EP | 3 270 424 | | 1/2018 | |
| JP | 2004-90621 | | 3/2004 | |
| JP | 2006-162290 | | 6/2006 | |
| JP | 2010-114161 | | 5/2010 | |
| JP | 2017-41290 | | 2/2017 | |
| KR | 10-2001-0054915 | | 7/2001 | |
| KR | 10-2006-0100600 | | 9/2006 | |
| KR | 10-2007-0073458 | | 7/2007 | |
| KR | 10-2007-0079879 | | 8/2007 | |
| KR | 10-2009-0117023 | | 11/2009 | |
| KR | 10-2011-0075082 | | 7/2011 | |
| KR | 10-2011-0078081 | | 7/2011 | |
| KR | 10-2011-0079024 | | 7/2011 | |
| KR | 10-2013-0020475 | | 2/2013 | |
| KR | 10-2013-0033450 | | 4/2013 | |
| KR | 10-2013-0044790 | | 5/2013 | |
| KR | 10-1328096 | | 11/2013 | |
| KR | 10-2014-0063331 | | 5/2014 | |
| KR | 10-1627365 | | 6/2016 | |
| KR | 10-1628345 | | 6/2016 | |
| KR | 10-2018-0007376 | | 1/2018 | |
| KR | 10-2018-0009014 | | 1/2018 | |
| KR | 10-2018-0055021 | | 5/2018 | |
| KR | 10-1987196 | | 6/2019 | |
| KR | 10-2020-0001656 | | 1/2020 | |
| KR | 10-2020-0006208 | | 1/2020 | |
| KR | 10-2020-0006209 | | 1/2020 | |
| KR | 10-2020-0031743 | | 3/2020 | |
| KR | 20200031743 A | * | 3/2020 | H01L 21/67098 |

OTHER PUBLICATIONS

Written Opinion, with English translation, corresponding to International Application No. PCT/KR2019/003328, dated Jul. 3, 2019.
International Search Report, with English translation, corresponding to International Application No. PCT/KR2019/001545 dated May 17, 2019.
Written Opinion, with English translation, corresponding to International Application No. PCT/KR2019/001545, dated May 17, 2019.
Korean Notice of Allowance for Korean Patent Application No. 10-2018-0114425, dated Nov. 20, 2023.
Chinese Office Action for Chinese Patent Application or Patent No. 201980058988.8, dated Jan. 31, 2024.
Korean Notice of Allowance for Korean Application 10-2018-0110420, dated Oct. 18, 2023.
Chinese Office Action for Chinese Application No. 201980040773.3, dated Nov. 17, 2023.

* cited by examiner

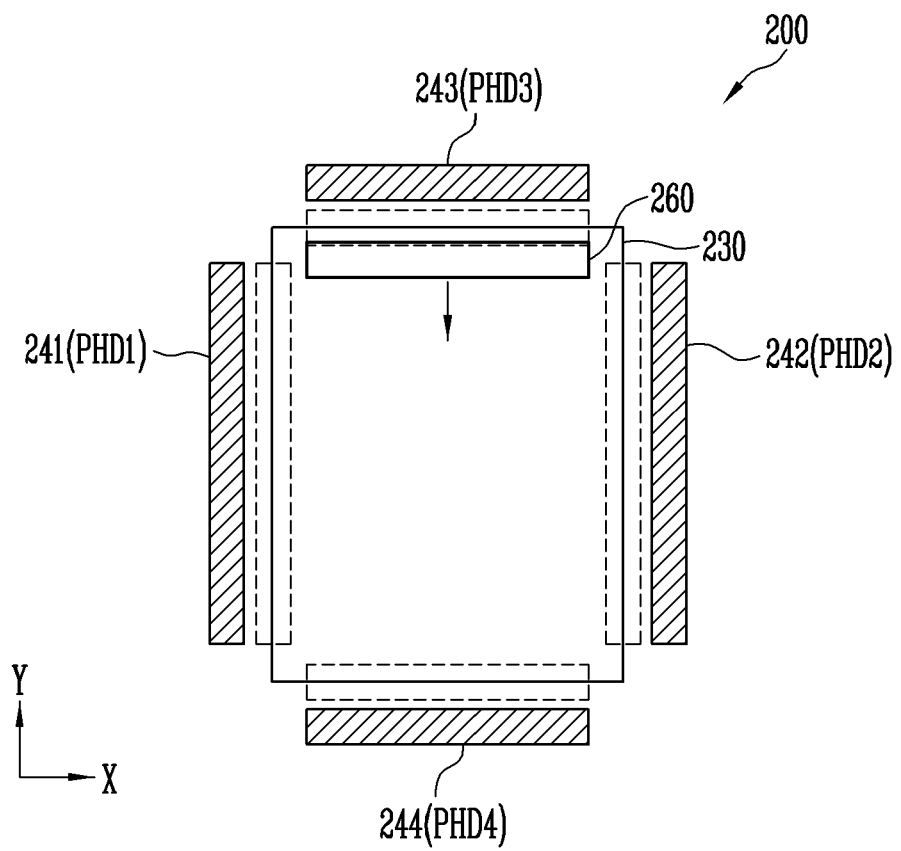

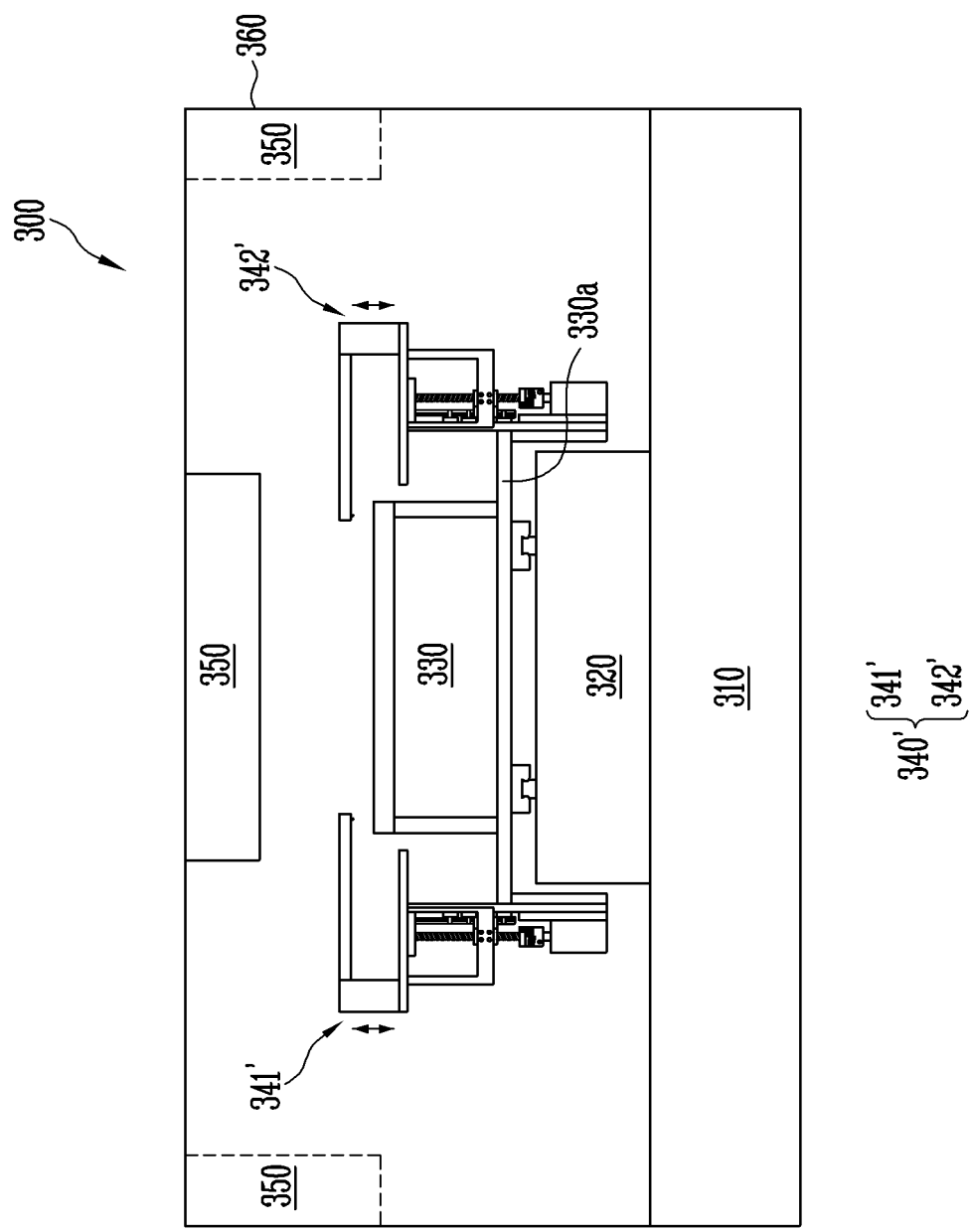

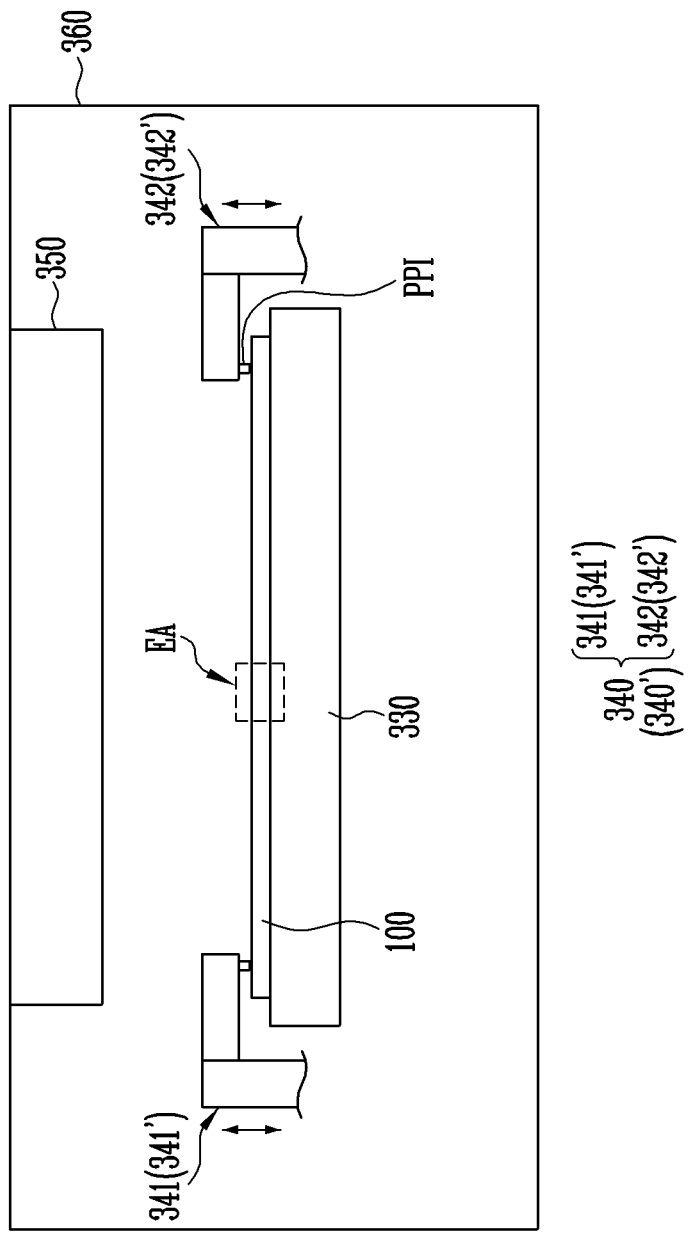

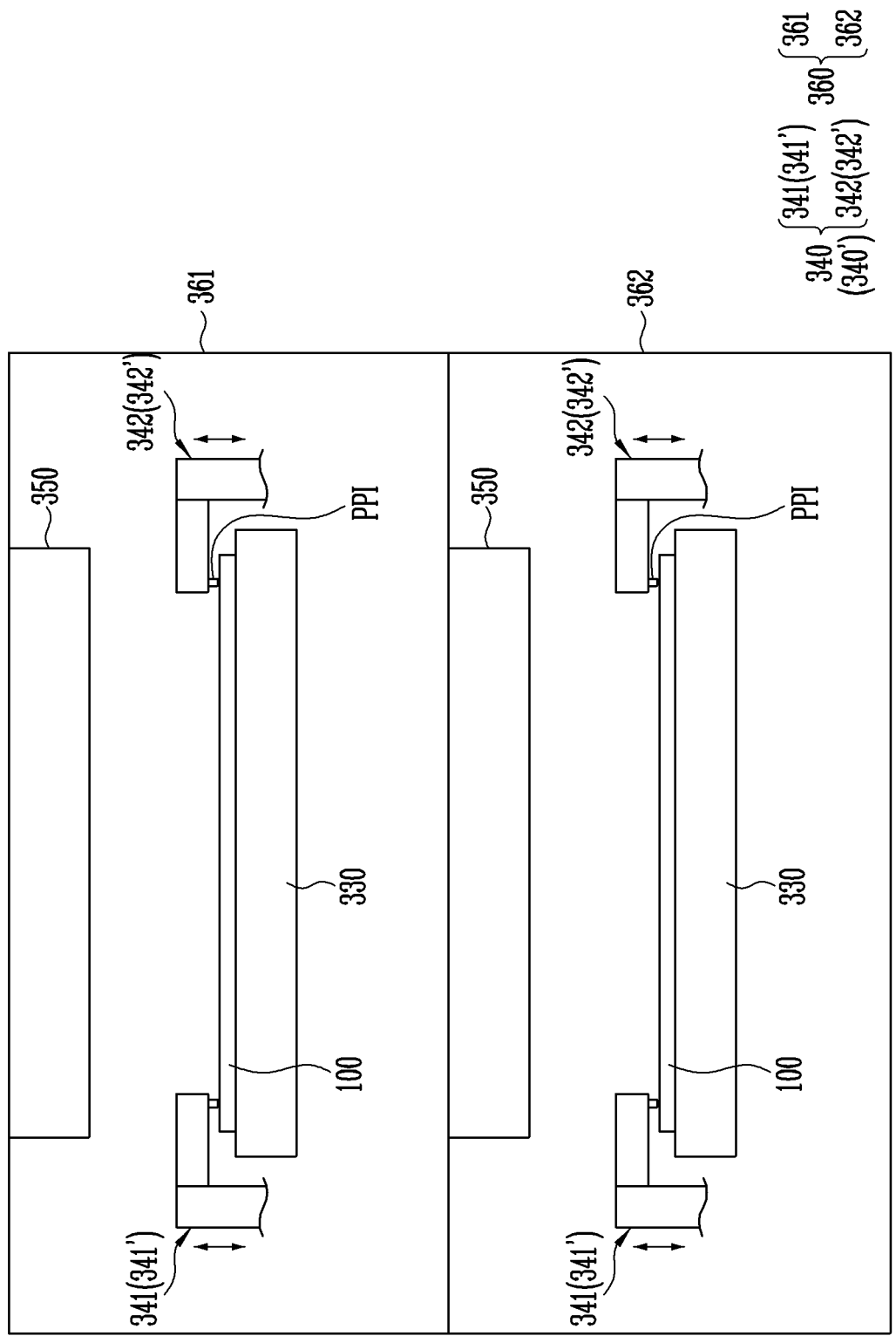

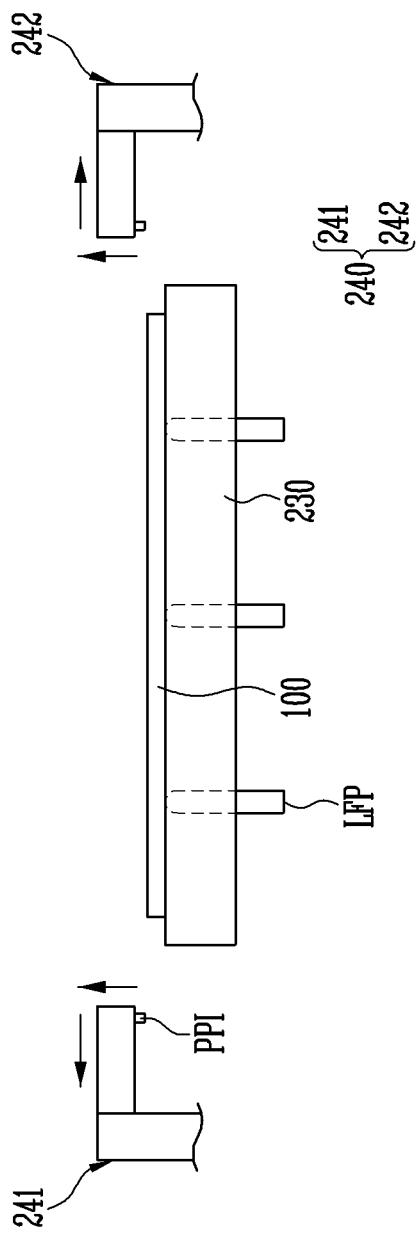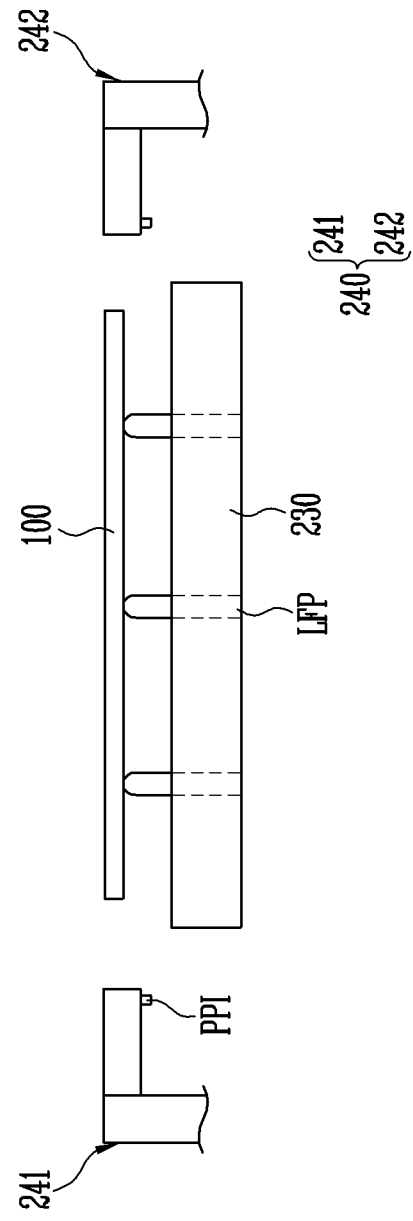

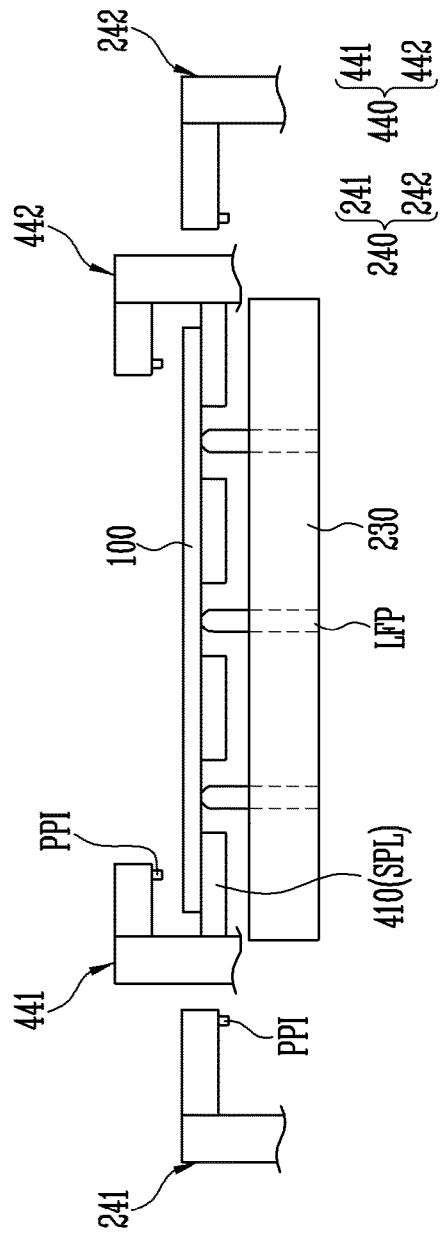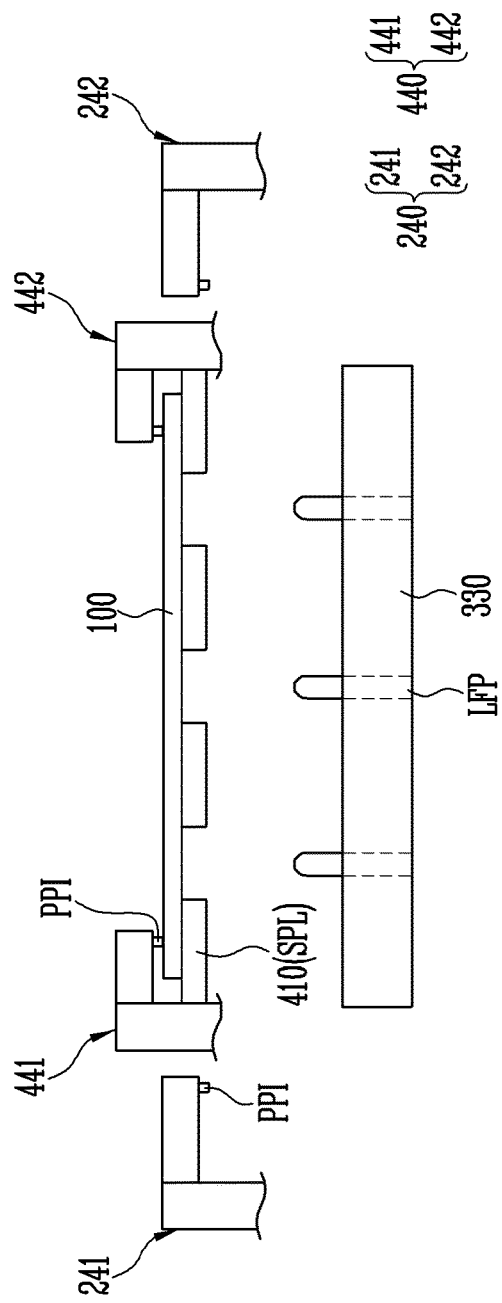

APPARATUS AND METHOD FOR MANUFACTURING LIGHT-EMITTING DISPLAY DEVICE

CROSS REFERENCE TO RELATED APPLICATIONS

This application is a national entry of International Application No. PCT/KR2019/003328, filed on Mar. 21, 2019, which claims under 35 U.S.C. §§ 119(a) and 365(b) priority to and benefits of Korean Patent Application No. 10-2018-0114425, filed on Sep. 21, 2018 in the Korean Intellectual Property Office (KIPO), the entire contents of all of which are incorporated herein by reference.

BACKGROUND

1. Technical Field

Various embodiments of the disclosure relate to an apparatus and method for manufacturing a light emitting display device.

2. Description of the Related Art

Recently, research on the technology of manufacturing a subminiature light emitting element using material having a high-reliability inorganic crystalline structure, and then disposing the subminiature light emitting diode on a panel (hereinafter, referred to as a "light emitting display panel") of a light emitting display device to use it as a next generation pixel light source is being made. As a part of such research, technology for forming a light source by manufacturing a subminiature light emitting element in a small size corresponding to the micro or nano scale and then disposing the element in an emission area of each pixel is being developed.

SUMMARY

The disclosure is directed to an apparatus and method for manufacturing a light emitting display device that are capable of stably aligning light emitting elements in each emission area.

According to an aspect of the disclosure, an apparatus for manufacturing a light emitting display device may include a substrate transfer stage including a plurality of support plates arranged at an interval in a first direction, each of the plurality of support plates extending in a second direction; and at least one electric-field application module disposed on at least a first side of the substrate transfer stage. The at least one electric-field application module may include a probe head including at least one probe pin; and a driver connected to the probe head to move the probe head at least up and down.

In an embodiment, the at least one electric-field application module may include a first electric-field application module disposed on the first side of the substrate transfer stage; and a second electric-field application module disposed on a second side of the substrate transfer stage to face the first electric-field application module.

In an embodiment, the first and second electric-field application modules may be driven independently of each other.

In an embodiment, the first and second electric-field application modules may be driven simultaneously.

In an embodiment, the plurality of support plates may include a first support plate disposed on a first edge of the substrate transfer stage; a second support plate disposed on a second edge of the substrate transfer stage; and at least one third support plate disposed between the first support plate and the second support plate.

In an embodiment, the at least one electric-field application module may include a first electric-field application module connected to the first support plate; and a second electric-field application module connected to the second support plate.

In an embodiment, the driver may include at least one of a first driver that horizontally moves the probe head forwards and backwards or leftwards and rightwards; and a second driver that vertically moves the probe head up and down.

In an embodiment, the at least one electric-field application module may include at least one sensor unit that senses a position of the probe head.

In an embodiment, the at least one electric-field application module may include a body connected to the probe head and the driver; and at least one linear motion guide connected to the body.

In an embodiment, the probe head may include at least one first probe pin electrically connected to a first power line; and at least one second probe pin electrically connected to a second power line.

In an embodiment, the apparatus may further include a power supply component electrically connected to the first and second probe pins through the first and second power lines.

In an embodiment, the first electric-field application module may be driven to apply a first voltage through the at least one probe pins.

In an embodiment, the second electric-field application module may be driven to apply a second voltage through the at least one probe pins.

In an embodiment, the first driver may include a first motor and a first ball screw connected to the first motor.

In an embodiment, the second driver may include a second motor and a second ball screw connected to the second motor.

In an embodiment, each of the first and second motors may be a servomotor.

According to an aspect of the disclosure, a method for manufacturing a light emitting display device may include preparing a substrate including first and second electrodes in each emission area, disposing the substrate on a first stage; supplying a light-emitting-element solution including a plurality of light emitting elements to the emission area while applying an alignment voltage to the first and second electrodes; inserting a plurality of support plates of a substrate transfer stage into a lower portion of the substrate, separating the substrate from the first stage by using the plurality of support plates; disposing the substrate on a second stage by using the plurality of substrate transfer stage while applying the alignment voltage to the first and second electrodes; and removing a solvent of the light-emitting-element solution.

In an embodiment, the disposing of the substrate on the second stage by using the substrate transfer stage may include driving an electric-field application module disposed on a first side of at least one of the plurality of support plates to apply the alignment voltage to the first and second electrodes.

In an embodiment, the supplying of the light-emitting-element solution may include applying the alignment voltage to the first and second electrodes by driving the electric-field application module disposed on at least a side of the first stage; and supplying the light-emitting-element solution to the emission area by a printing method during a period in which the alignment voltage is applied.

In an embodiment, the removing of the solvent of the light-emitting-element solution may include applying the alignment voltage to the first and second electrodes by driving the electric-field application module disposed on at least a side of the second stage; and supplying heat to the substrate by driving a heating element disposed around the substrate during a period in which the alignment voltage is applied.

According to an embodiment of the disclosure, an apparatus and method for manufacturing a light emitting display device can stably align light emitting elements in each emission area, thus improving the quality of alignment.

BRIEF DESCRIPTION OF THE DRAWINGS

FIGS. 17A and 17B schematically illustrate various embodiments related to a printing head that may be provided in the manufacturing apparatus of FIG. 6.

FIGS. 18 and 19 schematically illustrate an apparatus for manufacturing a light emitting display device in accordance with an embodiment of the disclosure, respectively.

FIG. 20A schematically illustrates an embodiment of a method of driving the manufacturing apparatus of FIGS. 18 and 19.

FIG. 20B schematically illustrates an embodiment of one area (area EA) of FIG. 20a.

FIG. 21 schematically illustrates an embodiment of a method of driving the manufacturing apparatus of FIGS. 18 and 19.

FIGS. 31A to 31G schematically illustrate a method of manufacturing a light emitting display device in accordance with an embodiment of the disclosure.

DETAILED DESCRIPTION OF THE EMBODIMENTS

Figure 1:
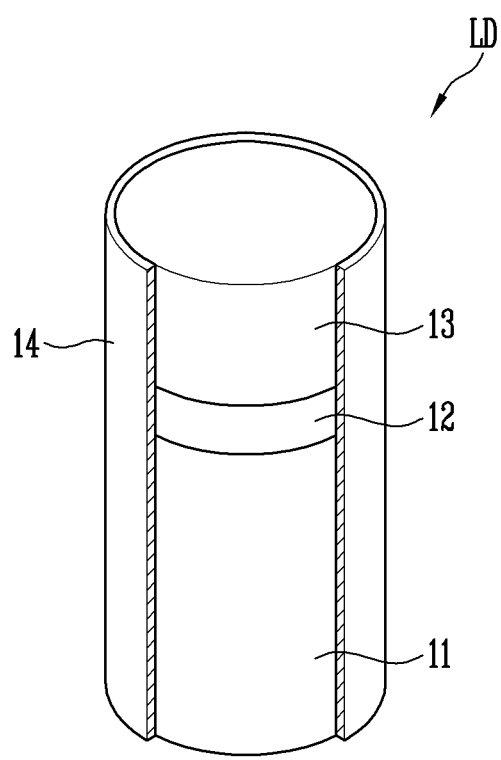
FIG. 1 schematically illustrates a light emitting element in accordance with an embodiment of the disclosure.

Reference will now be made in detail to various embodiments of the disclosure, specific examples of which are illustrated in the accompanying drawings and described below, and the embodiments of the disclosure can be variously modified in many different forms. However, the disclosure is not limited to the following embodiments and may be modified into various forms.

Some elements which are not directly related to the features of the disclosure in the drawings may be omitted to clearly explain the disclosure. Furthermore, the sizes, ratios, etc. of some elements in the drawings may be exaggerated. It should be noted that the same reference numerals are used to designate the same or similar elements throughout the drawings, and repetitive explanation may be omitted.

It will be understood that although the terms "first," "second," or the like may be used herein to describe various elements, these elements should not be limited by these terms. It will be further understood that the terms "comprise," "include," "have," or the like when used in this specification, specify the presence of stated features, integers, steps, operations, elements, components, and/or combinations of them but do not preclude the presence or addition of one or more other features, integers, steps, operations, elements, components, and/or combinations thereof. Furthermore, when a first component or part is disposed on a second component or part, the first component or part may be not only directly on the second component or part but a third component or part may intervene between them. Furthermore, the term "position," "direction," or the like used in the following description are defined in relative terms, and it should be noted that they may be changed into a reverse position or direction depending on a view angle or direction.

Embodiments and required details of the disclosure are described with reference to the accompanying drawings in order to describe the disclosure in detail so that those having ordinary knowledge in the technical field to which the disclosure pertains can easily practice the disclosure. Furthermore, a singular form may include a plural from as long as it is not specifically mentioned in a sentence.

In the specification and the claims, the phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly defined in the specification.

FIG. 1 illustrates a light emitting element LD in accordance with an embodiment of the disclosure. FIG. 1 illustrates a rod-type light emitting diode having a cylindrical shape, as an example of the light emitting element LD. However, the type and/or shape of the light emitting element LD are not limited thereto.

Referring to FIG. 1, the light emitting element LD in accordance with the embodiment may include a first conductivity type semiconductor layer 11, a second conductivity type semiconductor layer 13, and an active layer 12 interposed between the first and second conductivity type semiconductor layers 11 and 13. For example, the light emitting element LD may include a stacked body including the first conductivity type semiconductor layer 11, the active layer 12, and the second conductivity type semiconductor layer 13 sequentially stacked therein.

In an embodiment, the light emitting element LD may be provided in the form of a rod extending in a direction. If the direction in which the light emitting element LD extends is defined as a longitudinal direction, the light emitting element LD may include a first end and a second end in the longitudinal direction.

In an embodiment, one of the first and second conductivity type semiconductor layers 11 and 13 may be disposed on the first end of the light emitting element LD, and the other may be disposed on the second end of the light emitting element LD.

In an embodiment, the light emitting element LD may be manufactured in the form of a rod. Here, meanings of the term "rod-like shape" may include a rod- or bar-like shape such as a cylindrical shape and a prismatic shape extending in a longitudinal direction (i.e., having an aspect ratio greater than 1), and the cross-sectional shape thereof is not limited to a particular shape. For example, a length of the light emitting element LD may be greater than a diameter thereof (or a width of the cross-section thereof).

In an embodiment, the light emitting element LD may have a small diameter and/or length to a degree of, for example, a micro or nano scale. However, the size of the light emitting element LD is not limited thereto. For instance, the size of the light emitting element LD may be changed in various ways depending on design conditions of a light emitting display device to which the light emitting element LD is applied.

The first conductivity type semiconductor layer 11 may include, for example, at least one n-type semiconductor layer. For instance, the first conductivity type semiconductor layer 11 may include an n-type semiconductor layer which includes any one semiconductor material of InAlGaN, GaN, AlGaN, InGaN, AlN, and InN and may be doped with a first conductive dopant such as Si, Ge, or Sn. However, the material forming the first conductivity type semiconductor layer 11 is not limited thereto, and the first conductivity type semiconductor layer 11 may be formed of various other materials.

The active layer 12 may be disposed on the first conductivity type semiconductor layer 11 and have a single or multiple quantum well structure. In an embodiment, a cladding layer (not shown) doped with a conductive dopant may be formed above and/or under (or on and/or below) the active layer 12. For example, the cladding layer may be formed of an AlGaN layer or an InAlGaN layer. In an embodiment, a material such as AlGaN or AlInGaN may be used to form the active layer 12, and various other materials may be used to form the active layer 12.

If an electric field having a predetermined voltage or greater is applied to ends (or the opposite ends) of the light emitting element LD, the light emitting element LD emits light by the combination of electron-hole pairs in the active layer 12. Since light emission of the light emitting element LD is controlled based on the foregoing principle, the light emitting element LD may be used as a light source of a pixel.

The second conductivity type semiconductor layer 13 may be disposed on the active layer 12 and include a semiconductor layer of a type different from that of the first conductivity type semiconductor layer 11. For example, the second conductivity type semiconductor layer 13 may include at least one p-type semiconductor layer. For instance, the second conductivity type semiconductor layer 13 may include a p-type semiconductor layer which includes at least one semiconductor material of InAlGaN, GaN, AlGaN, InGaN, AlN, and InN and is doped with a second conductive dopant such as Mg. However, the material forming the second conductivity type semiconductor layer 13 is not limited thereto, and the second conductivity type semiconductor layer 13 may be formed of various other materials.

In an embodiment, the light emitting element LD may further include additional components in addition to the above-described first conductivity type semiconductor layer 11, active layer 12, and second conductivity type semiconductor layer 13. For example, the light emitting element LD may further include at least one fluorescent layer, active layer, semiconductor layer and/or electrode layer disposed above and/or under the first conductivity type semiconductor layer 11, the active layer 12, and/or the second conductivity type semiconductor layer 13.

Furthermore, in an embodiment, the light emitting element LD may further include an insulating film 14. In an embodiment, the insulating film 14 may enclose an outer circumferential surface of at least the active layer 12. The insulating film 14 may further enclose at least portions of the first and second conductivity type semiconductor layers 11 and 13.

Although FIG. 1 illustrates the insulating film 14 with a portion thereof being eliminated so as to show the stacked structure of the light emitting element LD, the insulating film 14 may entirely enclose an outer circumferential surface (e.g., cylindrical side surface) of the light emitting element LD except for the ends of the light emitting element LD. As another example, in another embodiment, the insulating film 14 may cover or overlap only a portion of a side surface of each of the first conductivity type semiconductor layer 11, the active layer 12, and/or the second conductivity type semiconductor layer 13. As another example, in a further embodiment, the insulating film 14 may be omitted.

In an embodiment, the insulating film 14 may include a transparent insulating material. For example, the insulating film 14 may include at least one insulating material selected from the group consisting of $SiO_2$, $Si_3N_4$, $Al_2O_3$, and $TiO_2$, but it is not limited thereto. The insulating film 14 may be formed of various insulating materials.

If the insulating film 14 is provided on the light emitting element LD, the insulating film 14 may prevent the active layer 12 of the light emitting element LD from short-circuiting with a first and/or second electrode (not shown), etc. Thus, the electrical stability of the light emitting element LD may be secured.

Furthermore, thanks to the insulating film 14 formed on the surface of the light emitting element LD, occurrence of a defect on the surface of the light emitting element LD may be reduced, whereby the lifetime and efficiency of the light emitting element LD may be improved. If the insulating film 14 is formed on each light emitting element LD, in case that the light emitting elements LD are disposed adjacent to each other, the insulating film 14 may prevent the light emitting elements LD from undesirably short-circuiting with each other.

In an embodiment, the light emitting element LD may be manufactured through a surface treatment process. For example, the light emitting element LD may be surface-treated (e.g., by a coating process) so that, in case that the light emitting elements LD are mixed with a fluidic solution and then supplied to each emission area (e.g., emission area of each pixel), the light emitting elements LD can be evenly distributed rather than unevenly aggregating in solution.

The light emitting element LD may be used as a light source for various types of display devices including a light emitting display panel. For example, at least one light emitting element LD may be disposed in each pixel area of the light emitting display panel, thereby forming an emission unit of each pixel. Furthermore, the field of application of the light emitting element LD according to the disclosure is not limited to the display device. For example, the light emitting element LD may also be used for different types of light emitting devices such as a lighting device, which requires a light source.

Figure 2:
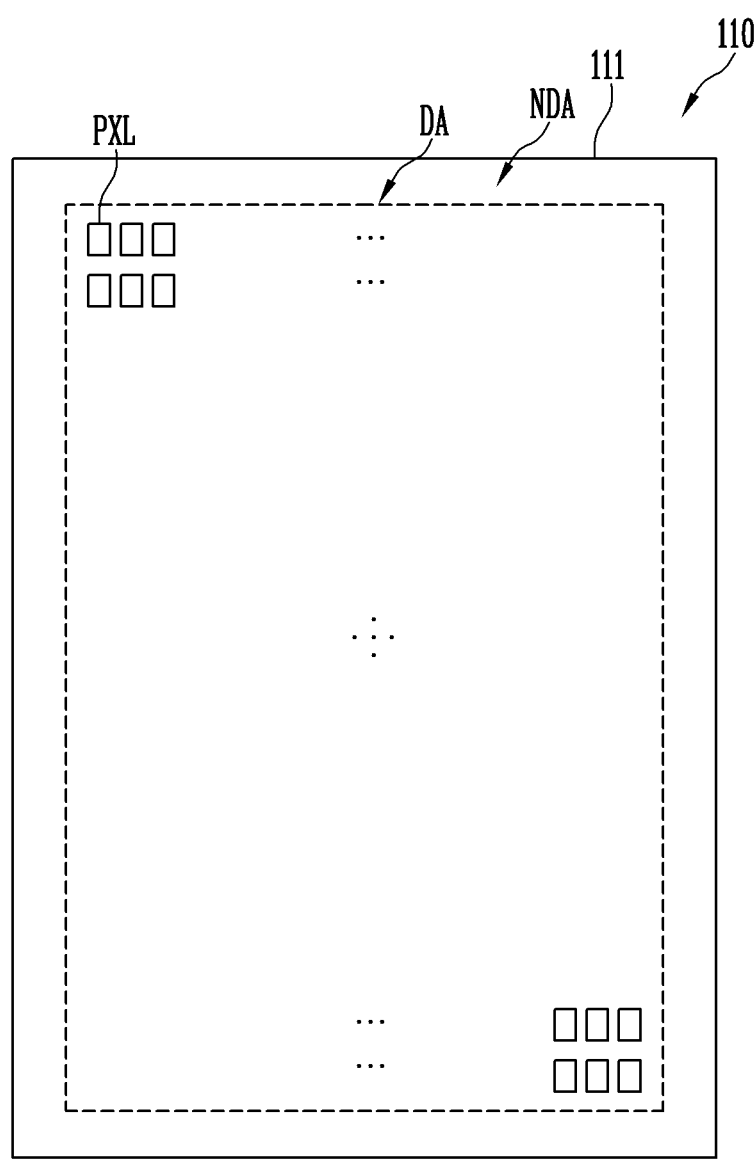
FIG. 2 schematically illustrates a light emitting display panel in accordance with an embodiment of the disclosure.
Figure 3A:
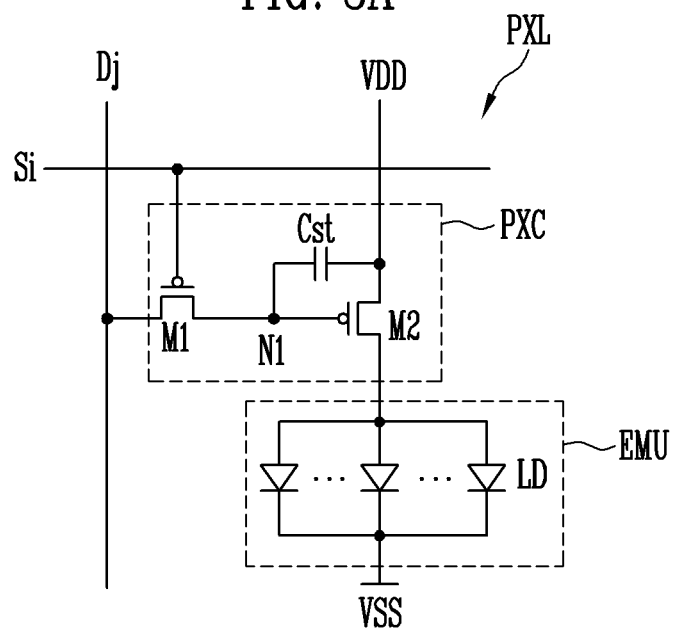
FIGS. 3A and 3B schematically illustrate an embodiment of a pixel that may be provided in the light emitting display panel of FIG. 2.
Figure 3B:
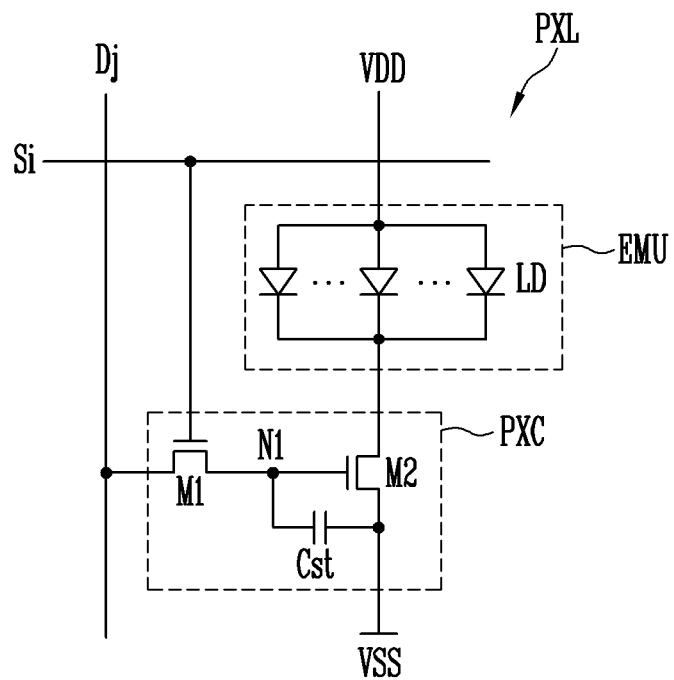

FIG. 2 illustrates a light emitting display panel 110 in accordance with an embodiment. FIGS. 3A and 3B illustrate an embodiment of a pixel PXL that may be provided in the light emitting display panel 110 of FIG. 2. FIGS. 2 to 3B schematically illustrate the structure of the light emitting display panel 110 in accordance with the embodiment, focusing on a display area DA. However, in an embodiment, at least one driving circuit, for example, a scan driver and/or a data driver may be further disposed in the light emitting display panel 110.

Referring to FIG. 2, the light emitting display panel 110 may include a substrate 111, and pixels PXL disposed on the substrate 111. In detail, the light emitting display panel 110 may include the display area DA for displaying an image, and a non-display area NDA adjacent to the display area DA. Furthermore, the pixels PXL may be disposed in the display area DA on the substrate 111.

In an embodiment, the display area DA may be disposed in a central portion of the light emitting display panel 110, and the non-display area NDA may be disposed in a perimeter portion of the light emitting display panel 110 to enclose the display area DA. The locations of the display area DA and the non-display area NDA are not limited thereto, and the locations thereof may be changed.

The substrate 111 may be a rigid or flexible substrate, and the material or properties thereof are not particularly limited. For example, the substrate 111 may be a rigid substrate made of glass or reinforced glass, or a flexible substrate formed of a thin film made of plastic or metal.

An area of the substrate 111 may be defined as the display area DA in which the pixels PXL are disposed, and the other area thereof may be defined as the non-display area NDA. Various lines and/or internal circuit units may be disposed in the non-display area NDA to be electrically connected to the pixels PXL of the display area DA.

Each of the pixels PXL may include at least one light emitting element LD (e.g., at least one light emitting element LD shown in FIG. 1) which is driven by a corresponding scan signal and a corresponding data signal. For example, each pixel PXL may include rod-type light emitting diodes, each of which has a small size to a degree of a micro or nano scale. For instance, each pixel PXL may include rod-type light emitting diodes that each have a size to a degree of a micro or nano scale and are electrically connected to each other in series and/or in parallel, and the rod-type light emitting diodes may form the light source of each pixel PXL.

In an embodiment, each pixel PXL may be formed of an active pixel illustrated in FIG. 3A or 3B. However, the type and/or structure of the pixels PXL is not particularly limited. For example, each pixel PXL may have a structure of a pixel of passive or active light emitting display devices known in the art.

Referring to FIG. 3A, each pixel PXL may include an emission unit EMU configured to generate light having a luminance corresponding to a data signal, and a pixel circuit PXC configured to drive the emission unit EMU.

In an embodiment, the emission unit EMU may include light emitting elements LD electrically connected to each other in series and/or in parallel between first and second pixel power supplies VDD and VSS. The emission unit EMU may be a light-source unit including the light emitting elements LD.

In an embodiment, the first and second pixel power supplies VDD and VSS may have different potentials such that the light emitting elements LD may emit light. For example, the first pixel power supply VDD may be set as a high-potential pixel power supply, and the second pixel power supply VSS may be set as a low-potential pixel power supply. In this case, a potential difference between the first and second pixel power supplies VDD and VSS may be equal to or greater than the threshold voltage of the light emitting elements LD.

Although FIG. 3A illustrates an embodiment in which the light emitting elements LD forming the emission unit EMU of each pixel PXL are electrically connected in parallel to each other in the same direction (e.g., in a forward direction) between the first pixel power supply VDD and the second pixel power supply VSS, the disclosure is not limited thereto. For example, in another embodiment, some of the light emitting elements LD may be electrically connected to each other in the forward direction between the first and second pixel power supplies VDD and VSS, and other light emitting elements LD may be electrically connected to each other in the reverse direction. As another example, in a further embodiment, at least one pixel PXL may include only a single light emitting element LD.

In an embodiment, first ends of the light emitting elements LD forming each emission unit EMU may be electrically connected in common to a corresponding pixel circuit PXC through a first electrode of the corresponding emission unit EMU and may be electrically connected to the first pixel power supply VDD through the pixel circuit PXC. Furthermore, second ends of the light emitting elements LD may be electrically connected in common to the second pixel power supply VSS through a second electrode of the corresponding emission unit EMU. Hereinafter, the first electrode and the second electrode disposed in each emission unit EMU will be respectively referred to as a "first pixel electrode" and a "second pixel electrode."

Each emission unit EMU may emit light having luminance corresponding to driving current supplied thereto through the corresponding pixel circuit PXC. Thus, a predetermined image may be displayed in the display area DA.

The pixel circuit PXC may be electrically connected to a scan line Si and a data line Dj of the corresponding pixel PXL. For example, if the pixel PXL is disposed on an i-th row and a j-th column of the display area DA, the pixel circuit PXC of the pixel PXL may be electrically connected to an i-th scan line Si and a j-th data line Dj of the display area DA. In an embodiment, the pixel circuit PXC may include a first transistor M1, a second transistor M2, and a storage capacitor Cst.

A first electrode of the first transistor M1 (switching transistor) may be electrically connected to the data line Dj, and a second electrode thereof may be electrically connected to a first node N1. Here, the first electrode and the second electrode may be different electrodes. For example, if the first electrode is a source electrode, the second electrode may be a drain electrode. A gate electrode of the first transistor M1 may be electrically connected to the scan line Si.

In case that a scan signal of a gate-on voltage (e.g., a low voltage) is supplied from the scan line Si, the first transistor M1 may be turned on to electrically connect the first node N1 to the data line Dj. Here, a data signal of a corresponding frame may be supplied to the data line Dj. The data signal may be transmitted to the first node N1 via the first transistor M1. Thus, the storage capacitor Cst may be charged with a voltage corresponding to the data signal.

A first electrode of the second transistor M2 (driving transistor) may be electrically connected to the first pixel power supply VDD, and a second electrode thereof may be electrically connected to the emission unit EMU through the first pixel electrode (e.g., the first electrode of the corresponding emission unit EMU). Furthermore, agate electrode of the second transistor M2 may be electrically connected to the first node N1. The second transistor M2 may control the driving current to be supplied to each emission unit EMU in response to a voltage of the first node N1.

A first electrode of the storage capacitor Cst may be electrically connected to the first pixel power supply VDD, and a second electrode thereof may be electrically connected to the first node N1. The storage capacitor Cst may be charged with a voltage corresponding to a data signal supplied to the first node N1 during a corresponding frame period and may maintain the charged voltage until a data signal of a subsequent frame is supplied.

The structure of the pixel circuit PXC is not limited to the embodiment illustrated in FIG. 3A. For instance, the pixel circuit PXC may be or include a pixel circuit having any of various structure(s) and/or using driving methods known in the art. For instance, the pixel circuit PXC may further include at least one switching element such as a switching element configured to compensate for the threshold voltage of the second transistor M2, a switching element configured to initialize the gate voltage of the second transistor M2, and/or a switching element configured to control the emission time of the emission unit EMU. In an embodiment, each switching element may include a transistor but is not limited thereto. The pixel circuit PXC may further include at least one capacitor including a boosting capacitor configured to boost the gate voltage of the second transistor M2.

Although FIG. 3A illustrates the transistors, e.g., the first and second transistors M1 and M2, included in the pixel circuit PXC as including P-type transistors, the disclosure is not limited thereto. At least one of the first and second transistors M1 and M2 may be an N-type transistor.

For example, as shown in FIG. 3B, the first and second transistors M1 and M2 may be N-type transistors. The configuration and operation of the pixel PXL illustrated in FIG. 3B are substantially similar to those of the pixel PXL of FIG. 3A, except that connection positions of some circuit elements are changed depending on a change in type of the transistors. Therefore, the detailed description of the pixel PXL of FIG. 3B will be omitted.

Figure 4:
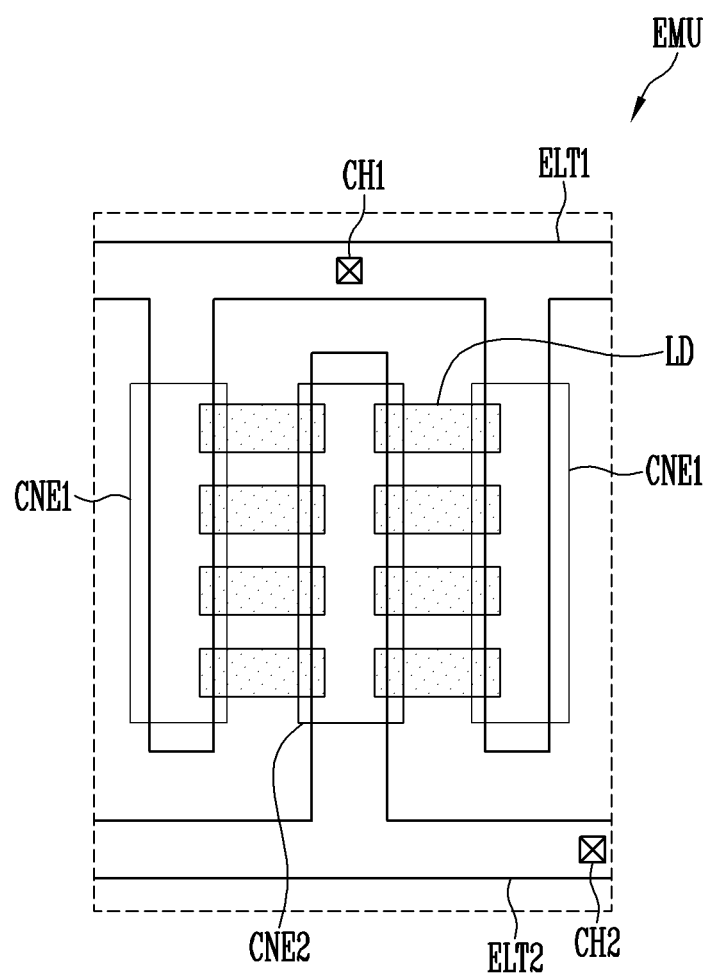
FIG. 4 schematically illustrates an emission unit of a pixel in accordance with an embodiment of the disclosure.

FIG. 4 illustrates an emission unit EMU of a pixel PXL in accordance with an embodiment. For convenience, FIG. 4 illustrates the emission unit EMU having a relatively simple structure in which each electrode includes a single layer. However, the disclosure is not limited thereto. For example, at least one of the electrodes illustrated in FIG. 4 may have a multi-layered structure. At least one conductive layer and/or insulating layer (not shown) may be further disposed in the emission unit EMU.

The emission unit EMU of FIG. 4 may form the light source of the pixel PXL illustrated in FIGS. 2, 3A, and 3B as well as light sources of various light emitting devices. For convenience, the emission unit EMU in accordance with an embodiment will be described below with reference to FIGS. 3A, 3B, and 4.

Referring to FIGS. 3A to 4, each emission unit EMU may include first and second pixel electrodes ELT1 and ELT2, and light emitting elements LD electrically connected between the first and second pixel electrodes ELT1 and ELT2. However, the disclosure is not limited to the embodiment illustrated in FIGS. 3A to 4. For example, the emission unit EMU of at least one pixel PXL may be provided with only a single light emitting element LD. In an embodiment, each emission unit EMU may be disposed in a pixel area for forming each pixel PXL and may be enclosed by a dam or bank structure (not shown).

In an embodiment, the first pixel electrode ELT1 may be electrically connected to a pixel circuit of a corresponding pixel, e.g. the pixel circuit PXC illustrated, e.g., in FIG. 3A while the second pixel electrode ELT2 may be electrically connected to a second pixel power supply VSS. For instance, the first pixel electrode ELT1 may be electrically connected through a first contact hole CH1 to the second transistor M2 of FIG. 3A, and the second pixel electrode ELT2 may be electrically connected through a second contact hole CH2 to the second pixel power supply VSS.

However, the disclosure is not limited thereto. For example, in another embodiment, the first pixel electrode ELT1 may be electrically connected through the first contact hole CH1 to a first pixel power supply VDD, and the second pixel electrode ELT2 may be electrically connected through the second contact hole CH2 to the second transistor M2 of FIG. 3B. As another example, in a further embodiment, the first and/or the second pixel electrode ELT1 and ELT2 may be directly connected or electrically connected to the first and/or second pixel power supply VDD and VSS without passing through the first contact hole CH1, the second contact hole CH2, and/or the pixel circuit PXC.

At least one area of the first pixel electrode ELT1 may be disposed opposite to at least one area of the second pixel electrode ELT2, and light emitting elements LD may be electrically connected between the first and second pixel electrodes ELT1 and ELT2. In an embodiment, a direction in which the light emitting elements LD are arranged is not particularly limited. Furthermore, the light emitting elements LD may be electrically connected in series and/or in parallel between the first and second pixel electrodes ELT1 and ELT2.

In an embodiment, each of the light emitting elements LD may be a rod-type light emitting diode which is made of material having an inorganic crystal structure and has a subminiature size to a degree of, e.g., a micro or nano scale. For example, each light emitting element LD may be the light emitting element LD of FIG. 1. In an embodiment, the light emitting elements LD may be dispersed in a predetermined solution (hereinafter referred to as "LED solution") and may be supplied to each emission unit EMU by using an inkjet method or the like. For example, the light emitting elements LD may be mixed with a volatile solvent and supplied to each emission unit EMU. Here, if a predetermined voltage (referred to as "alignment voltage" or "alignment signal") is applied to the first and second pixel electrodes ELT1 and ELT2, an electric field may be formed between the first and second pixel electrodes ELT1 and ELT2, whereby the light emitting elements LD may be self-aligned between the first and second pixel electrodes ELT1 and ELT2. After the light emitting elements LD are aligned, the solvent may be removed by a volatilization method or other methods. In this way, the light emitting elements LD may be stably arranged between the first and second pixel electrodes ELT1 and ELT2. In other words, the light emitting elements LD may be connected physically and/or electrically between the first and second pixel electrodes ELT1 and ELT2.

In an embodiment, at least one contact electrode may be electrically connected to both ends of the light emitting elements LD, respectively. For example, each emission unit EU may include a first contact electrode CNE1 configured to stably connect the first end of each light emitting element LD to the first pixel electrode ELT1, and a second contact electrode CNE2 configured to stably connect the second end of each light emitting element LD to the second pixel electrode ELT2.

Each of the first and second contact electrodes CNE1 and CNE2 may contact and/or may be electrically connected to any one of the first and second pixel electrodes ELT1 and ELT2 and the first end of at least one of the light emitting elements LD. For example, the first and second contact electrodes CNE1 and CNE2 may cover or overlap both ends of the light emitting elements LD and at least one area of the first and second pixel electrodes ELT1 and ELT2.

The light emitting elements LD disposed in the emission unit EMU may form the light source of the corresponding pixel PXL. For example, if driving current flows through the emission unit EMU of at least one pixel PXL during each frame period, the light emitting elements LD electrically connected in the forward direction between the first and second pixel electrodes ELT1 and ELT2 of the pixel PXL may emit light having a luminance corresponding to the driving current.

Figure 5:
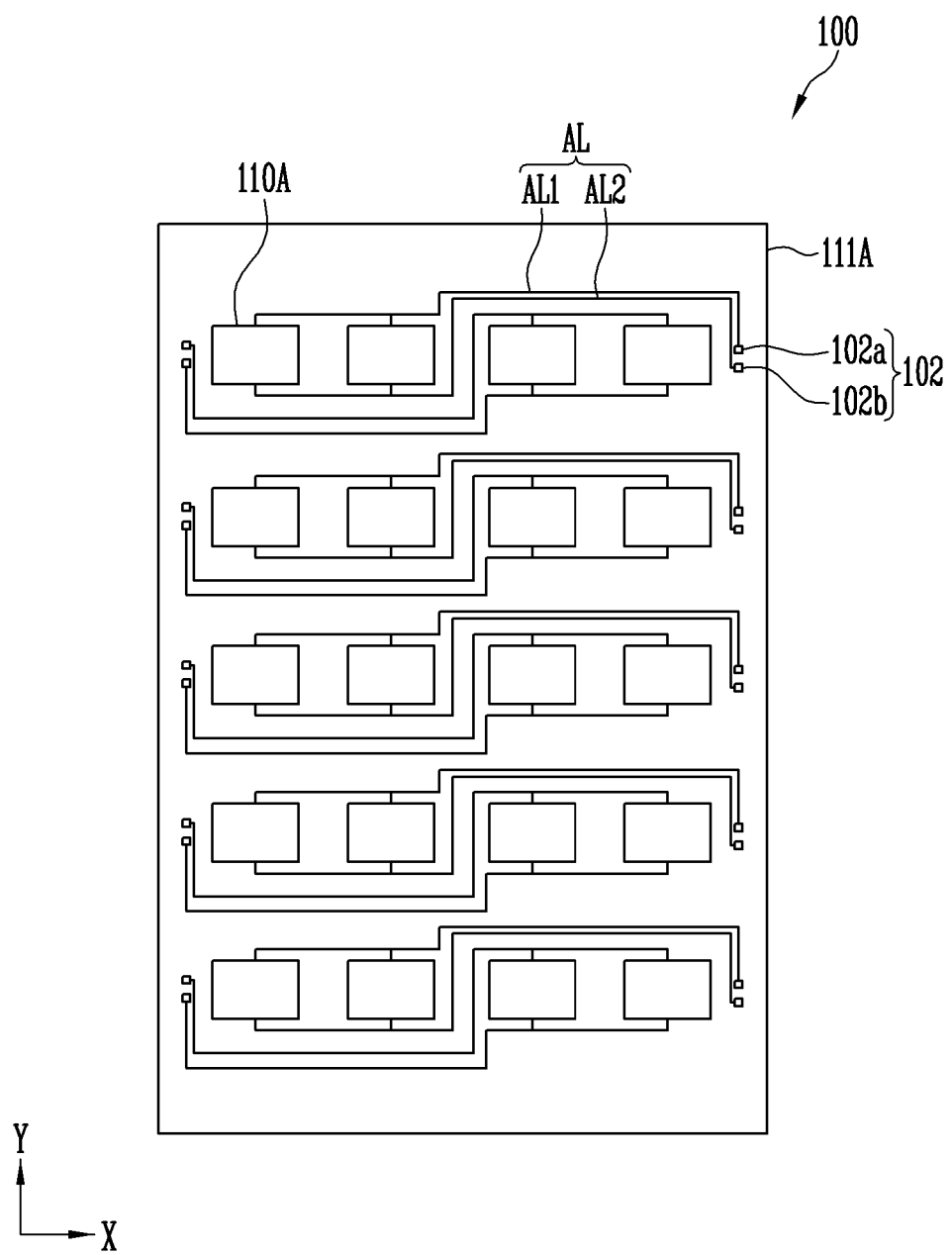
FIG. 5 schematically illustrates a base substrate for manufacturing a light emitting display panel in accordance with an embodiment of the disclosure.

FIG. 5 illustrates a base substrate 100 for manufacturing a light emitting display panel 110 in accordance with an embodiment. The base substrate 100 may be used to simultaneously manufacture light emitting display panels 110 on a mother substrate 111A. For example, after the light emitting display panels 110 are simultaneously made on the large-sized mother substrate 111A in the form of the base substrate 100, the light emitting display panels 110 may be divided into individual light emitting display panels 110 through a scribing process or the like.

Referring to FIGS. 2 to 5, the base substrate 100 may include cells 110A arranged in the first direction and/or the second direction (e.g. X- and/or Y-axis direction) on the mother substrate 111A. Each cell 110A may be used to manufacture an individual light emitting display panel 110. For example, each cell 110A may include pixels PXL disposed in a predetermined display area DA. Furthermore, each pixel PXL may include the emission unit EMU including the light emitting elements LD. For convenience, the internal configuration of the individual cell 110A is omitted in FIG. 5.

Conductive pads 102 may be disposed in an area of the base substrate 100, for example, a perimeter of at least one side of the base substrate 100. In an embodiment, the conductive pads 102 may include at least one pair of pads composed of first and second pads 102a and 102b that are supplied with different voltages. For instance, multiple pairs of first and second pads 102a and 102b may be disposed on perimeters of sides of the base substrate 100 that face each other. In an embodiment, each pair of first and second pads 102a and 102b may be electrically connected to at least one cell 110A.

The base substrate 100 may include alignment lines AL to electrically connect the cells 110A to the conductive pads 102. In an embodiment, the alignment lines AL may include at least one pair of first and second alignment lines AL1 and AL2 connecting at least one of the cells 110A formed on the base substrate 100 to any pair of first and second pads 102a and 102b. For instance, multiple pairs of first and second alignment lines AL1 and AL2 corresponding to the multiple pairs of first and second pads 102a and 102b may be disposed on the base substrate 100.

Each first alignment line AL1 may be electrically connected to an electrode formed in at least one cell 110A, and each second alignment line AL2 may be electrically connected to another electrode formed in the at least one cell 110A. For instance, each first alignment line AL1 may be electrically connected in common to first pixel electrodes ELT1 of pixels PXL formed in at least one cell 110A, and each second alignment line AL2 may be electrically connected in common to second pixel electrodes ELT2 of the pixels PXL formed in the at least one cell 110A. Thus, a voltage applied to the first pads 102a may be transmitted through the first alignment lines AL1 to the first pixel electrodes ELT1 in each cell 110A, and a voltage applied to the second pads 102b may be transmitted through the second alignment lines AL2 to the second pixel electrodes ELT2 in each cell 110A.

In an embodiment, among the cells 110A formed on the base substrate 100, at least one cell 110A disposed on any side of the base substrate 100, e.g. a left side, may be electrically connected to a pair of the first and second pads 102a and 102b disposed on another side of the base substrate 100, e.g. a right side. Furthermore, among the cells 110A, at least one cell 110A disposed on the another side of the base substrate 100, e.g. the right side, may be electrically connected to a pair of the first and second pads 102a and 102b disposed on an opposite side of the base substrate 100, e.g. the left side.

The light emitting elements LD may be supplied to at least one cell 110A disposed on any one side of the base substrate 100, and simultaneously a voltage may be applied to at least one cell 110A through the pair of the first and second pads 102a and 102b disposed on the other side of the base substrate 100. Thus, the light emitting elements LD may be supplied to at least one cell 110A, and simultaneously a predetermined alignment signal may be supplied to align the light emitting elements LD, thereby applying an electric field to the light emitting elements LD.

Figure 6:
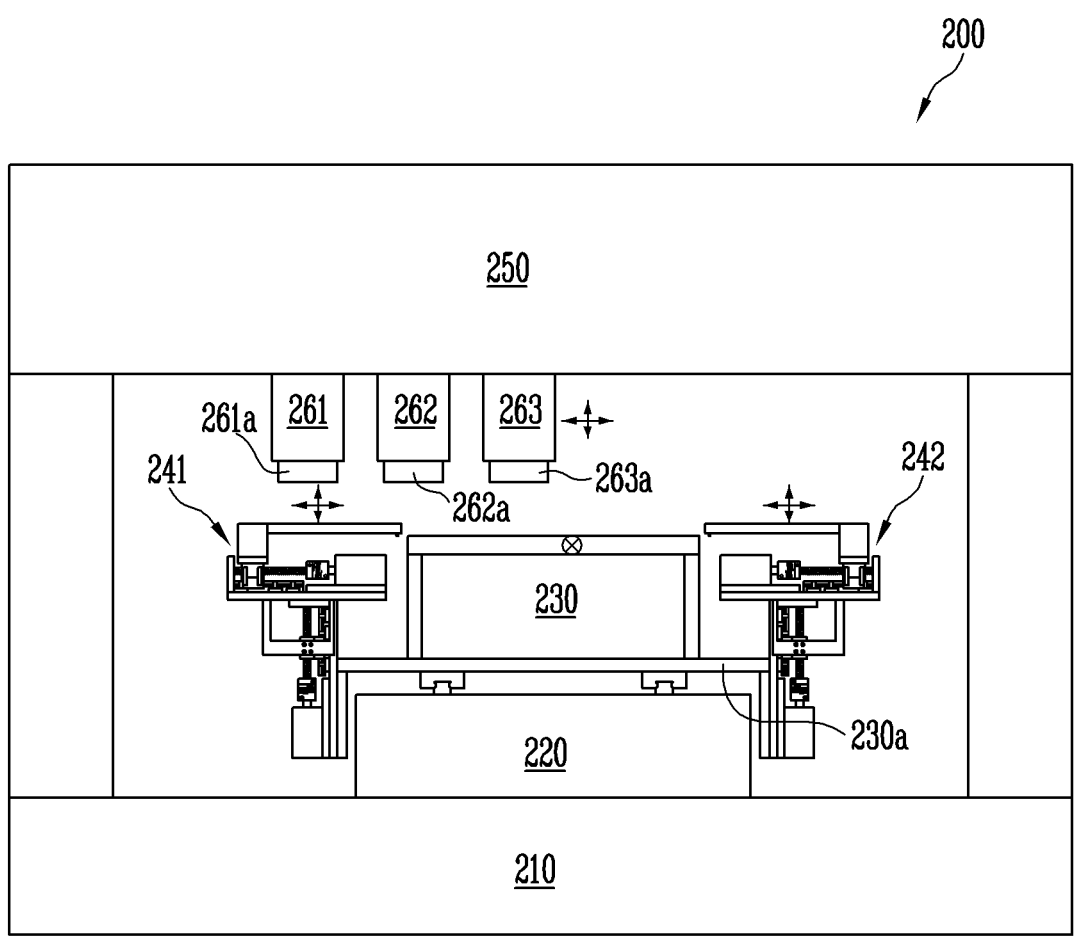
FIG. 6 schematically illustrates an apparatus for manufacturing a light emitting display device in accordance with an embodiment of the disclosure.

FIG. 6 illustrates an apparatus 200 for manufacturing a light emitting display device in accordance with an embodiment. In detail, FIG. 6 illustrates an embodiment of the apparatus 200 (hereinafter referred to as a "first manufacturing apparatus 200") that may supply the light emitting elements LD to the mother substrate 111A for manufacturing the panel of the light emitting display device, for example, the light emitting display panel 110, and may simultaneously apply the electric field to the light emitting elements LD. For instance, the first manufacturing apparatus 200 may be configured to supply the light emitting elements LD to an interior (particularly, the emission area of each of the pixels PXL) of each cell 110A disposed on the mother substrate 111A shown in FIG. 5 and simultaneously to apply the electric field (or alignment signal for forming the electric field) for inducing the self-alignment of the light emitting elements LD. Furthermore, in an embodiment, the first manufacturing apparatus 200 may be an inkjet printer that supplies (e.g. drops) the light emitting elements LD to the mother substrate 111A by an inkjet method.

In FIG. 6, reference numeral "240" may collectively correspond to at least one electric-field application module, for example, each electric-field application module or electric-field application modules. Furthermore, reference numeral "260" may collectively correspond to at least one printing head, for example, each printing head or printing heads.

Referring to FIG. 6, the first manufacturing apparatus 200 according to an embodiment may include a main plate 210 and an auxiliary plate 220 disposed sequentially from the bottom thereof, a stage 230 (referred to as a "first stage") disposed on the auxiliary plate 220, at least one electric-field application module 240 disposed on at least one side of the stage 230, a gantry 250 disposed on the stage 230, and at least one printing head 260 supported by the gantry 250 and disposed on the stage 230.

In an embodiment, the electric-field application module 240 and/or the printing head 260 may be configured to move horizontally and vertically. For instance, the electric-field application module 240 and/or the printing head 260 may be configured to move horizontally in the X-axis direction and vertically (e.g. up-and-down movement) in the Z-axis direction. Furthermore, in an embodiment, the stage 230 may be configured to be movable in at least one direction. For instance, the stage 230 may be designed to move horizontally in the Y-axis direction.

According to the above-described embodiment, the operation of the stage 230, the electric-field application module 240 and/or the printing head 260 may be more easily controlled. Thus, the process of disposing the base substrate 100 on the stage 230 to supply the light emitting elements LD may be performed. Simultaneously, the electric field may be smoothly applied to the cell 110A to which the light emitting elements LD are supplied.

In an embodiment, the electric-field application module 240 may be adjacent to each of at least two perimeter areas of the stage 230. For example, the electric-field application module 240 may include a first electric-field application module 241 disposed on a first side of the stage 230, and a second electric-field application module 242 disposed on a second side of the stage 230.

In an embodiment, the first and second sides of the stage 230 may be opposite ends that face each other. For instance, the first side and the second side may be the left side and the right side of the stage 230, respectively. In other words, the first and second electric-field application modules 241 and 242 may be adjacent to sides of the stage 230 facing each other, respectively.

Furthermore, in an embodiment, the first and second electric-field application modules 241 and 242 may be connected to and/or provided at a structure provided on a lower end of the stage 230. For instance, the first and second electric-field application modules 241 and 242 may be connected to a lower plate 230a of the stage 230. However, in the disclosure, the position and/or installation structure of the first and second electric-field application modules 241 and 242 are not limited particularly and may be changed in various ways.

In an embodiment, the first and second electric-field application modules 241 and 242 may be driven independently of each other or in conjunction with each other. For instance, the first and second electric-field application modules 241 and 242 may be driven simultaneously, sequentially, or alternately.

Thus, if the first manufacturing apparatus 200 is provide with the first and second electric-field application modules 241 and 242 disposed on different sides of the stage 230, the electric field may be smoothly applied to the base substrate 100 seated on the stage 230 while avoiding a collision between the electric-field application module 240 and the printing head 260. For instance, by optionally driving at least one of the first and second electric-field application modules 241 and 242 depending on the position of the printing head 260, a desired electric field may be applied to each cell 110A on the base substrate 100 while preventing a mutual interference and/or collision between the electric-field application module 240 and the printing head 260.

In an embodiment, the printing head 260 may include printing heads, e.g. first, second, and third printing heads 261, 262, and 263 to spray, onto the stage 230, different types of solutions, e.g. solutions in which the light emitting elements LD of predetermined colors are dispersed. For example, the first, second, and third printing heads 261, 262, and 263 may drop solution in which red, green, and blue light emitting elements LD are dispersed to a top (e.g. an interior of each cell 110A of the base substrate 100 seated on the stage 230) of the stage 230 in the form of a droplet. To this end, the first, second, and third printing heads 261, 262, and 263 may be provided with injection nozzles 261a, 262a, and 263a, respectively, and may supply red, green and blue light emitting elements LD to each cell 110A by the inkjet method. For instance, the first, second, and third printing heads 261, 262, and 263 may be inkjet heads (or injection heads).

As described above, the first manufacturing apparatus 200 according to this embodiment may be provided with the electric-field application module 240 and the printing head 260. Thus, the light emitting elements LD may be supplied to the substrate of the light emitting display device placed on the stage 230, e.g. the base substrate 100, and simultaneously a predetermined electric field may be applied to the light emitting elements LD to induce the self-alignment of the light emitting elements LD. Thus, the light emitting display panel 110 using the light emitting elements LD as the light source may be easily manufactured.

The remaining components constituting the first manufacturing apparatus 200, for example, the main plate 210, the auxiliary plate 220, and the gantry 250 may have various shapes and/or structures known in the art. Therefore, detailed descriptions pertaining thereto will be omitted.

Figure 7:
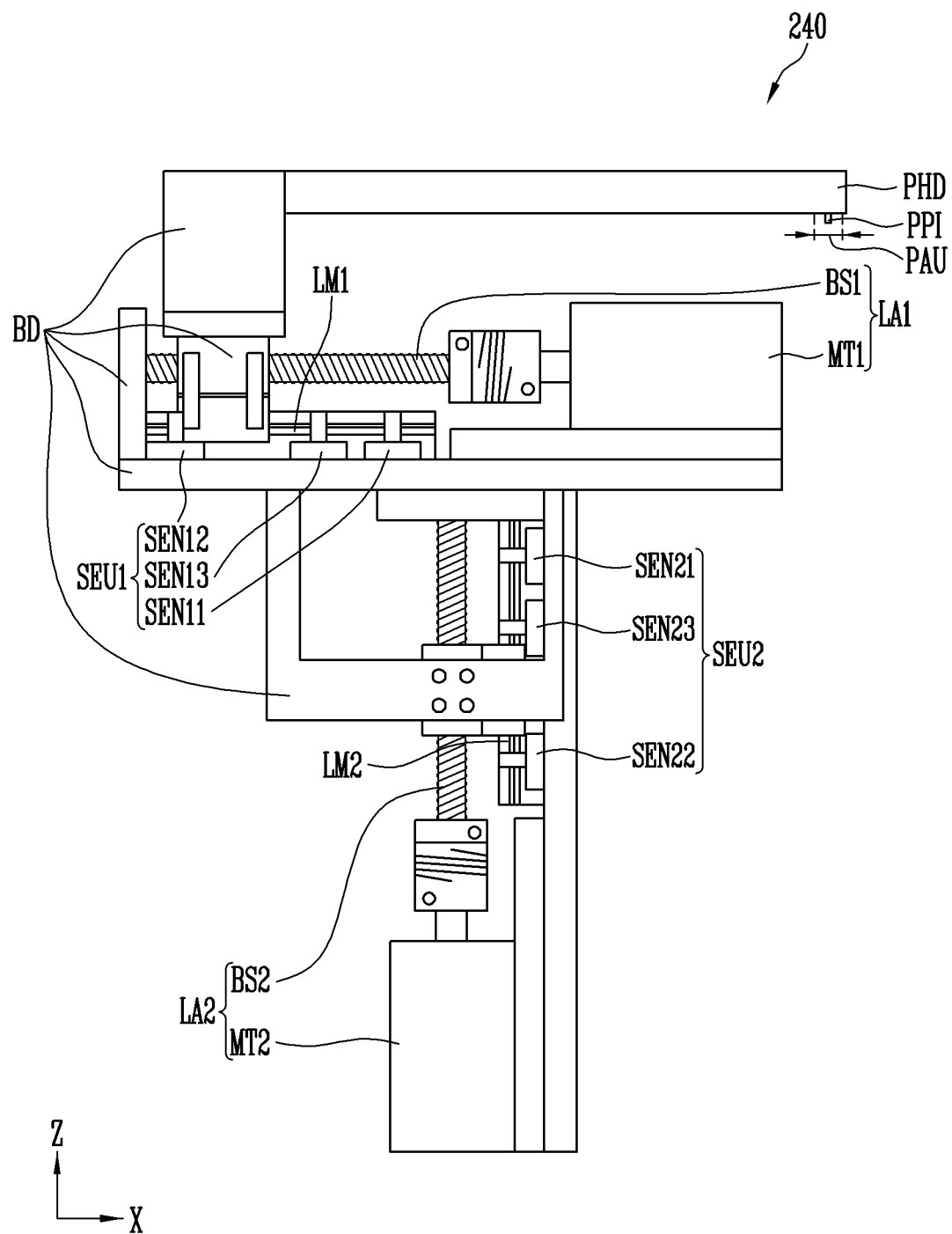
FIG. 7 schematically illustrates an embodiment of a configuration of an electric-field application module of FIG. 6.

FIG. 7 illustrates an embodiment of a configuration of the electric-field application module 240 of FIG. 6. In an embodiment, the electric-field application module 240 illustrated in FIG. 7 may correspond to the first and second electric-field application modules 241 and 242 of FIG. 6. For example, the first and second electric-field application modules 241 and 242 may have the substantially same configuration and may face each other.

Referring to FIG. 7, each electric-field application module 240 may include a probe head PHD, first and second drivers LA1 and LA2 connected (or electrically connected) to the probe head PHD to move the probe head PHD in a predetermined direction, and a body BD connected (or electrically connected) to the probe head PHD and the first and second drivers LA1 and LA2.

Furthermore, in an embodiment, each electric-field application module 240 may further include at least one linear motion guide LM1, LM2 connected (or electrically connected) to the body BD to assist in the stable movement of the electric-field application module 240, and at least one sensor unit SEU1, SEU2 for sensing the moving position of the probe head PHD in real time. For instance, each electric-field application module 240 may further include a first linear motion guide LM1 and the first sensor unit SEU1 disposed around the first driver LA1, and a second linear motion guide LM2 and the second sensor unit SEU2 disposed around the second driver LA2.

The probe head PHD may be provided with at least one probe pin PPI (or also referred to as an "electrode pad") disposed on a surface thereof. For instance, the probe head PHD may include probe pins PPI that are arranged in a pad component PAU located in a perimeter of a lower surface of the probe head PHD. In an embodiment, each probe pin PPI may be electrically connected to a power supply component (not illustrated) to be supplied with a predetermined power or voltage from the power supply component.

In an embodiment, the probe head PHD may be implemented as a probe bar having a bar shape but is not limited thereto. For example, the shape, structure, and/or material of the probe head PHD may be changed in various ways.

The first driver LA1 may be connected (or electrically connected) to the probe head PHD through the body BD to move the probe head PHD in the horizontal direction. For instance, the first driver LA1 may be a linear actuator that moves the probe head PHD forwards and backwards or leftwards and rightwards in the X-axis direction.

In an embodiment, the first driver LA1 may include a first motor MT1, and a first ball screw BS1 connected to the first motor MT1 in the horizontal direction. Thus, the first driver LA1 may adjust the horizontal position of the probe head PHD so that the probe head PHD may reach a desired position.

In an embodiment, the first motor MT1 may be a servomotor but is not limited thereto. For example, the first motor MT1 may be formed as power sources of various types as well as the servomotor. Furthermore, in an embodiment, the first motor MT1 may include a motor guide or the like.

In an embodiment, the first ball screw BS1 may be a rolled ball screw but is not limited thereto. For example, the first ball screw BS1 may be formed as various mechanical devices (e.g. various components converting rotary motion into linear motion) that linearly move the probe head PHD by using power generated by the first motor MT1, in addition to the rolled ball screw.

The second driver LA2 may be connected (or electrically connected) to the probe head PHD through the body BD to move the probe head PHD in the vertical direction. For instance, the second driver LA2 may be a linear actuator that moves the probe head PHD up and down in the Z-axis direction.

In an embodiment, the second driver LA2 may include a second motor MT2, and a second ball screw BS2 connected to the second motor MT2 in the vertical direction. Thus, the second driver LA2 may adjust the height of the probe head PHD so that the probe head PHD may reach a desired position.

In an embodiment, the second motor MT2 may be a servomotor but is not limited thereto and may be various types of power sources. Furthermore, in an embodiment, the second motor MT2 may include a motor guide or the like.

In an embodiment, the second ball screw BS2 may be a rolled ball screw, but is not limited thereto, and may be formed as with various mechanical devices that linearly move the probe head PHD by using power generated by the second motor MT2.

The first linear motion guide LM1 may be disposed around the first driver LA1 to assist in the horizontal movement of the probe head PHD. Furthermore, the second linear motion guide LM2 may be disposed around the second driver LA2 to assist in the vertical movement of the probe head PHD.

The first sensor unit SEU1 may be disposed around the first driver LA1 to sense the horizontal position of the probe head PHD. The first sensor unit SEU1 may determine whether the corresponding electric-field application module 240, particularly, the probe head PHD reaches a desired horizontal position.

In an embodiment, the first sensor unit SEU1 may include at least one of a first position sensor SEN11 for sensing the front limit of the probe head PHD, a second position sensor SEN12 for sensing the rear limit of the probe head PHD, and a third position sensor SEN13 located between the first and second position sensors SEN11 and SEN12 to sense that the probe head PHD reaches a predetermined target point (e.g. horizontal position for making contact with the conductive pads 102 of the base substrate 100). If the first and second position sensors SEN11 and SEN12 sense the front and rear limits, the excessive movement of the probe head PHD may be prevented. Thus, mechanical damage to the electric-field application module 240 may be prevented. Furthermore, if the third position sensor SEN13 senses that the probe head PHD reaches the target point, the ease and reliability of a process may be secured.

The second sensor unit SEU2 may be disposed around the second driver LA2 to sense the vertical position (e.g. height) of the probe head PHD. The second sensor unit SEU2 may determine whether the corresponding electric-field application module 240, particularly, the probe head PHD reaches a desired vertical position.

In an embodiment, the second sensor unit SEU2 may include at least one of a first position sensor SEN21 for sensing the rising limit of the probe head PHD, a second position sensor SEN22 for sensing the dropping limit of the probe head PHD, and a third position sensor SEN23 located between the first and second position sensors SEN21 and SEN22 to sense that the probe head PHD reaches a predetermined target height (e.g. predetermined height for contacting the conductive pads 102 of the base substrate 100). If the first and second position sensors SEN21 and SEN22 sense the rising limit and the dropping limit, the excessive movement of the probe head PHD may be prevented. Thus, mechanical damage to the electric-field application module 240 may be prevented. Furthermore, if the third position sensor SEN23 senses that the probe head PHD reaches the target height, the ease and reliability of a process may be secured.

Figure 8A:
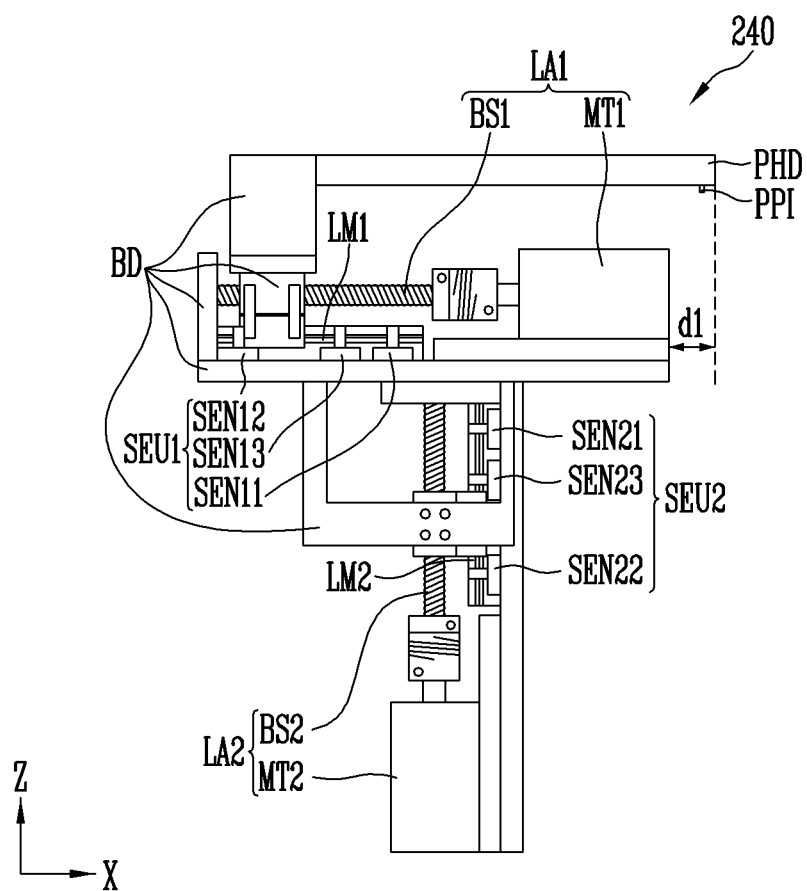
FIGS. 8A to 8C schematically illustrate an embodiment of a horizontal moving method of the electric-field application module of FIG. 7.
Figure 8B:
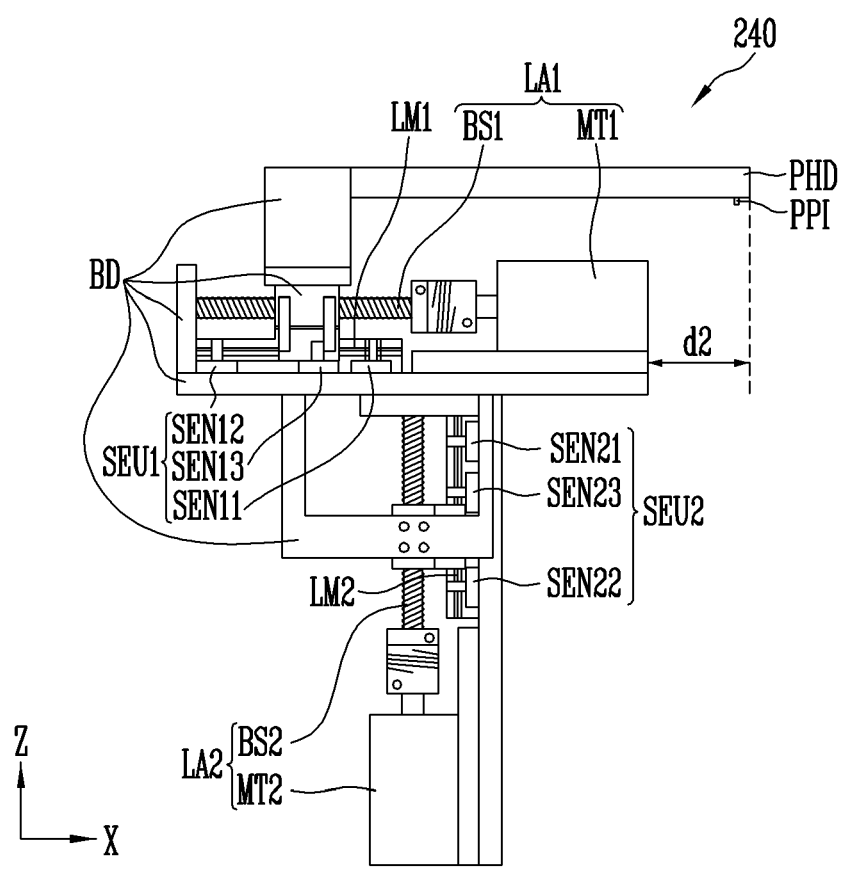
Figure 8C:
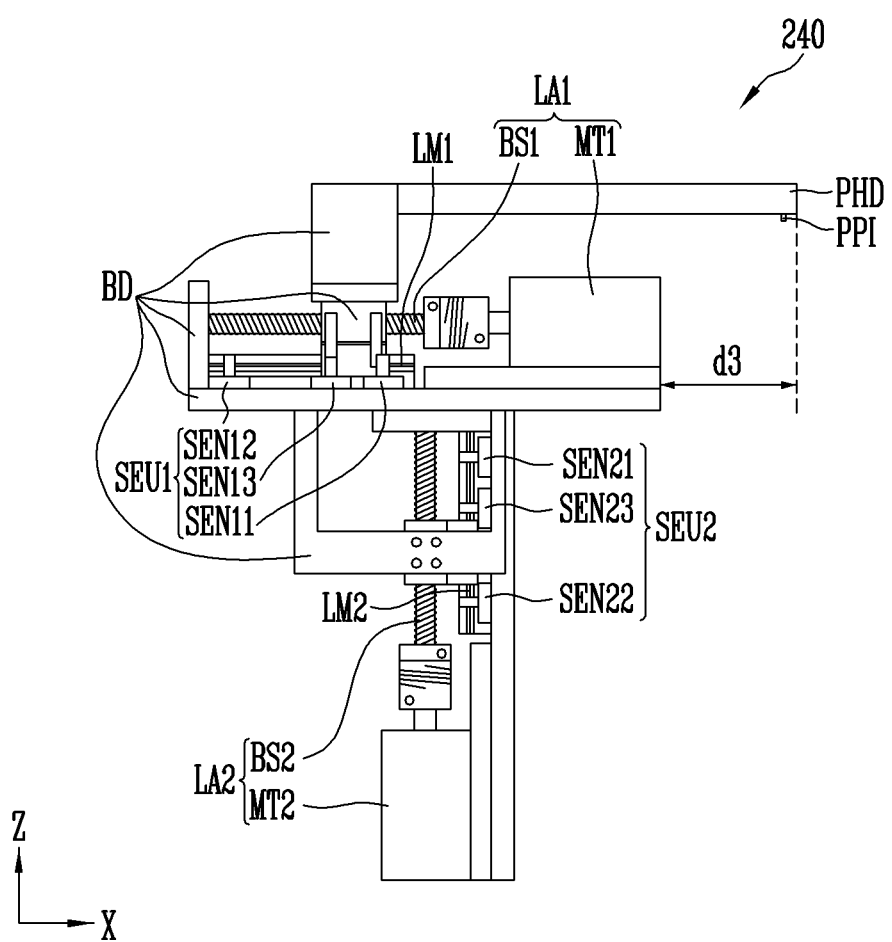

FIGS. 8A to 8C illustrate an embodiment of a horizontal moving method of the electric-field application module 240 of FIG. 7.

Referring to FIGS. 8A to 8C, the electric-field application module 240 may be moved by the first driver LA1 in the horizontal direction. For instance, the probe head PHD may be moved forwards along the X-axis by the first driver LA1. In this case, a front end of the probe head PHD may move forwards to sequentially pass through positions that are horizontally spaced apart by a first distance d1, a second distance d2, and a third distance d3 that become gradually distant from an end of the first driver LA1 in the horizontal direction. In contrast, in case that the probe head PHD is moved backwards by the first driver LA1, the front end of the probe head PHD may move backwards to sequentially pass through positions that are horizontally spaced apart from the end of the first driver LA1 by the third distance d3, the second distance d2, and the first distance d1.

Figure 9A:
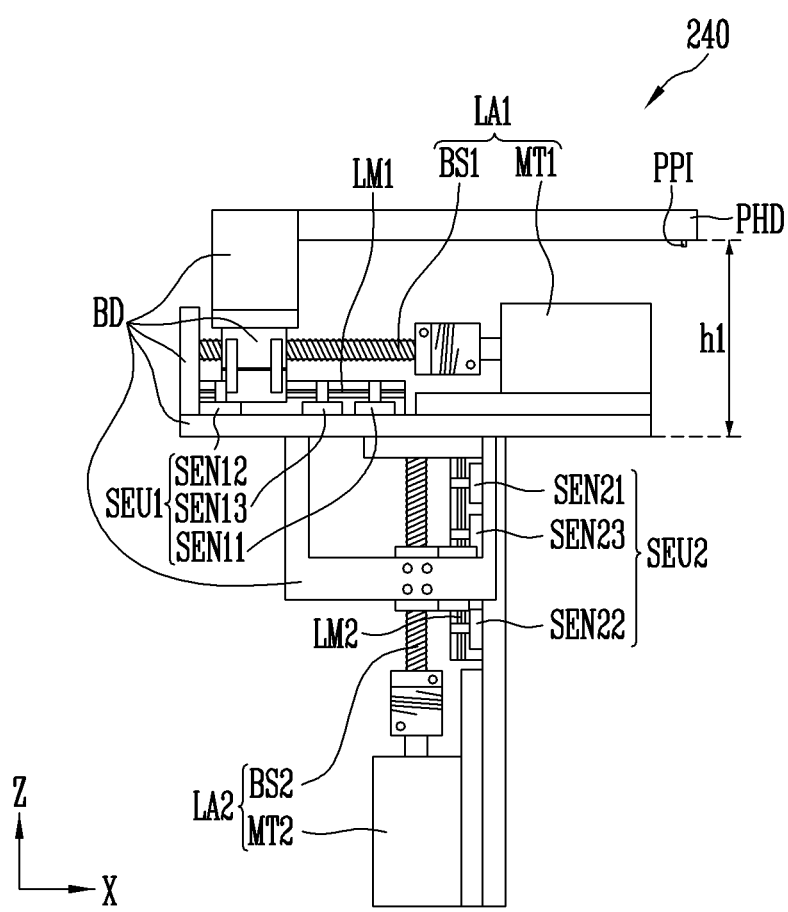
FIGS. 9A to 9C schematically illustrate an embodiment of a vertical moving method of the electric-field application module of FIG. 7.
Figure 9B:
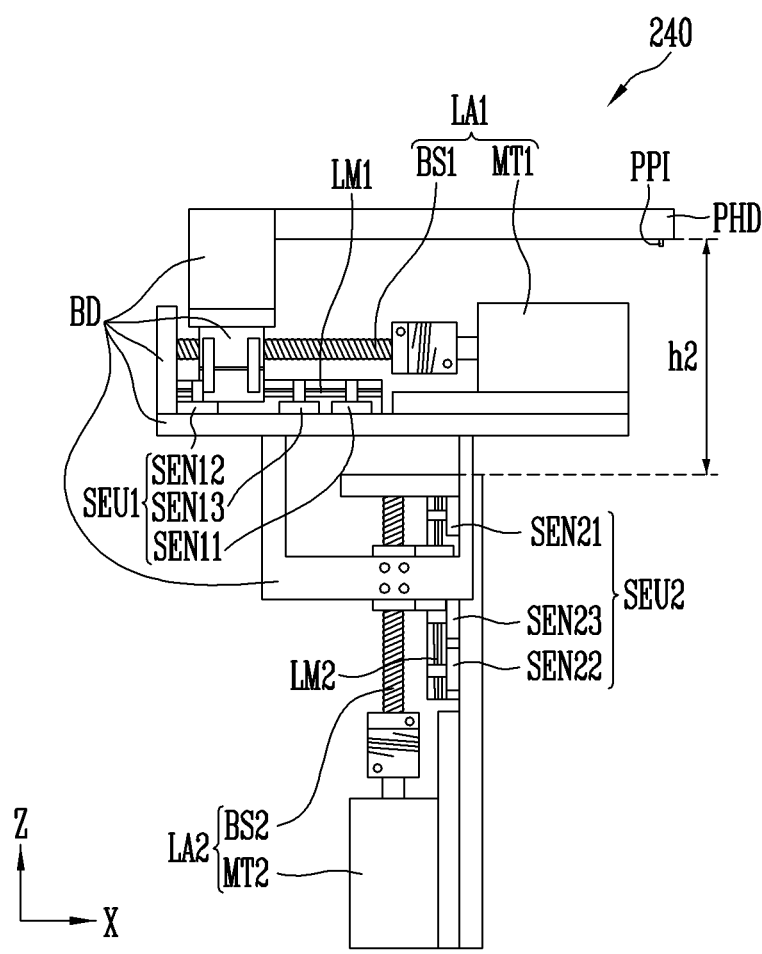
Figure 9C:
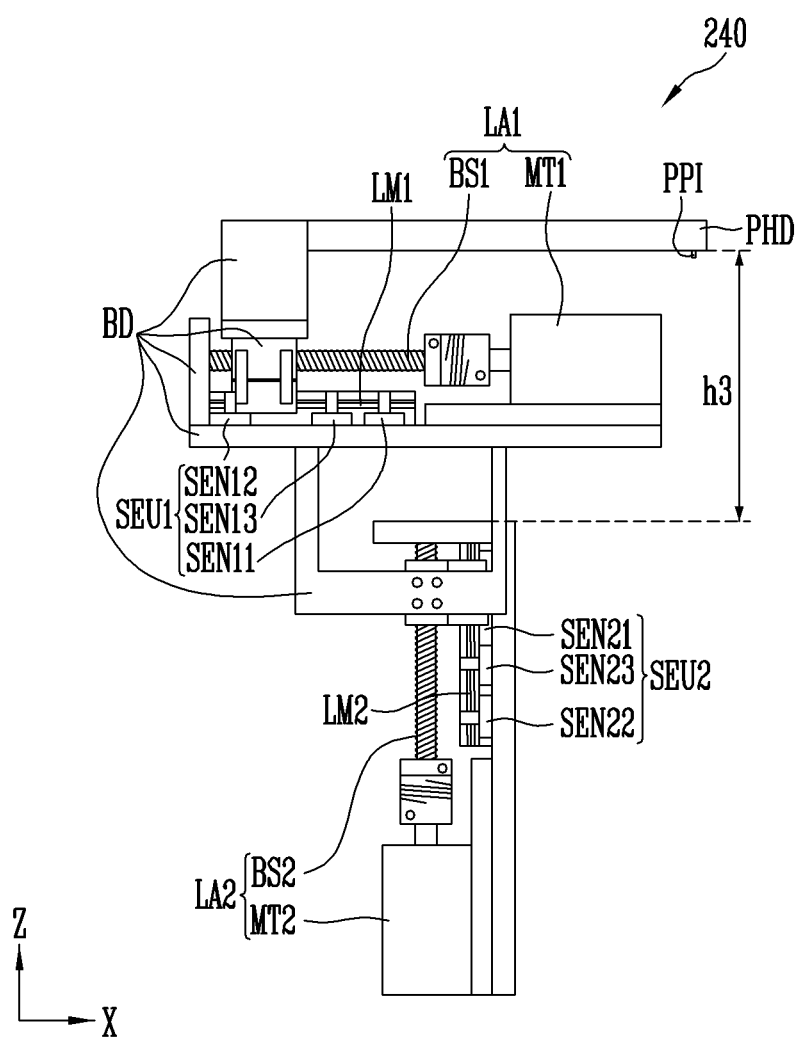

FIGS. 9A to 9C are diagrams illustrating an embodiment of a vertical moving method of the electric-field application module 240 of FIG. 7.

Referring to FIGS. 9A to 9C, the electric-field application module 240 may be moved by the second driver LA2 in the vertical direction. For instance, the probe head PHD may be moved upwards along the Z-axis by the second driver LA2. In this case, a rear surface of the probe head PHD may move upwards to sequentially pass through positions corresponding to a first height h1, a second height h2, and a third height h3 that gradually become higher from an end of the second driver LA2 in the vertical direction. In contrast, in case that the probe head PHD is moved downwards by the second driver LA2, the rear surface of the probe head PHD may move downwards to sequentially pass through positions that are vertically spaced from the end of the second driver LA2 by the third height h3, the second height h2, and the first height h1.

Figure 10:
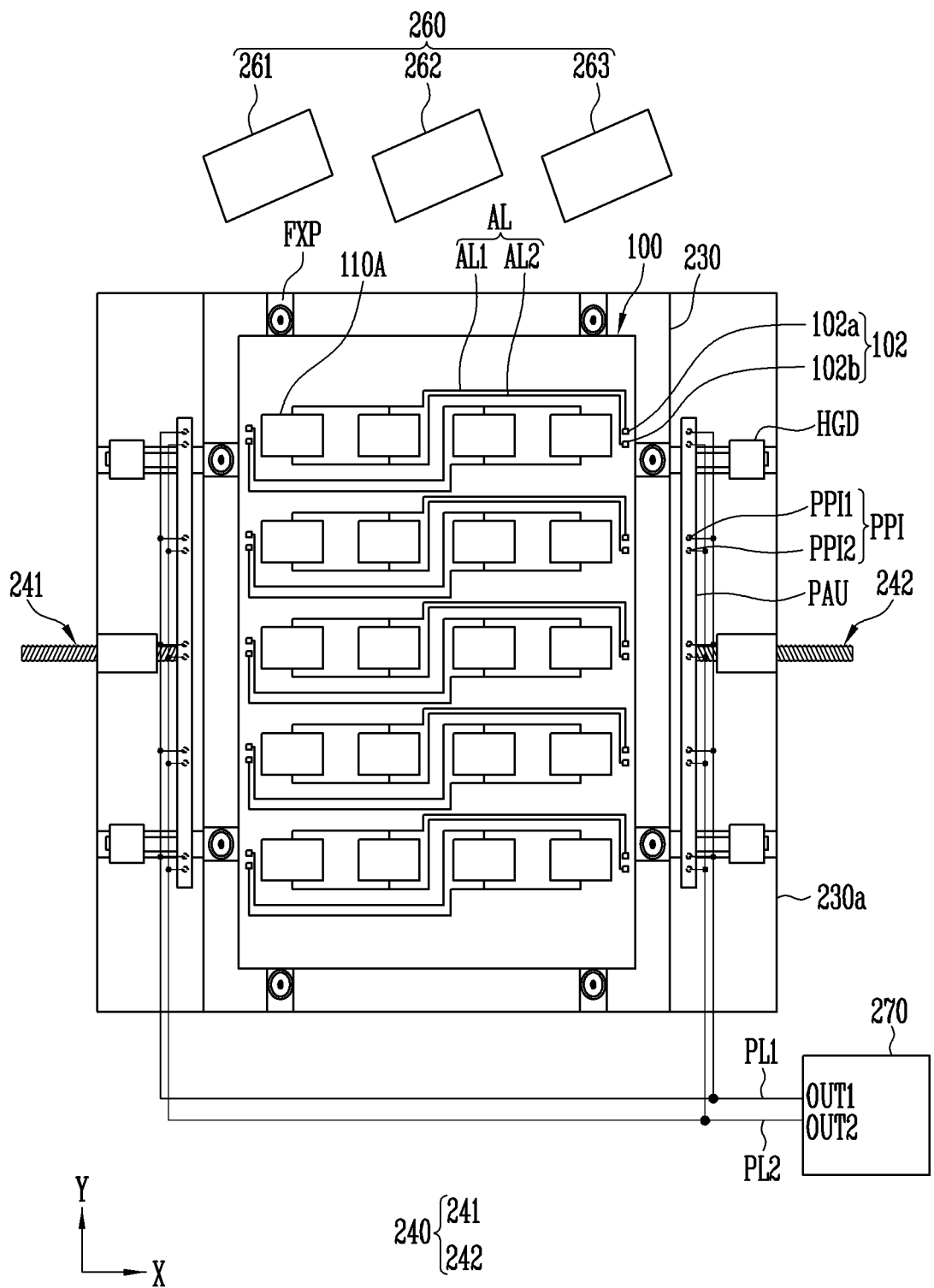
FIG. 10 and FIGS. 11A to 11D schematically illustrate an embodiment of a method of driving the manufacturing apparatus of FIG. 6.

FIGS. 10 and 11A to 11D illustrate an embodiment of a method of driving the manufacturing apparatus of FIG. 6, e.g. the first manufacturing apparatus 200. In detail, FIG. 10 is a plan view schematically illustrating a state in which the base substrate 100 of FIG. 5, for example, is disposed on the stage 230 of the first manufacturing apparatus 200. FIG. 10 illustrates the pad component PAU disposed on a surface of the probe head PHD instead of illustrating the entire probe head PHD, to show the alignment position of the probe pins PPI of the first manufacturing apparatus 200 and the base substrate 100. Furthermore, FIGS. 10 and 11A to 11D schematically illustrate the structure of the electric-field application module 240.

Referring to FIG. 10, the probe pins PPI may be arranged in the pad component PAU of the probe head PHD. Furthermore, the first manufacturing apparatus 200 according to an embodiment may further include a power supply component 270 for supplying a predetermined voltage to the probe pins PPI, and power lines PL1 and PL2 electrically connected between the probe pins PPI and the power supply component 270. The power supply component 270 may be regarded as a component of the electric-field application module 240 or a separate component outside of the electric-field application module 240.

For instance, the pad component PAU may be disposed on a surface of the probe head PHD, e.g. a lower surface thereof. The pad component PAU may include at least one first probe pin PPI1 electrically connected via the first power line PL1 to the power supply component 270, and at least one second probe pin PPI2 electrically connected via the second power line PL2 to the power supply component 270. For instance, the pad component PAU may include first probe pins PPI1 that are electrically connected in common to the first power line PL1, and second probe pins PPI2 that are paired with the first probe pins PPI1, respectively, and electrically connected in common to the second power line PL2.

In an embodiment, the first and second probe pins PPI1 and PPI2 may correspond to the conductive pads 102 formed on the base substrate 100. For instance, in case that the first electric-field application module 241 is driven, the first and second probe pins PPI1 and PPI2 provided on the first electric-field application module 241 may contact the conductive pads 102 disposed on the left side of the base substrate 100 to apply a predetermined voltage thereto. Furthermore, in case that the second electric-field application module 242 is driven, the first and second probe pins PPI1 and PPI2 provided on the second electric-field application module 242 may contact the conductive pads 102 disposed on the right side of the base substrate 100 to apply a predetermined voltage thereto.

In an embodiment, the power supply component 270 may supply a predetermined voltage (or signal) having a predetermined waveform and/or potential through a first output terminal OUT1 to the first power line PL1 and may supply a reference voltage having a predetermined reference potential through a second output terminal OUT2 to the second power line PL2. For instance, the power supply component 270 may supply an AC voltage having a sine waveform to the first power line PL1 and supply a ground voltage to the second power line PL2. In an embodiment, a predetermined voltage supplied to the first and second power lines PL1 and PL2 may be a predetermined alignment signal for aligning the light emitting elements LD between the first and second pixel electrodes ELT1 and ELT2.

In an embodiment, the first manufacturing apparatus 200 may further include at least one additional component. For instance, the first manufacturing apparatus 200 may further include at least one horizontal guide HGD disposed in or around the first and/or second electric-field application module 241 and 242, and at least one fixing component FXP provided on the stage 230.

In an embodiment, after the base substrate 100 is seated on the stage 230, if a process for disposing the light emitting elements LD on the base substrate 100 is started, the first and second electric-field application modules 241 and 242 may be driven to supply a predetermined voltage to at least some of the conductive pads 102 of the base substrate 100. Thus, the electric field may be formed between the first and second pixel electrodes ELT1 and ELT2 formed in at least one cell 110A located in or on the base substrate 100, particularly in each pixel area of at least one cell 110A. Furthermore, if the process is started, at least one printing head 260 may move to the top of the base substrate 100 to supply the light emitting elements LD to the at least one cell 110A. Thus, the light emitting elements LD may be supplied to the at least one cell 110A, and simultaneously the light emitting elements LD may be aligned between the first and second pixel electrodes ELT1 and ELT2. In other words, in an embodiment, each of the first and second electric-field application modules 241 and 242 may be an alignment-signal applying device that supplies a predetermined alignment signal for aligning the light emitting elements LD.

In an embodiment, the first and second electric-field application modules 241 and 242 may be driven sequentially or alternately. For instance, the first and second electric-field application modules 241 and 242 may be sequentially driven in response to the position and/or moving direction of the printing head 260 that is being operated. For instance, the first and second electric-field application modules 241 and 242 may be operated sequentially or alternately to avoid a collision with the printing head 260.

For example, as illustrated in FIGS. 11A to 11D, at least one printing head 260 may spray a droplet DRL onto the stage 230 while moving from the right side to the left side of the stage 230 above the stage 230. In an embodiment, the printing head 260 may move while spraying a light-emitting-element solution, in which the light emitting elements LD are dispersed, onto the base substrate 100 seated on the stage 230, particularly, onto at least one cell 110A located on the base substrate 100 (e.g. each pixel area defined in the cell 110A) in the form of the droplet DRL.

Figure 11A:
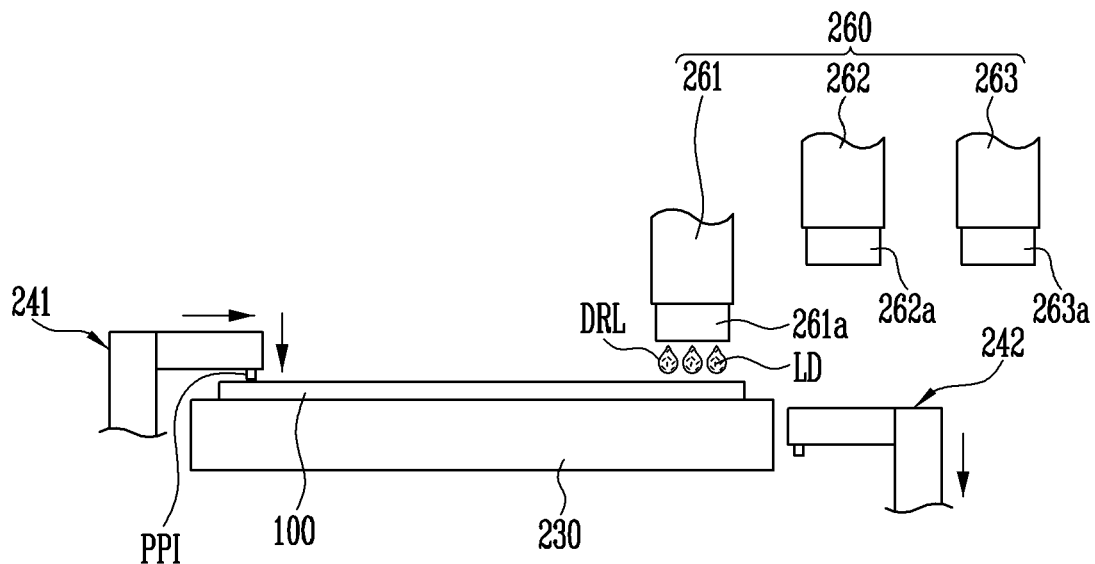
Figure 11B:
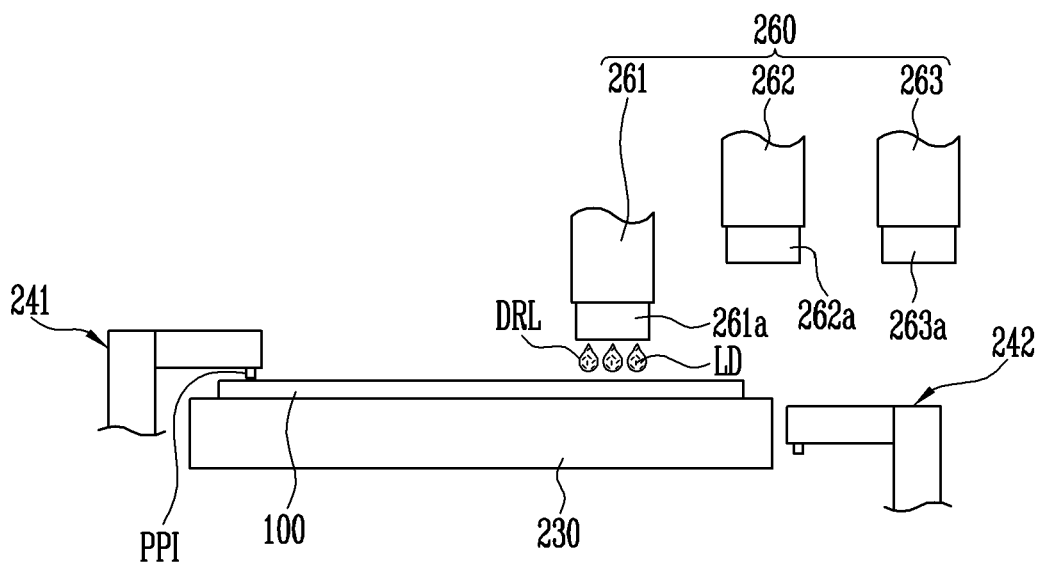

In an embodiment, in case that the printing head 260 approaches the right side of the stage 230, the first electric-field application module 241 located on the left side of the stage 230, particularly, the probe head PHD of the first electric-field application module 241, may move to the left side of the stage 230 above the stage 230. For example, as illustrated in FIGS. 11A and 11B, the first electric-field application module 241 may apply the electric field to the base substrate 100 above the left side of the stage 230, during a period in which the printing head 260 (e.g. the first printing head 261) that is being operated is located above the right side of the stage 230. For instance, the first electric-field application module 241 may apply a predetermined alignment voltage through the conductive pads 102 located on the left side of the base substrate 100 to the cells 110A located on the right side of the base substrate 100. During this period, the second electric-field application module 242 may wait in a state in which it moves backwards and downwards relative to the stage 230.

Figure 11C:
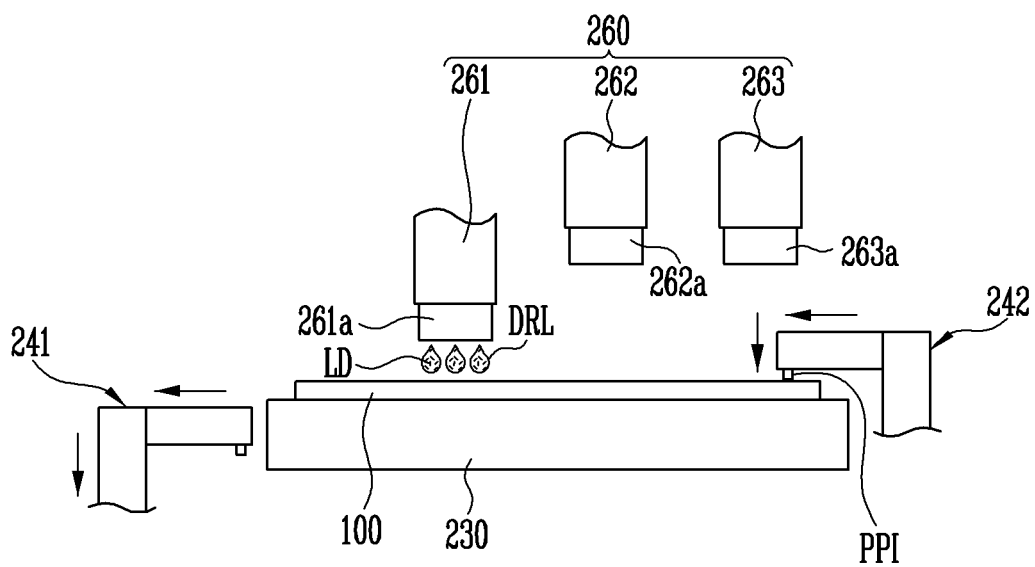
Figure 11D:
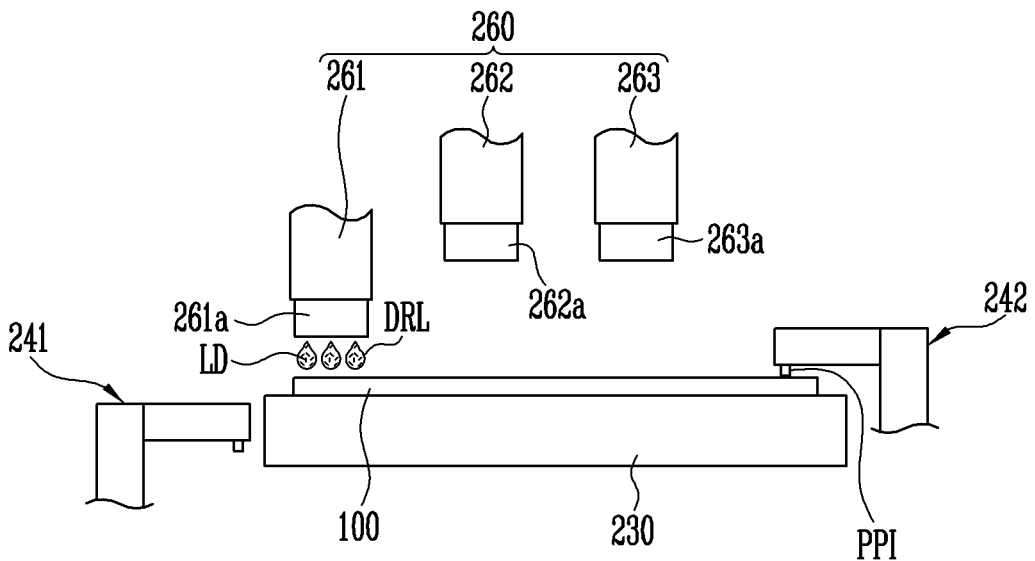

In case that the printing head 260 approaches the left side of the stage 230, the second electric-field application module 242 located on the right side of the stage 230, particularly, the probe head PHD of the second electric-field application module 242, may move to the right side of the stage 230 above the stage 230. For example, as illustrated in FIGS. 11C and 11D, the second electric-field application module 242 may apply the electric field to the base substrate 100 above the right side of the stage 230, during a period in which the printing head 260 that is being operated is located above the left side of the stage 230. For instance, the second electric-field application module 242 may apply a predetermined alignment voltage through the conductive pads 102 located on the right side of the base substrate 100 to the cells 110A located on the left side of the base substrate 100. During this period, the first electric-field application module 241 may wait in a state in which it moves backwards and downwards relative to the stage 230.

According to the above-described embodiment, the light emitting elements LD may be supplied onto the base substrate 100 by driving at least one printing head 260, and at the same time, an electric field for inducing the alignment of the light emitting elements LD may be applied onto the base substrate 100 by driving at least one electric-field application module 240. Particularly, in the above-described embodiment, an interference and/or collision between the printing head 260 and the electric-field application module 240 may be prevented by optionally driving the first and/or second electric-field application modules 241 and 242 depending on the position of the printing head 260 that is being operated. Thus, the moving distance of the printing head 260 may be increased, and an effective area (e.g. area in which individual cells 110A may be disposed) capable of supplying the light emitting elements LD on the base substrate 100 may be secured.

Figure 12:
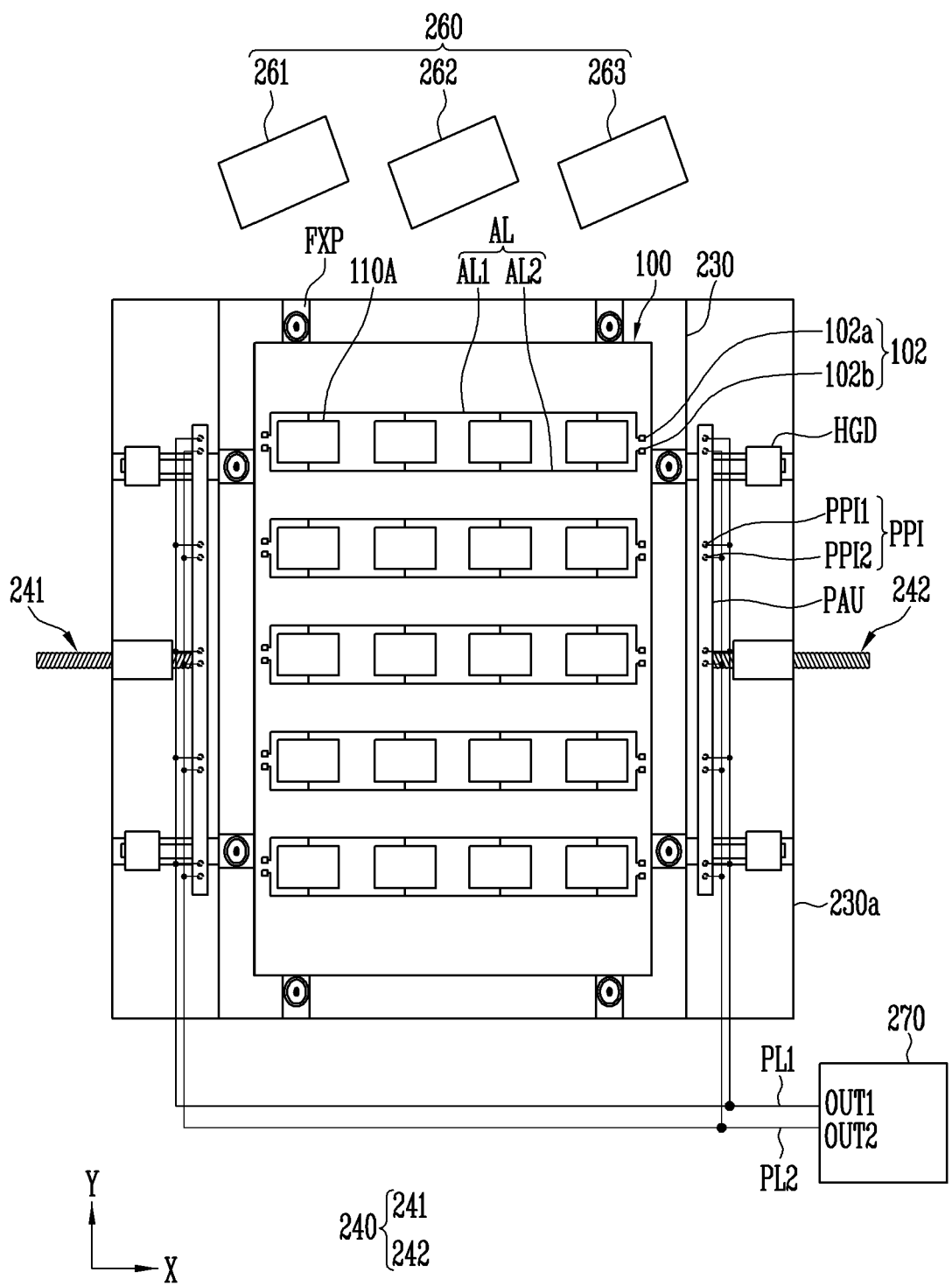
FIGS. 12 and 13 schematically illustrate another embodiment of a method of driving the manufacturing apparatus of FIG. 6.
Figure 13:
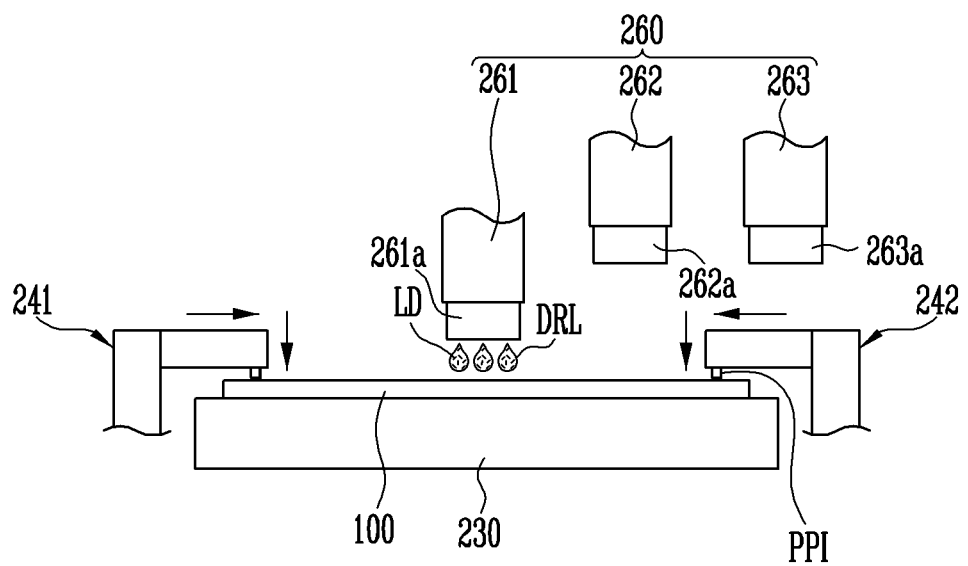

FIGS. 12 and 13 illustrate another embodiment of a method of driving the manufacturing apparatus of FIG. 6, e.g. the first manufacturing apparatus 200. In an embodiment of FIGS. 12 and 13, like reference numerals are used to designate components identical or similar to those of the embodiment of FIGS. 10 to 11D, and detailed descriptions thereof will be omitted.

Referring to FIGS. 12 and 13, in an embodiment, the first and second electric-field application modules 241 and 242 may be simultaneously driven. For example, the first and second electric-field application modules 241 and 242 may be independently and/or individually driven and may be simultaneously driven if desired.

For instance, if the first and second alignment lines AL1 and AL2 are simultaneously connected to the conductive pads 102 disposed on the left and right sides of the base substrate 100, the first and second electric-field application modules 241 and 242 may be simultaneously driven to apply a predetermined electric field through ends of the base substrate 100. By reducing or minimizing a voltage drop occurring in the first and second alignment lines AL1 and AL2, the light emitting elements LD may be smoothly aligned in each cell 110A.

As another example, in another embodiment, each cell 110A may be electrically connected to at least one pair of closest conductive pads 102 among the conductive pads 102 disposed on the sides of the base substrate 100 and may receive a predetermined voltage from at least one pair of conductive pads 102 during the period in case that the light emitting elements LD are supplied to the interior of the cell 110A. For example, the cells 110A disposed on the left side of the base substrate 100 may receive a predetermined voltage from the conductive pads 102 disposed on a left edge of the base substrate 100, and the cells 110A disposed on the right side of the base substrate 100 may receive a predetermined voltage from the conductive pads 102 disposed on a right edge of the base substrate 100. Even in this case, by reducing or minimizing a voltage drop occurring in the first and second alignment lines AL1 and AL2, the light emitting elements LD may be smoothly aligned in each cell 110A.

Figure 14:
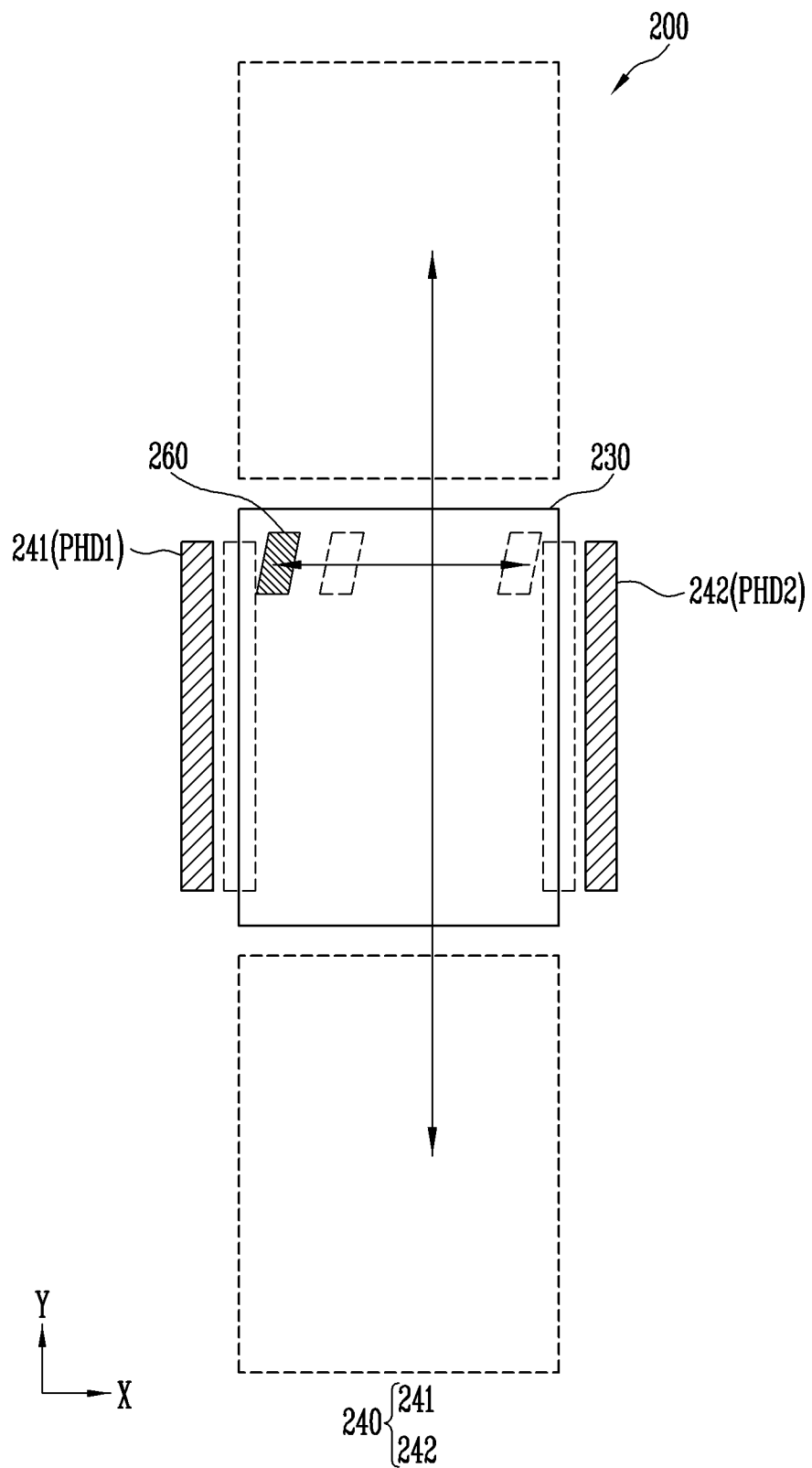
FIGS. 14 to 16 schematically illustrate various embodiments related to the arrangement of the electric-field application module that may be provided in the manufacturing apparatus of FIG. 6.
Figure 15:
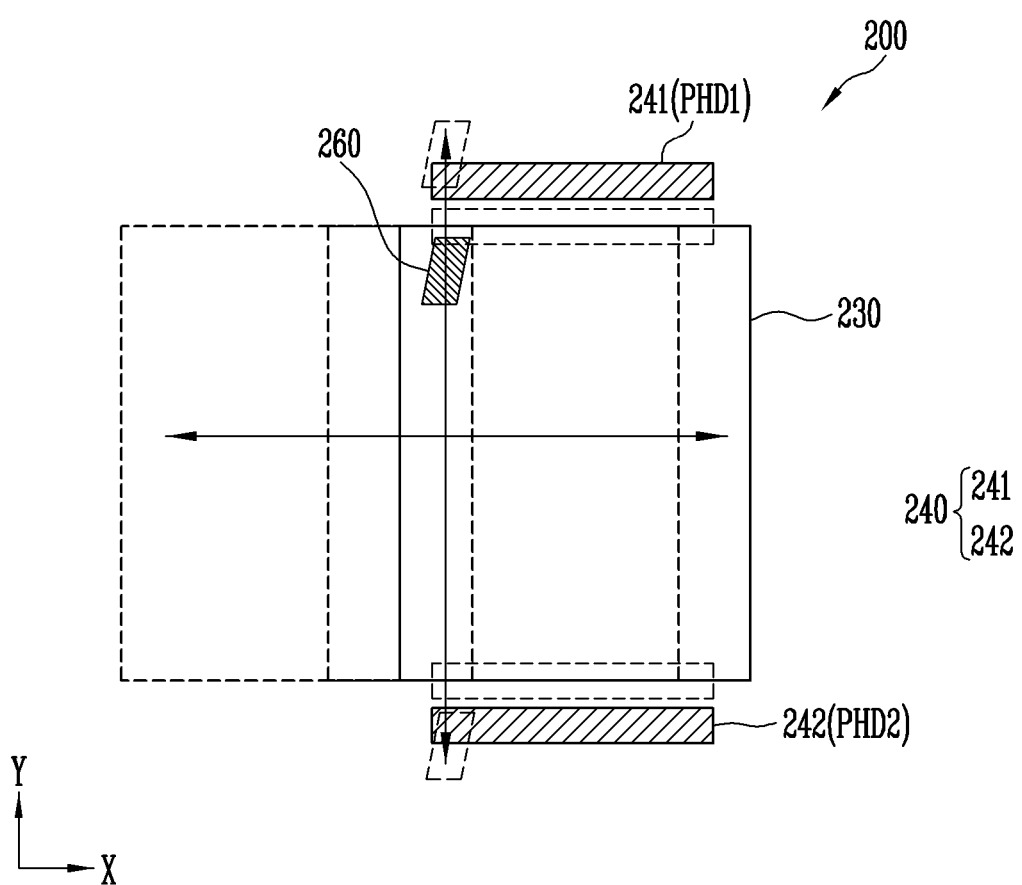
Figure 16:
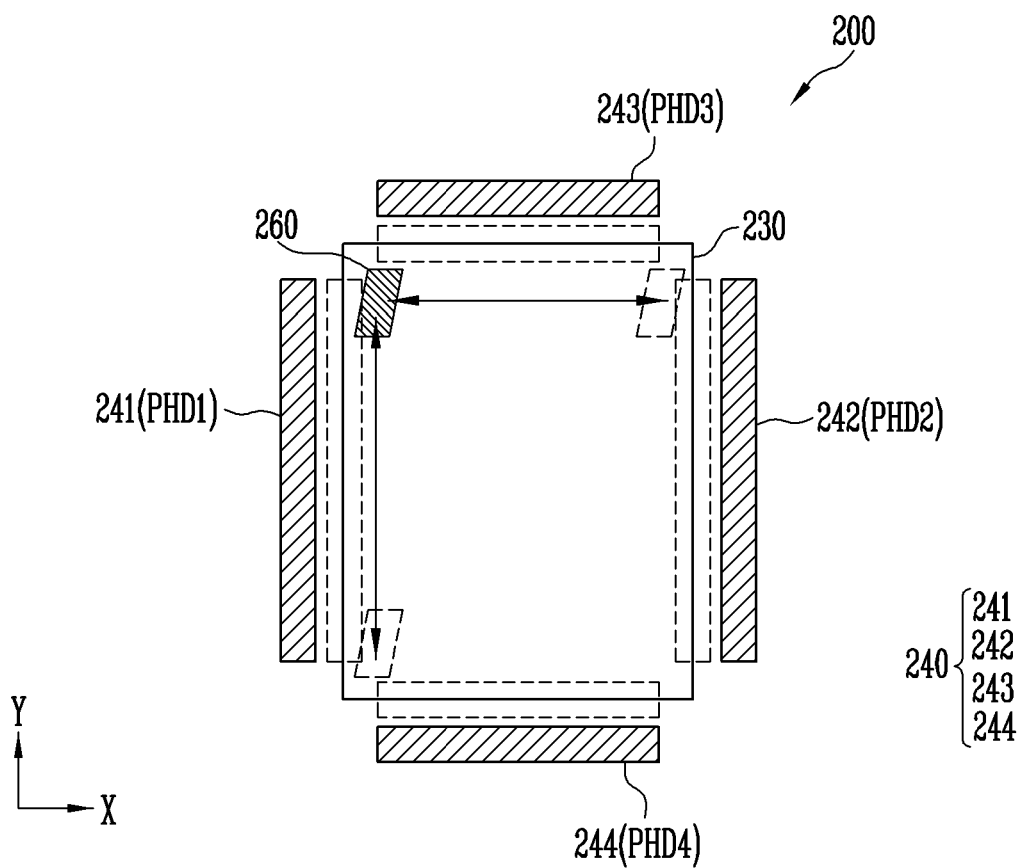
Figure 17B:
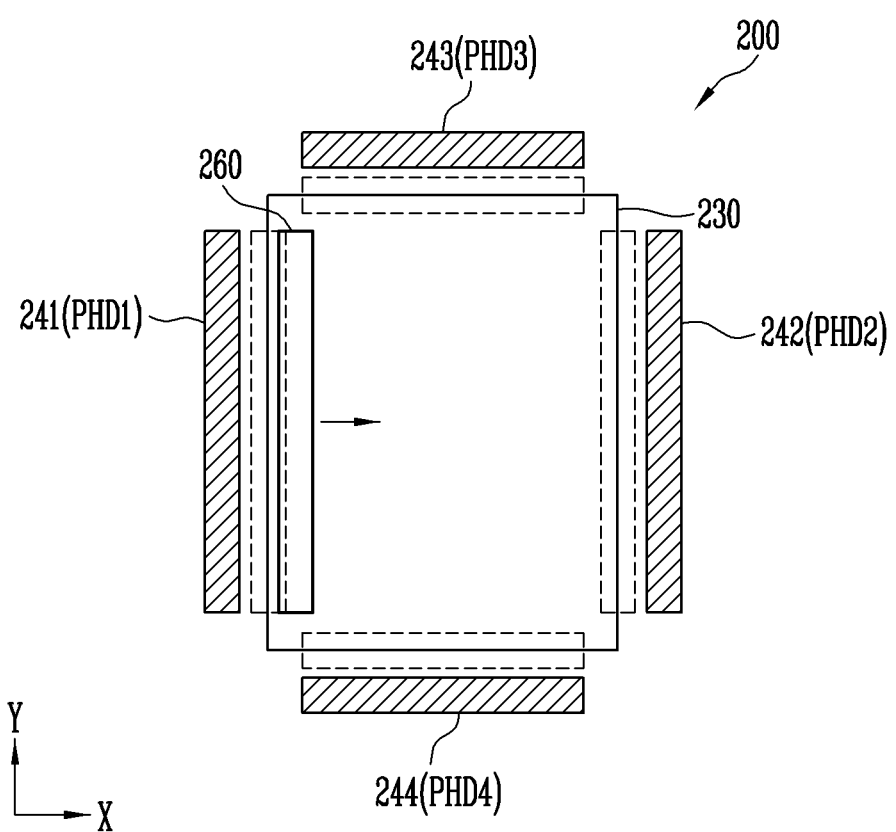

FIGS. 14 to 16 illustrate various embodiments related to the arrangement of the electric-field application module 240 that may be provided in the manufacturing apparatus of FIG. 6, e.g. the first manufacturing apparatus 200. Furthermore, FIGS. 17A and 17B illustrate various embodiments related to the printing head 260 that may be provided in the manufacturing apparatus of FIG. 6, e.g. the first manufacturing apparatus 200. FIGS. 14 to 17B schematically illustrate only the position of the electric-field application module 240 depending on the position and/or moving direction of the stage 230 and the printing head 260.

Referring to FIG. 14, in an embodiment, the stage 230 and the printing head 260 may move in directions orthogonal to each other. For instance, in the first manufacturing apparatus 200 adopting a stage moving method, the stage 230 may move for a relatively long distance in the Y-axis direction, and the printing head 260 may move for a relatively short distance in the X-axis direction. Thus, the light emitting elements LD may be supplied to an entire effective area of the stage 230. In the embodiment, the first and second electric-field application modules 241 and 242 may be disposed on the left and right sides of the stage 230 not to interfere with the movement of the stage 230. Thus, even if the stage 230 moves for the long distance in the Y-axis direction, the stage 230 may be prevented from colliding with the first and second electric-field application modules 241 and 242, particularly the probe heads PHD1 and PHD2 of the first and second electric-field application modules 241 and 242. Furthermore, as in the above-described embodiment, the first and second electric-field application modules 241 and 242 may be driven to prevent a collision with the printing head 260.

Referring to FIG. 15, for instance, in the first manufacturing apparatus 200 adopting a head moving method, the stage 230 may move for a relatively long distance in the X-axis direction, and the printing head 260 may move in the Y-axis direction. In this embodiment, the first and second electric-field application modules 241 and 242 may be disposed on the upper and lower ends of the stage 230 not to interfere with the movement of the stage 230.

Referring to FIG. 16, in a further embodiment, the electric-field application module 240 may be disposed on at least three sides of the stage 230. For instance, the electric-field application module 240 may be disposed on all four sides of the stage 230. For instance, the first manufacturing apparatus 200 according to this embodiment may further include a third electric-field application module 243 disposed on the third side of the stage 230, e.g. its upper end, and a fourth electric-field application module 244 disposed on the fourth side of the stage 230, e.g. its lower end. In an embodiment, the respective electric-field application module 240 may have the substantially same configuration, so that the two electric-field application modules 240 may be disposed to face each other. Furthermore, each electric-field application module 240 may be driven to prevent the respective probe heads PHD1, PHD2, PHD3, and PHD4 from colliding with the stage 230 and/or the printing head 260.

In an embodiment of FIG. 16, the printing head 260 may be designed to move in the X- and Y-axis directions. As another example, in another embodiment, the printing head 260 may be designed to move in a direction intersecting a longitudinal direction while having an extended length in the X- or Y-axis direction as illustrated in FIGS. 17A and 17B.

According to the above-described embodiments, the light emitting elements LD may be supplied to the effective area of the stage 230, and the electric field for aligning the light emitting elements LD may be simultaneously applied thereto while preventing a mutual interference and/or collision between the stage 230, the electric-field application module 240, and/or the printing head 260.

An apparatus for manufacturing the light emitting display device according to the embodiments of FIGS. 6 to 17B, e.g. the first manufacturing apparatus 200 may include the printing head 260 for supplying the light emitting elements LD, and the electric-field application module 240 for aligning the light emitting elements LD. For example, the electric-field application module 240 may transmit a predetermined alignment voltage for inducing the self-alignment of the light emitting elements LD to the base substrate 100 (or the substrate 111 of the light emitting display panel 110). Thus, the light emitting elements LD may be supplied to the base substrate 100 (or the substrate 111 of the light emitting display panel 110) disposed on the stage 230 of the first manufacturing apparatus 200, and the light emitting elements LD may be simultaneously aligned between the first and second pixel electrodes ELT1 and ELT2 of each pixel PXL.

Furthermore, the electric-field application module 240 may include a first driver LA1 for horizontally moving the probe head PHD, and a second driver LA2 for vertically moving the probe head PHD. Thus, the movement of the electric-field application module 240 may be readily controlled.

Furthermore, in an embodiment, the first manufacturing apparatus 200 may include electric-field application modules 240 that may be sequentially and/or simultaneously driven. In the embodiment, the electric field may be applied to the base substrate 100 (or the substrate 111 of the light emitting display panel 110) while preventing a mutual interference and/or collision between the electric-field application module 240 and the printing head 260.

Figure 18:
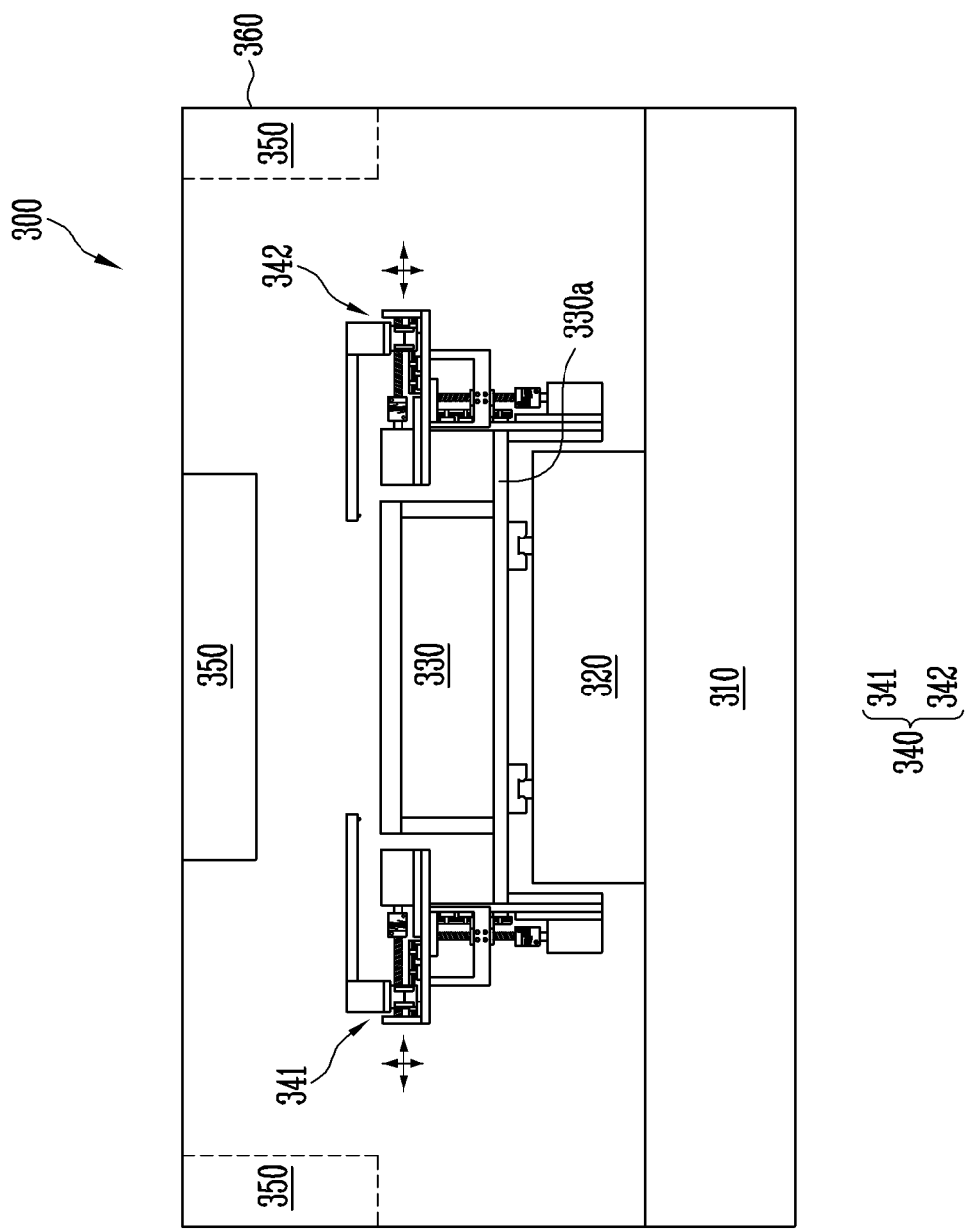

FIGS. 18 and 19 illustrate an apparatus 300 for manufacturing a light emitting display device in accordance with an embodiment. In detail, FIGS. 18 and 19 illustrate the embodiment of the manufacturing apparatus 300 (hereinafter referred to as a "second manufacturing apparatus 300") that may be used to remove a solution supplied to the substrate 111 of the light emitting display panel 110 or to the base substrate 100 along with the light emitting elements LD. For instance, the second manufacturing apparatus 300 may be a drying device for removing the solution supplied along with the light emitting elements LD in a process of supplying the droplet DRL including the light emitting elements LD to the substrate 111 of the light emitting display panel 110 or to the base substrate 100. Furthermore, in an embodiment, the second manufacturing apparatus 300 may be an oven type drying device capable of accommodating the substrate 111 of the light emitting display panel 110 or the base substrate 100, but the disclosure is not limited thereto. The same reference numerals will denote components common to the second manufacturing apparatus 300 according to the embodiment of FIGS. 18 and 19 and the first manufacturing apparatus 200 according to the embodiment of FIGS. 6 to 17B, and detailed descriptions thereof will be omitted.

In FIGS. 18 and 19, reference numeral "340" (or "340'") may collectively correspond to at least one electric-field application module. For example, reference numeral "340" (or "340'") may correspond to each electric-field application module or electric-field application modules.

Referring to FIGS. 18 and 19, the second manufacturing apparatus 300 according to an embodiment may include a stage 330 (also referred to as a "second stage") disposed in a chamber 360, at least one electric-field application module 340, 340' disposed on at least one side of the stage 330, and a heating element 350 disposed around the stage 330. For instance, the at least one electric-field application module 340, 340' may be connected to a lower plate 330a of the stage 330. Furthermore, in an embodiment, the second manufacturing apparatus 300 may further include a main plate 310 and/or an auxiliary plate 320.

In an embodiment, the second manufacturing apparatus 300 may include at least one of first electric-field application modules 341 and 341' disposed on a first side of the stage 330, and second electric-field application modules 342 and 342' disposed on a second side of the stage 330. In an embodiment, the first and second sides of the stage 330 may be opposite ends that face each other. For instance, the first side and the second side may be the left side and the right side of the stage 330, respectively. In other words, the first and second electric-field application modules 341, 341', 342, and 342' may be adjacent to sides of the stage 330 facing each other, respectively. However, the disclosure is not limited thereto, and the positions of the first and second electric-field application modules 341, 341', 342, and 342' may be changed. Furthermore, in another embodiment, a single electric-field application module 340 or 340' may be disposed only on a side of the stage 330.

In an embodiment, the first and second electric-field application modules 341, 341', 342, and 342' may be driven independently and/or individually. Thus, the first and second electric-field application modules 341, 341', 342, and 342' may be readily selectively driven.

Furthermore, in an embodiment, the first and second electric-field application modules 341, 341', 342, and 342' may be driven simultaneously. Thus, a desired electric field can be smoothly supplied to the substrate 111 of the light emitting display panel 110 or the base substrate 100.

In an embodiment, each of the electric-field application modules 340 and 340' may be configured to be substantially identical or similar to each of the electric-field application modules 240 provided in the above-described first manufacturing apparatus 200. Hereinafter, with reference to FIGS. 7, 18, and 19, the configuration of the electric-field application modules 340 and 340' provided in the second manufacturing apparatus 300 (e.g. drying apparatus) according to this embodiment will be described.

In an embodiment, the electric-field application module 340 of the second manufacturing apparatus 300 may be configured to be substantially identical or similar to the electric-field application module provided in the first manufacturing apparatus 200, e.g. the electric-field application module 240 according to the embodiment of FIG. 7. For instance, the electric-field application module 340 of the second manufacturing apparatus 300 according to an embodiment of FIG. 18 may include a probe head PHD including at least one probe pin PPI, first and second drivers LA1 and LA2 for moving the probe head PHD horizontally and vertically, and a body BD connected to the probe head PHD and the first and second drivers LA1 and LA2, as in the electric-field application module 240 of the first manufacturing apparatus 200 shown in FIG. 7. Furthermore, in an embodiment, each electric-field application module 340 provided in the second manufacturing apparatus 300 may optionally further include at least one sensor unit (e.g. first and/or second sensor unit SEU1 and SEU2) disposed around the first and/or second driver LA1, LA2 to detect the position of the probe head PHD, and at least one linear motion guide (e.g. first and/or second linear motion guide LM1, LM2) connected to the body BD. In an embodiment, the first driver LA1 may horizontally move the probe head PHD forwards and backwards or leftwards and rightwards, and the second driver LA2 may vertically move the probe head PHD up and down. Thus, the movement of the electric-field application module 340 provided in the second manufacturing apparatus 300 may be readily controlled.

In the second manufacturing apparatus 300 according to the embodiment of FIG. 19, each electric-field application module 340' may be configured to be vertically movable up and down. For instance, each of the first and second electric-field application modules 341' and 342' of the second manufacturing apparatus 300 may not be provided with the first driver LA1 for horizontally moving the probe head PHD and may be provided with only the second driver LA2 for vertically moving the probe head PHD. In this case, each probe head PHD may vertically move up and down.

Furthermore, the second manufacturing apparatus 300 may further include a device for supplying a predetermined voltage to each of the electric-field application modules 340 and 340', for instance, the power supply component 270 illustrated in FIG. 10. For example, as illustrated in FIG. 10, the probe head PHD may include at least one first probe pin PPI1 electrically connected to the first power line PL1 (e.g. first probe pins PPI1 electrically connected in common to the first power line PL1), and at least one second probe pin PPI2 electrically connected to the second power line PL2 (e.g. second probe pins PPI2 paired with the first probe pins PPI1, respectively, and electrically connected in common to the second power line PL2). Furthermore, the power supply component 270 may be electrically connected to at least one first and second probe pins PPI1 and PPI2 via the first and second power lines PL1 and PL2, respectively. In an embodiment, the power supply component 270 may supply an AC or DC signal through the first power line PL1 to the at least one first probe pin PPI1 and may supply a reference voltage having a predetermined reference potential through the second power line PL2 to the at least one second probe pin PPI2.

In an embodiment, the heating element 350 may be disposed above the stage 330 to be spaced apart from the stage 330. For instance, the heating element 350 may be disposed on a ceiling of the chamber 360 to emit heat towards the stage 330. In an embodiment, the shape, size, structure, and/or material of the heating element 350 are not limited particularly. The heating element 350 may include various heating materials known in the art.

Furthermore, in an embodiment, the position of the heating element 350 may be changed. For example, in another embodiment, at least one heating element 350 may be disposed on at least one corner and/or at least one sidewall of the chamber 360.

Figure 20B:
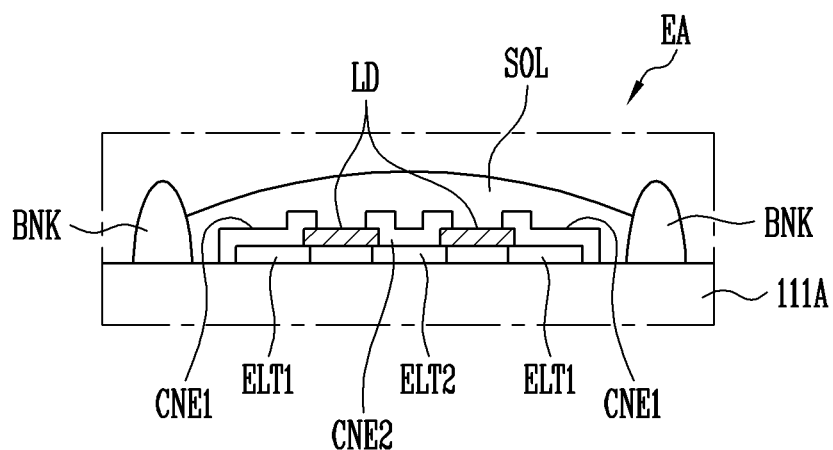

FIG. 20A illustrates an embodiment of a method of driving the manufacturing apparatus of FIGS. 18 and 19, e.g. the second manufacturing apparatus 300. Furthermore, FIG. 20B illustrates an embodiment of an area (area EA) of FIG. 20A. In an embodiment, the area EA of FIG. 20A may be the emission area of each pixel PXL. In the description of the embodiment of FIGS. 20A and 20B, the same reference numerals will be used to designate components similar or identical to those of the previous embodiments, and detailed descriptions thereof will be omitted.

Referring to FIGS. 20A and 20B, in case that the light emitting elements LD are supplied to each cell 110A of the base substrate 100 through the printing method using the above-described first manufacturing apparatus 200 or the like, a solvent SOL of the LED solution as well as the light emitting elements LD are supplied to each pixel area defined in each cell 110A, particularly, the emission area EA of each pixel PXL enclosed by a bank BNK. Therefore, after the light emitting elements LD are supplied to each emission area EA, the solvent SOL may be removed, and the light emitting elements LD may be stably disposed between the first and second pixel electrodes ELT1 and ELT2.

In an embodiment, the solvent SOL may be removed using the second manufacturing apparatus 300 according to the embodiment of FIG. 18 or 19, for instance, the oven type drying device including the heating element 350. For instance, in a state in which the electric field is formed on the base substrate 100 disposed on the stage 330 using at least one electric-field application module 340 or 340' provided in the second manufacturing apparatus 300, the heating element 350 of the second manufacturing apparatus 300 may be driven to remove the solvent SOL supplied to the base substrate 100.

For example, the first and second electric-field application modules 341, 341', 342, and 342' of the second manufacturing apparatus 300 may move up and down to cause the probe pins PPI to contact the conductive pads 102 on the base substrate 100 and may apply a predetermined alignment voltage to the conductive pads 102. Thus, in a state in which the alignment voltage is applied to the first and second pixel electrodes ELT1 and ELT2 of each pixel PXL, the heating element 350 may be driven to supply heat to the base substrate 100, thereby removing the solvent SOL.

If the solvent SOL is removed in a state in which the alignment voltage is applied to the first and second pixel electrodes ELT1 and ELT2 of each pixel PXL, the misalignment of the light emitting elements LD may be prevented in the process of removing the solvent SOL. For example, even if the solvent SOL flows or its vapour is generated in case that the solvent SOL is dried, the movement and/or removal of the light emitting elements LD may be prevented by the electric field formed between the first and second pixel electrodes ELT1 and ELT2 by the alignment voltage. Thus, the light emitting elements LD may be stably aligned in the emission area EA of each pixel PXL, and the quality of the alignment may be improved.

FIG. 21 illustrates an embodiment of a method of driving the manufacturing apparatus of FIGS. 18 and 19, e.g. the second manufacturing apparatus 300. In the description of the embodiment of FIG. 21, the same reference numerals will be used to designate components similar or identical to those of the previous embodiments, and detailed descriptions thereof will be omitted.

Referring to FIGS. 20A, 20B, and 21, according to an embodiment, the process for drying the solvent SOL may be simultaneously performed on base substrates 100, in chambers 360, for example, at least first and second chambers 361 and 362. The embodiment according to the disclosure has described an example in which the light emitting display panels 110 are simultaneously manufactured on at least one base substrate 100, but the disclosure is not limited thereto. For example, in another embodiment, an individual substrate 111 for manufacturing an individual light emitting display panel 110 may be disposed on the stage 230 of the inkjet printer and/or the drying device, and the process of supplying the light emitting elements LD and/or the process of drying the solvent SOL may be performed on the substrate 111.

Figure 22:
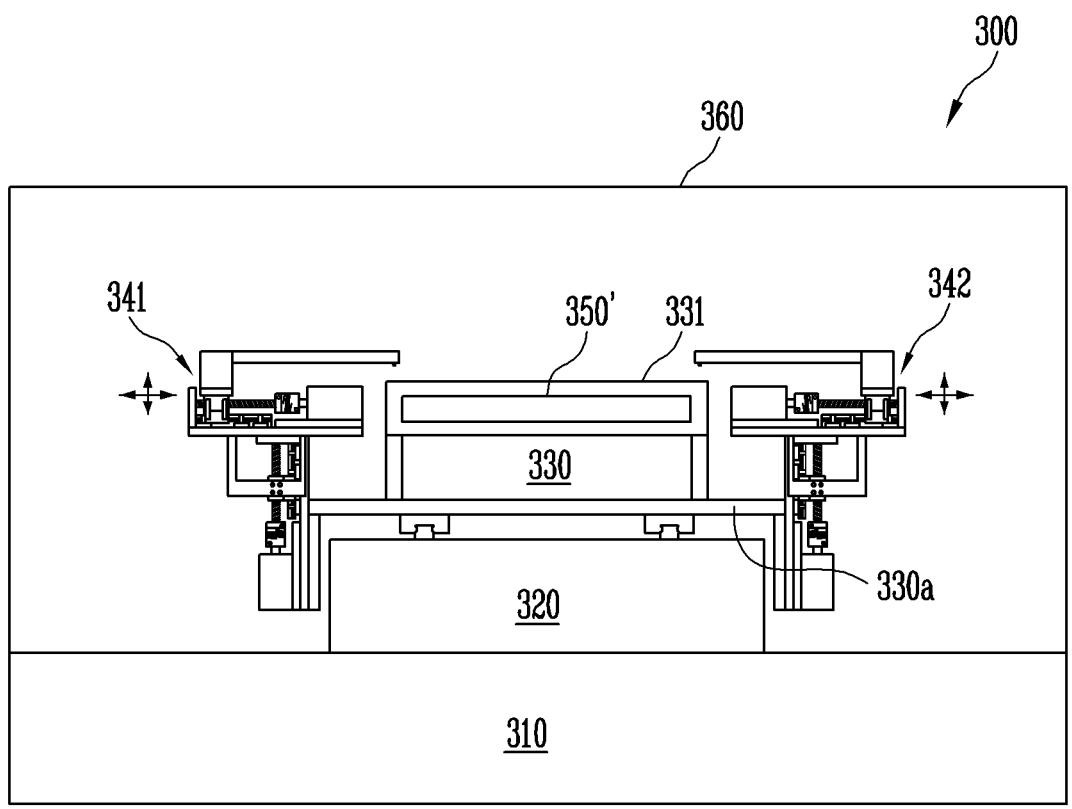
FIGS. 22 and 23 schematically illustrate an apparatus for manufacturing a light emitting display device in accordance with an embodiment of the disclosure, respectively.
Figure 23:
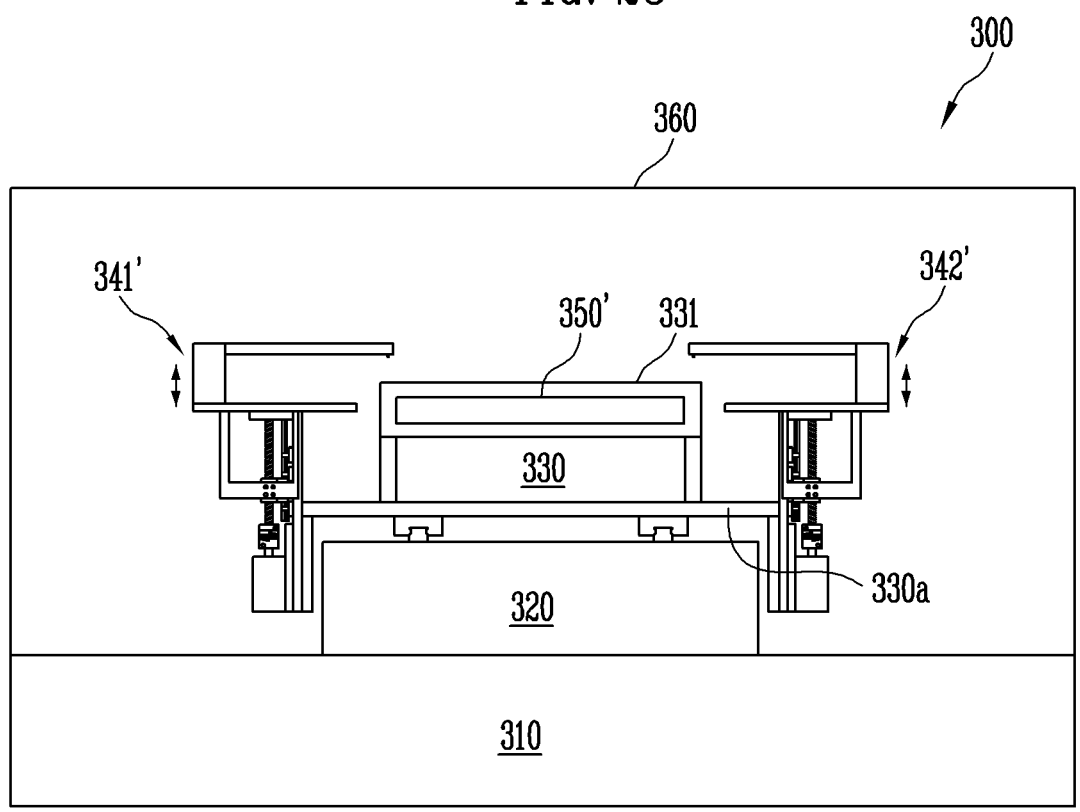
Figure 24:
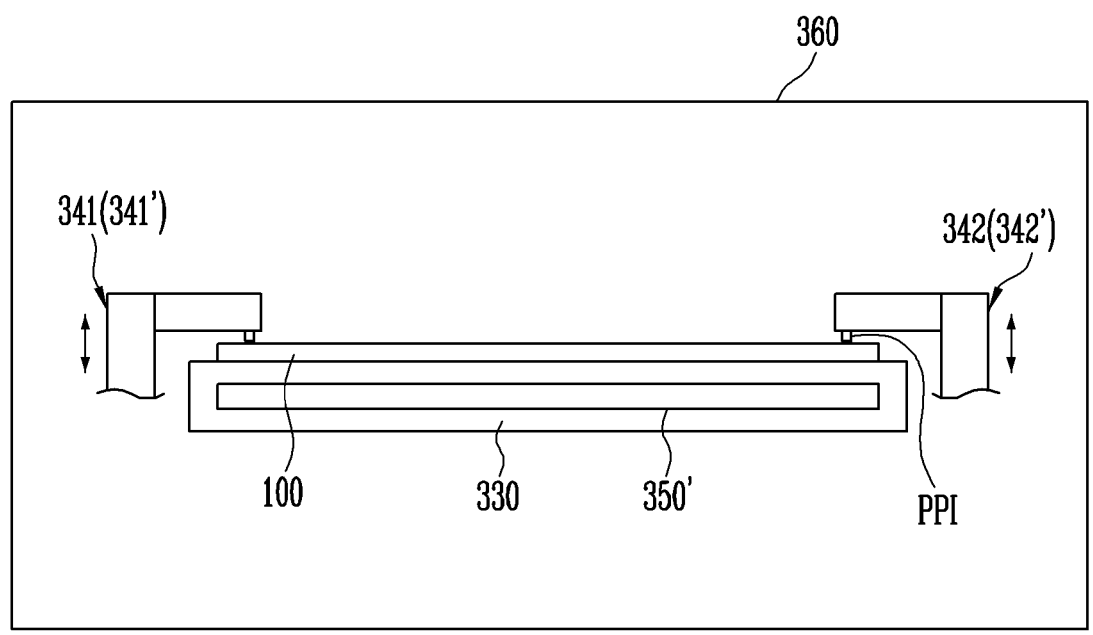
FIG. 24 schematically illustrates an embodiment of a method of driving the manufacturing apparatus of FIGS. 22 and 23.

FIGS. 22 and 23 illustrate an apparatus 300 for manufacturing a light emitting display device in accordance with an embodiment. Furthermore, FIG. 24 illustrates an embodiment of a method of driving the manufacturing apparatus 300 of FIGS. 22 and 23. In detail, FIGS. 22 and 23 illustrate an embodiment different from the embodiments of FIGS. 18 and 19, with respect to the second manufacturing apparatus 300 that may be used to remove a solvent SOL supplied to the substrate 111 of the light emitting display panel 110 or to the base substrate 100 along with the light emitting elements LD, and FIG. 24 illustrates the embodiment of the method of drying the solvent SOL by using the second manufacturing apparatus 300 of FIG. 22 or 23. In an embodiment, the second manufacturing apparatus 300 in accordance with the embodiments of FIGS. 22 to 24 may be a hot plate type of drying device that may apply heat to the substrate 111 of the light emitting display panel 110 or to the base substrate 100. The same reference numerals will denote components common to the second manufacturing apparatus 300 according to the embodiment of FIGS. 22 and 24 and the second manufacturing apparatus 300 according to the above-described embodiments, e.g. the embodiment of FIGS. 18 to 20B, and detailed descriptions thereof will be omitted.

First, referring to FIGS. 22 and 23, the second manufacturing apparatus 300 in accordance with the embodiment may include a heating element 350' that is disposed in the stage 330. For instance, the stage 330 may be provided with a hot plate 331 including the heating element 350'. In an embodiment, the hot plate 331 may be disposed on an upper end of the stage 330, but the position of the hot plate 331 is not limited thereto.

Referring to FIG. 24, the solvent SOL supplied to the base substrate 100 may be removed by driving the heating element 350' while applying a predetermined alignment voltage to the base substrate 100 (or the individual substrate 111 of the light emitting display panel 110) disposed on the stage 330 by using the electric-field application module 340, 340' provided in the second manufacturing apparatus 300. Thus, the light emitting elements LD may be stably aligned on the base substrate 100, and the quality of the alignment may be improved.

The manufacturing apparatus of the light emitting display device in accordance with the embodiments of FIGS. 18 to 24, e.g. the second manufacturing apparatus 300 may include the electric-field application modules 340 and 340' as well as the heating elements 350 and 350'. Thus, a predetermined alignment voltage may be supplied to the substrate 111 of the light emitting display panel 110 or to the base substrate 100 disposed on the stage 330 of the second manufacturing apparatus 300, thereby preventing the removal of the light emitting elements LD and stably removing the solvent SOL of the LED solution.

Figure 25:
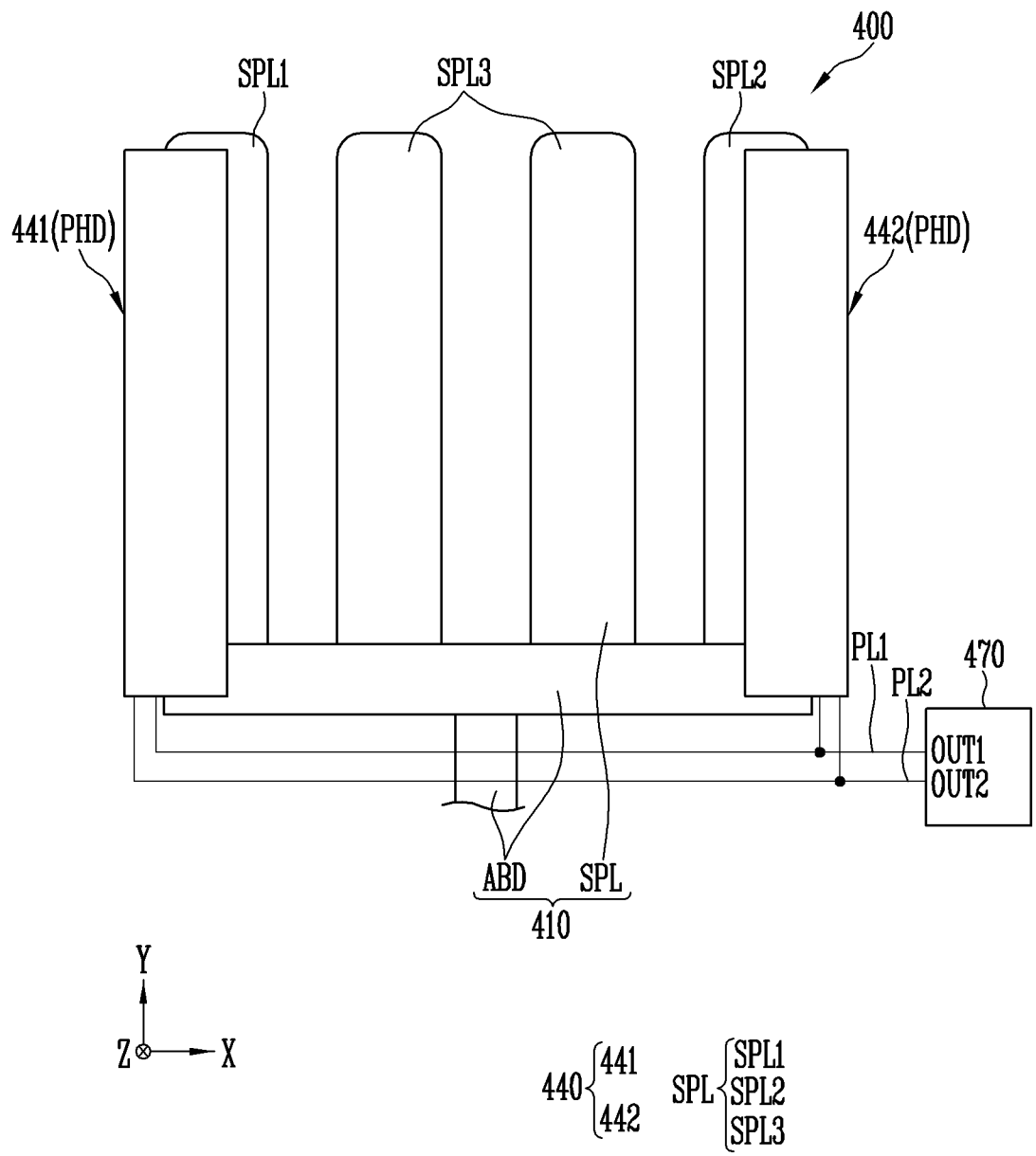
FIGS. 25 and 26 schematically illustrate an apparatus for manufacturing a light emitting display device in accordance with an embodiment of the disclosure, respectively.
Figure 26:
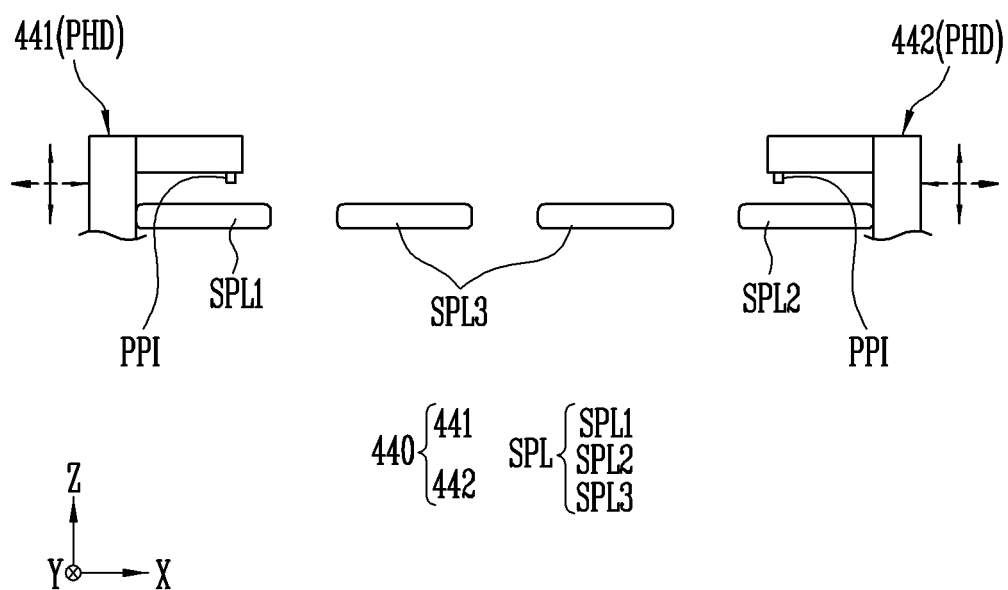

FIGS. 25 and 26 illustrate an apparatus 400 for manufacturing a light emitting display device in accordance with an embodiment. In detail, FIGS. 25 and 26 are a schematic plan view and a schematic side view illustrating the embodiment of the manufacturing apparatus 400 (hereinafter referred to as a "third manufacturing apparatus 400") that may be used to transfer the substrate 111 of the light emitting display panel 110 or the base substrate 100. For instance, the third manufacturing apparatus 400 may be a substrate transfer apparatus for transferring, to a manufacturing apparatus (manufacturing equipment) for performing a predetermined process, the base substrate 100 used to manufacture light emitting display panels 110 at once or each substrate 111 used to individually manufacture each light emitting display panel 110, in the process of manufacturing the light emitting display panel 110.

In FIGS. 25 and 26, reference numeral "440" may collectively correspond to at least one electric-field application module, and correspond to, for example, each electric-field application module or electric-field application modules. Furthermore, reference character "SPL" may collectively correspond to at least one support plate, and correspond to, for example, each support plate or support plates.

Referring to FIGS. 25 and 26, the third manufacturing apparatus 400 in accordance with an embodiment may include a substrate transfer stage 410, and at least one electric-field application module 440 provided on at least one side of the substrate transfer stage 410. For instance, the third manufacturing apparatus 400 may include electric-field application modules 440 mounted on different sides of the substrate transfer stage 410. FIGS. 25 and 26 schematically illustrate each electric-field application module 440 with respect to the probe head PHD, and thus a mutual position between the substrate transfer stage 410 and the electric-field application module 440 is clearly shown. In an embodiment, a configuration of the electric-field application module 440 may be substantially similar or identical to those of the electric-field application modules 240 and/or 340 provided in the above-described first and/or second manufacturing apparatuses 200 and/or 300, but the disclosure is not limited thereto. Furthermore, in an embodiment, the third manufacturing apparatus 400 may further include a power supply component 470 electrically connected to the electric-field application module 440. In an embodiment, the power supply component 470 may be regarded as some of components of the electric-field application module 440.

In an embodiment, the substrate transfer stage 410 may be a robot arm, but the disclosure is not limited thereto. The substrate transfer stage 410 may include support plates SPL disposed at a predetermined interval in the first direction (e.g. X-axis direction), and a body that is integrally or not integrally connected to (or integral or not integral with) the support plates SPL, e.g. an arm body ABD. For example, the support plates SPL may include a first support plate SPL1 disposed on a first edge (e.g. left edge) of the substrate transfer stage 410, a second support plate SPL2 disposed on a second edge (e.g. right edge) of the substrate transfer stage 410, and at least one third support plate SPL3 disposed between the first and second support plates SPL1 and SPL2. The support plates SPL may be spaced apart from each other in the first direction. Each of the support plates SPL may extend in the second direction (e.g. Y-axis direction) intersecting the first direction. These support plates SPL may be connected to the arm body ABD. For instance, at least one area of the arm body ABD may extend in the first direction to be connected to the support plates SPL in common.

In an embodiment, at least one electric-field application module 440 may be provided on at least one side of the substrate transfer stage 410. For example, the first electric-field application module 441 may be mounted on a first side of the substrate transfer stage 410, and the second electric-field application module 442 may be mounted on a second side of the substrate transfer stage 410. In an embodiment, the first and second electric-field application modules 441 and 442 may face each other. For instance, the first electric-field application module 441 may be disposed around the first support plate SPL1, and the second electric-field application module 442 may be disposed around the second support plate SPL2 to face the first electric-field application module 441.

In an embodiment, the first and second electric-field application modules 441 and 442 may be integrally or not integrally connected to (or be integral or not integral with) the first and second support plates SPL1 and SPL2, respectively. However, the disclosure is not limited thereto. For example, in another embodiment, the first and second electric-field application modules 441 and 442 may be disposed around the first and second support plates SPL1 and SPL2, respectively, and may be separated from the first and second support plates SPL1 and SPL2.

In an embodiment, the first and second electric-field application modules 441 and 442 may be driven independently and/or individually. Thus, the first and second electric-field application modules 441 and 442 may be readily and selectively driven.

Furthermore, in an embodiment, the first and second electric-field application modules 441 and 442 may be driven simultaneously. Thus, during the transfer of the substrate 111 of the light emitting display panel 110 or the base substrate 100, a desired voltage (e.g. a predetermined alignment voltage) may be smoothly supplied to the substrate 111 or the base substrate 100.

In an embodiment, each electric-field application module 440 may be configured to move horizontally and/or vertically. For example, each electric-field application module 440 may be configured to move horizontally forwards and backwards or leftwards and rightwards in the X-axis direction and to move vertically upwards and downwards in the Z-axis direction. As another example, in another embodiment, each electric-field application module 440 may be configured to move vertically (e.g. up-and-down movement) in the Z-axis direction.

In an embodiment, the power supply component 470 may be electrically connected to at least one probe pin PPI to supply a predetermined voltage or signal to the probe pin PPI. For instance, the power supply component 470 may be electrically connected via the first and second power lines PL1 and PL2 to different probe pins PPI. In an embodiment, the power supply component 470 may supply a predetermined voltage (or signal) having a predetermined waveform and/or potential through a first output terminal OUT1 to the first power line PL1 and may supply a reference voltage having a predetermined reference potential through a second output terminal OUT2 to the second power line PL2.

In the third manufacturing apparatus 400 according to the above-described embodiment, a predetermined alignment voltage may be applied to the substrate 111 or the base substrate 100 even during the transfer of the substrate 111 of the light emitting display panel 110 or the base substrate 100 by using the substrate transfer stage 410. Thus, the light emitting elements LD may be prevented from being dislodged or removed from the aligned position during the transfer of the substrate 111 or the base substrate 100.

Figure 27:
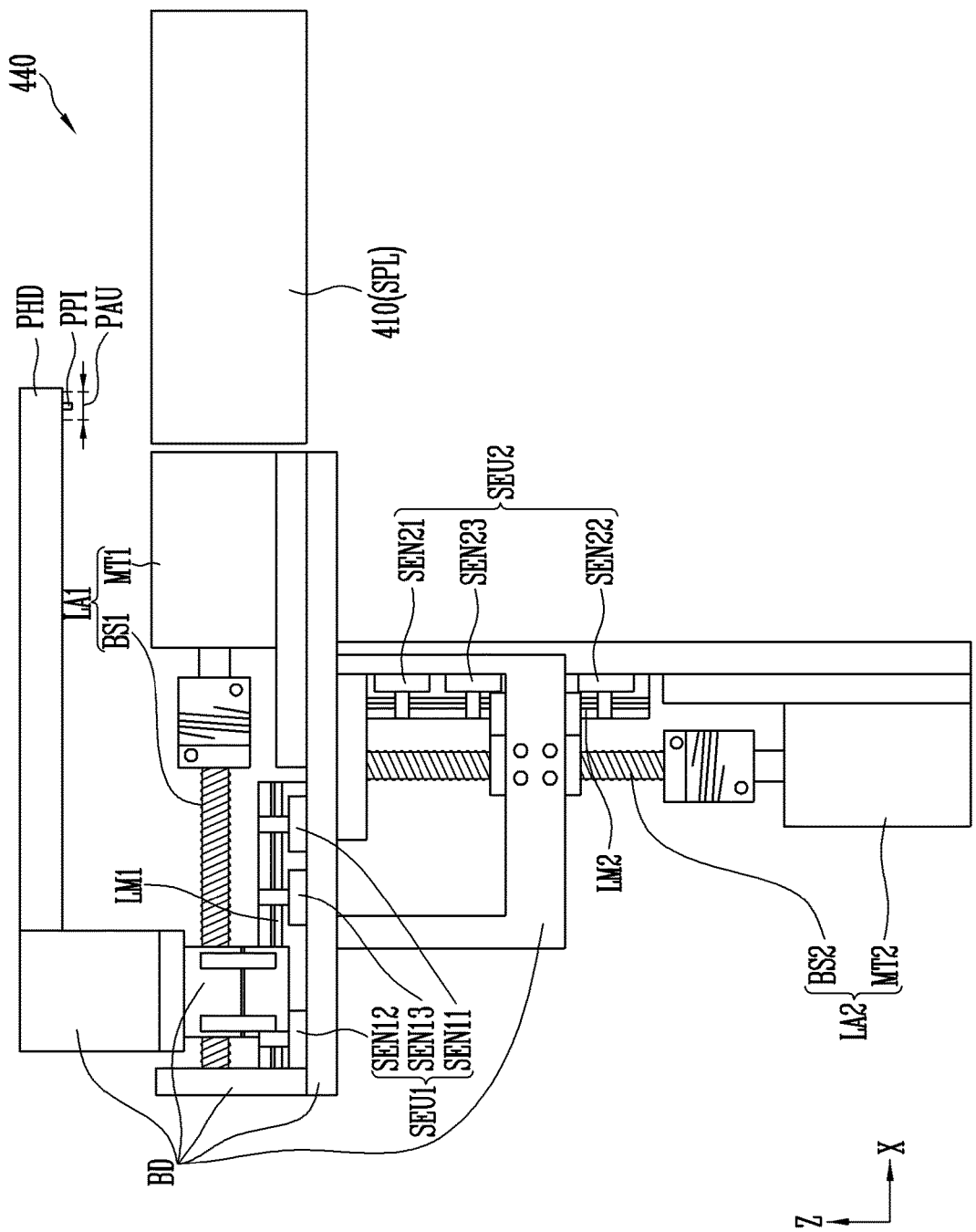
FIGS. 27 and 28 schematically illustrate an embodiment related to the configuration and arrangement of an electric-field application module of FIGS. 25 and 26.
Figure 28:
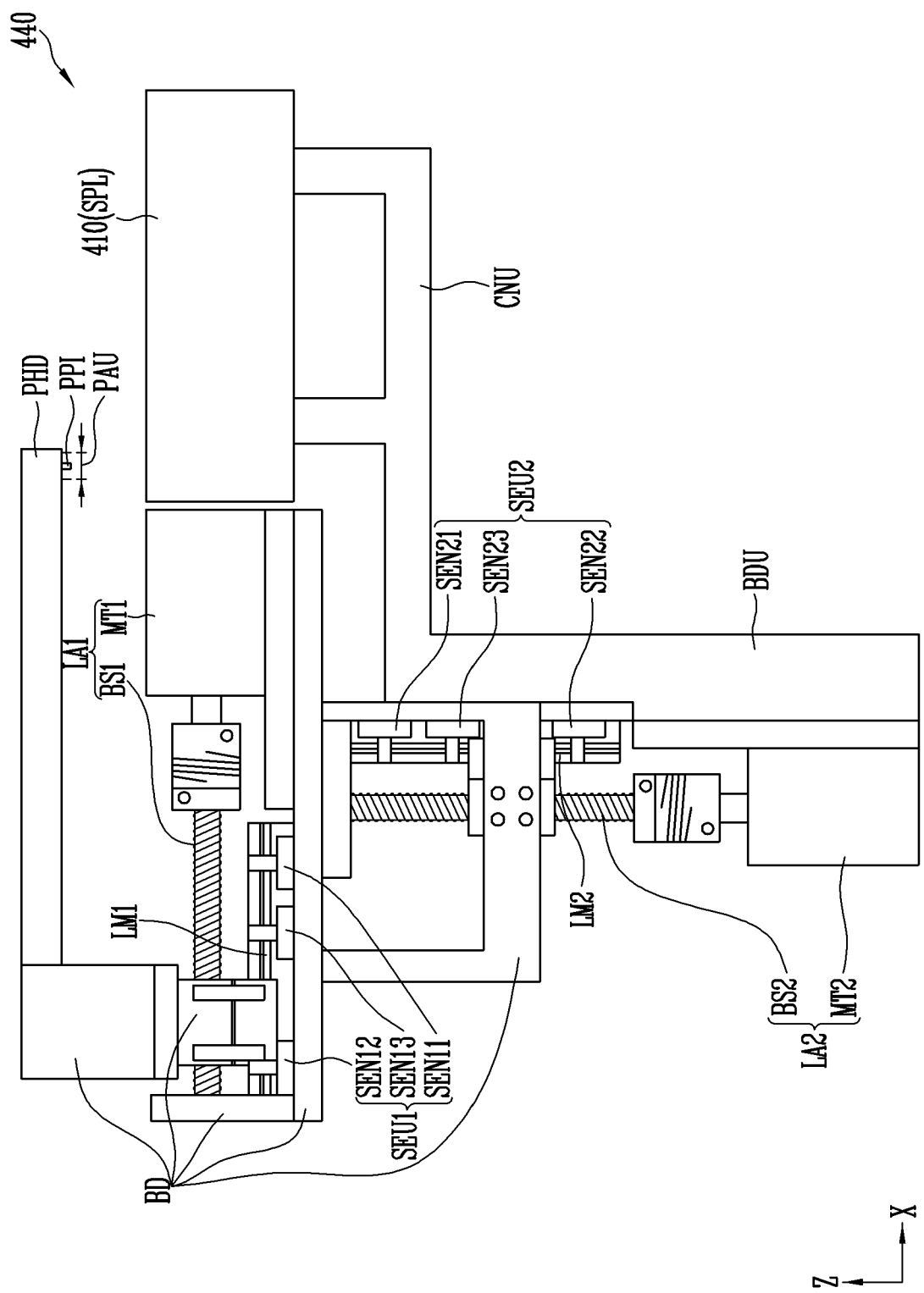

FIGS. 27 and 28 illustrate an embodiment related to the configuration and arrangement of the electric-field application module 440 of FIGS. 25 and 26. In the electric-field application module 440 according to the embodiment of FIGS. 27 and 28, the same reference numerals are used to designate components similar and/or identical to those of the electric-field application modules 240 and/or 340 provided in the above-described first and/or second manufacturing apparatuses 200 and/or 300, and detailed descriptions thereof will be omitted.

Referring to FIGS. 27 and 28, each electric-field application module 440 provided in the third manufacturing apparatus 400 may be configured to be substantially identical or similar to each electric-field application module 240 or 340 provided in the first and/or second manufacturing apparatus 200 and/or 300. For instance, each electric-field application module 440 provided in the third manufacturing apparatus 400 may include a probe head PHD including at least one probe pin PPI, first and second drivers LA1 and LA2 for moving the probe head PHD horizontally and vertically, and a body BD connected to the probe head PHD and the first and second drivers LA1 and LA2. Furthermore, each electric-field application module 440 of the third manufacturing apparatus 400 may optionally further include at least one sensor unit (e.g. first and/or second sensor unit SEU1 and/or SEU2) disposed around the first and/or second driver LA1, LA2 to detect the position of the probe head PHD, and at least one linear motion guide (e.g. first and/or second linear motion guide LM1 and/or LM2) connected to the body BD.

In an embodiment, the first driver LA1 may horizontally move the probe head PHD forwards and backwards or leftwards and rightwards, and the second driver LA2 may vertically move the probe head PHD upwards and downwards. Thus, the movement of the electric-field application module 440 provided in the third manufacturing apparatus 400 may be readily controlled.

In an embodiment, the probe head PHD may include probe pins PPI. For example, as illustrated in FIG. 10, the probe head PHD may include at least one first probe pin PPI1 and at least one second probe pin PPI2. The first and second probe pins PPI1 and PPI2 may be electrically connected to the power supply component 470 of FIG. 25 through the first and second power lines PL1 and PL2, respectively.

According to an embodiment, each electric-field application module 440 may be disposed on any side of the substrate transfer stage 410. For example, each electric-field application module 440 may be disposed around any support plate disposed on any edge of the substrate transfer stage 410, e.g. the first or second support plate SPL1 or SPL2 of FIGS. 25 and 26.

In an embodiment, each electric-field application module 440 may be disposed around any support plate SPL as illustrated in FIG. 27. Here, the electric-field application module 440 may not be directly connected or coupled to the support plate SPL. For example, each electric-field application module 440 may be disposed adjacent to any support plate SPL, so that the electric-field application module 440 may or may not contact the support plate SPL. Furthermore, the electric-field application module 440 may be connected or coupled to the substrate transfer stage 410 including the support plate SPL to move along with the substrate transfer stage 410 or may be independently moved without being connected or coupled to the substrate transfer stage 410.

In another embodiment, each electric-field application module 440 may be disposed around any one support plate SPL, as illustrated in FIG. 28, so that the electric-field application module 440 may be directly connected and/or coupled to the support plate SPL. For example, each electric-field application module 440 may be disposed adjacent to any support plate SPL, so that the electric-field application module 440 may be integrally or not integrally connected and/or coupled to (or be integral or not integral with) the support plate SPL. For instance, the electric-field application module 440 and the support plate SPL may be connected or coupled to each other through a connector CNU and a body BDU. In this case, the electric-field application module 440 may be moved along with the support plate SPL by the substrate transfer stage 410.

Figure 29:
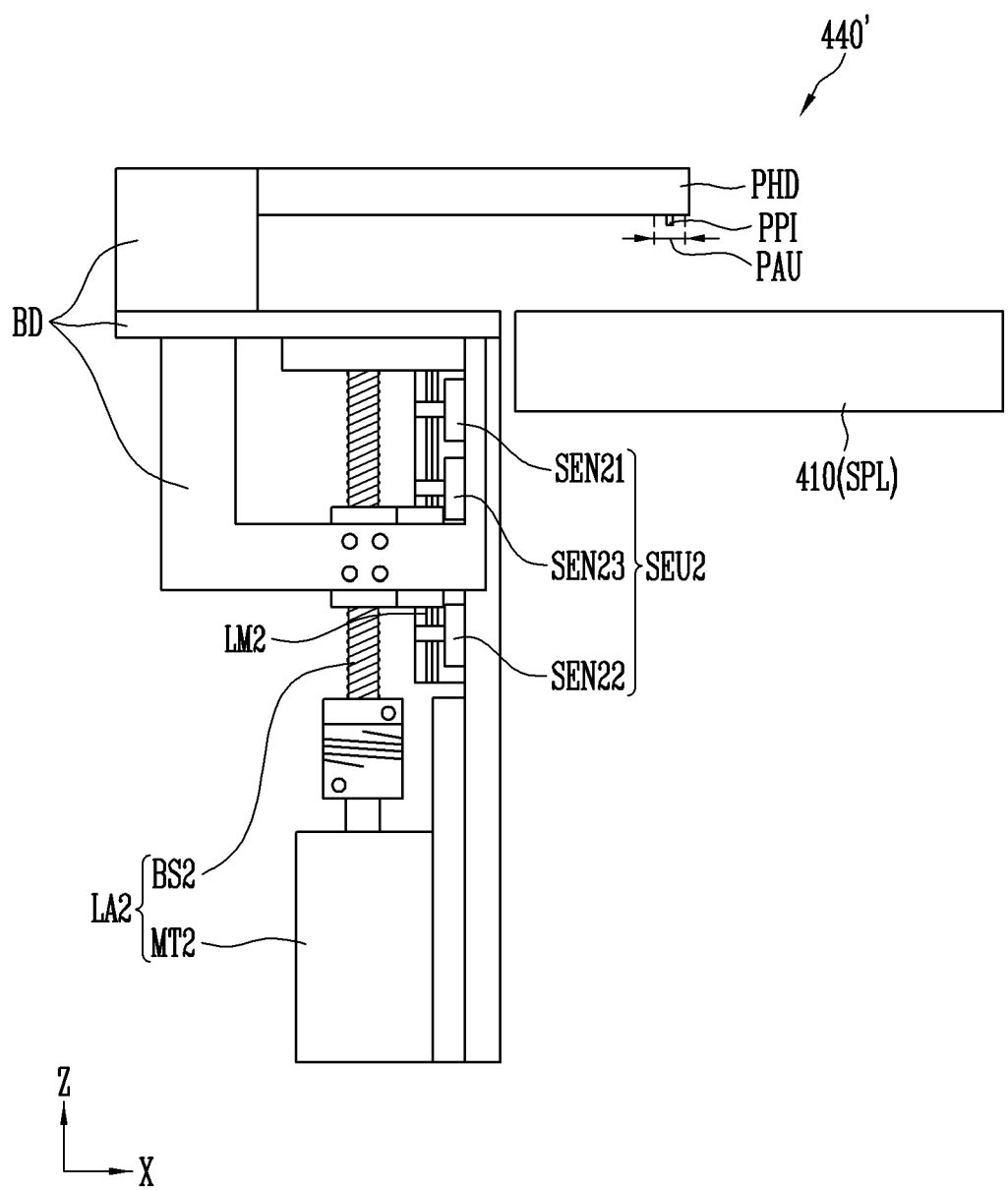
FIGS. 29 and 30 illustrate an embodiment related to the configuration and arrangement of the electric-field application module of FIGS. 25 and 26.
Figure 30:
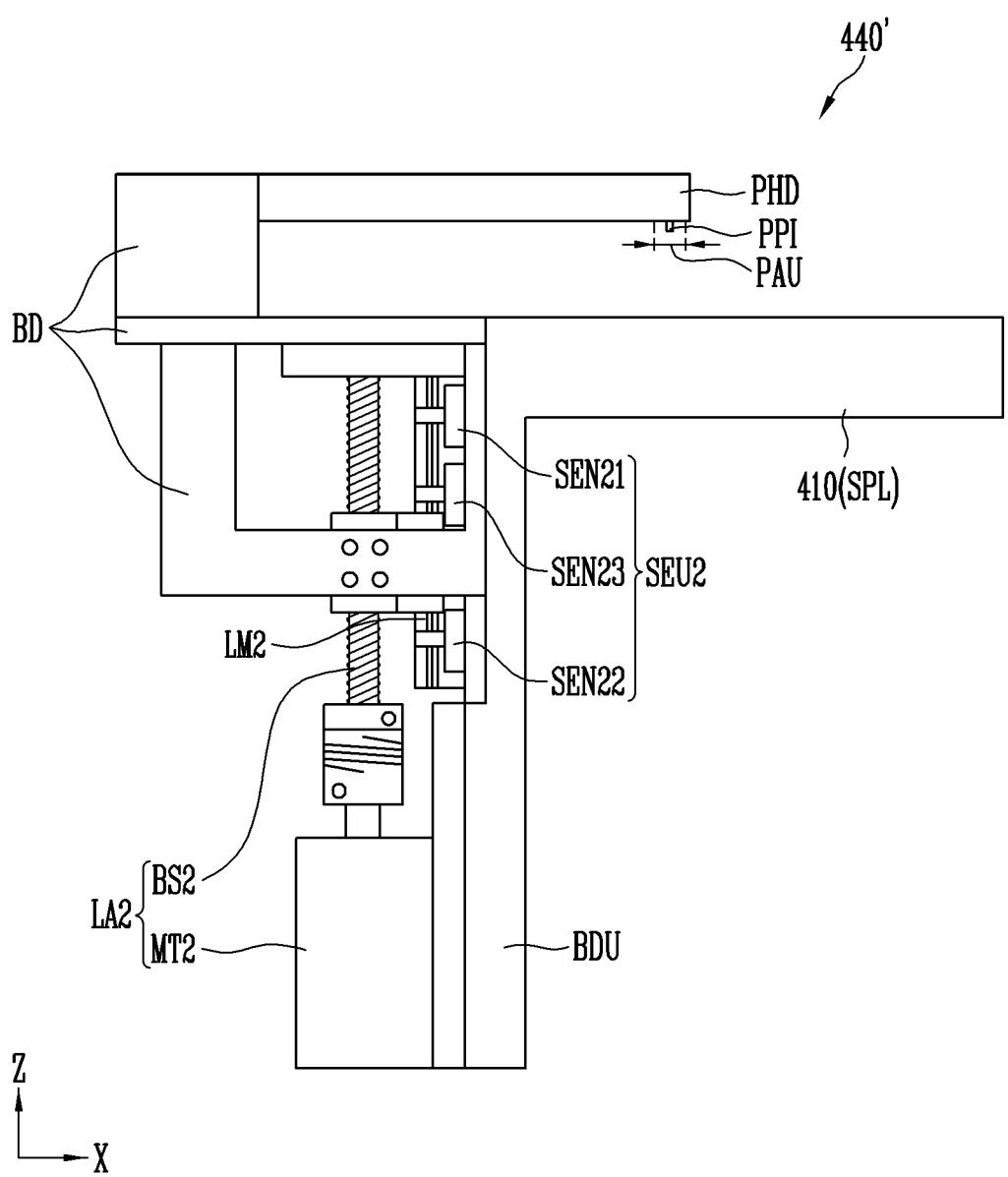

FIGS. 29 and 30 illustrate an embodiment related to the configuration and arrangement of the electric-field application module 440' of FIGS. 25 and 26. In the electric-field application module 440' according to an embodiment of FIGS. 29 and 30, the same reference numerals are used to designate components similar or identical to those of the electric-field application module 440 according to an embodiment of FIGS. 27 and 28. Thus, detailed descriptions thereof will be omitted.

Referring to FIGS. 29 and 30, each electric-field application module 440' according to the embodiment may vertically move. For instance, the electric-field application module 440' may not be provided with the first driver LA1 according to the embodiment of FIGS. 27 and 28, but may be provided with only the second driver LA2 for the vertical movement of the probe head PHD. Each probe head PHD may vertically move.

In an embodiment, each electric-field application module 440' may be disposed around any support plate SPL as illustrated in FIG. 29. Here, the electric-field application module 440' may not be directly connected or coupled to the support plate SPL. For example, each electric-field application module 440' may be disposed adjacent to any support plate SPL, so that the electric-field application module 440' may or may not contact the support plate SPL. Furthermore, the electric-field application module 440' may be connected and/or coupled to the substrate transfer stage 410 including the support plate SPL to move along with the substrate transfer stage 410 or may be independently moved without being connected or coupled to the substrate transfer stage 410.

In another embodiment, each electric-field application module 440' may be disposed around any support plate SPL as illustrated in FIG. 30, so that the electric-field application module 440' may be directly connected and/or coupled to the support plate SPL. For example, each electric-field application module 440' may be disposed adjacent to any support plate SPL, so that the electric-field application module 440' may be integrally or non-integrally connected and/or coupled to (or be integral or not integral with) the support plate SPL. For instance, the electric-field application module 440' and the support plate SPL may be connected and/or coupled to each other through the body BDU. In this case, the electric-field application module 440' may be moved along with the support plate SPL by the substrate transfer stage 410.

The manufacturing apparatus of the light emitting display device in accordance with the embodiments of FIGS. 25 to 30, e.g. the third manufacturing apparatus 400, may include a substrate transfer stage 410, and an electric-field application module 440 or 440' provided on at least one side of the substrate transfer stage 410. Thus, even in case that the substrate 111 of the light emitting display panel 110 or the base substrate 100 disposed on the substrate transfer stage 410 is being transferred, a predetermined alignment voltage may be supplied to the substrate 111 or the base substrate 100. Thus, the substrate 111 or the base substrate 100 may be stably transferred while the light emitting elements LD are prevented from being removed because of the volatilization of the solvent SOL which may occur during the transfer of the substrate 111 or the base substrate 100. Therefore, the light emitting elements LD may be stably aligned in each emission area EA, and the quality of the alignment may be improved.

Figure 31A:
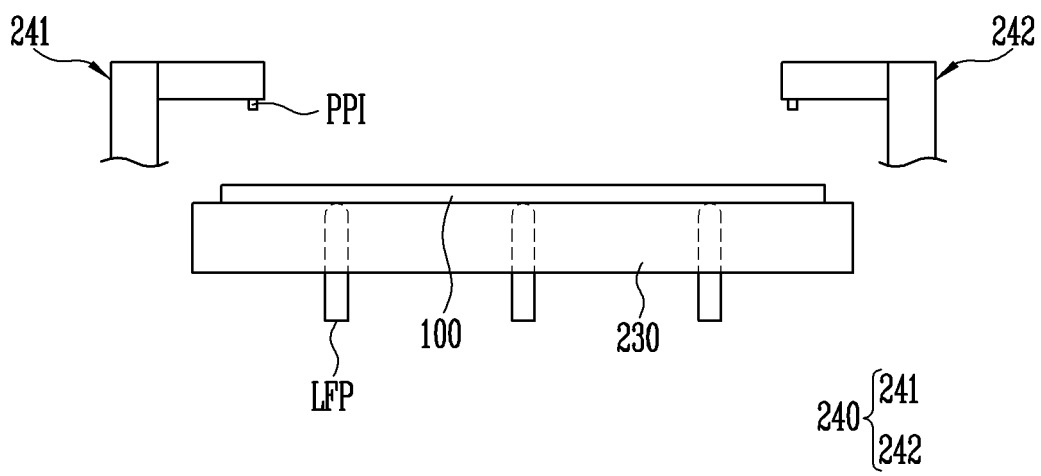
Figure 31B:
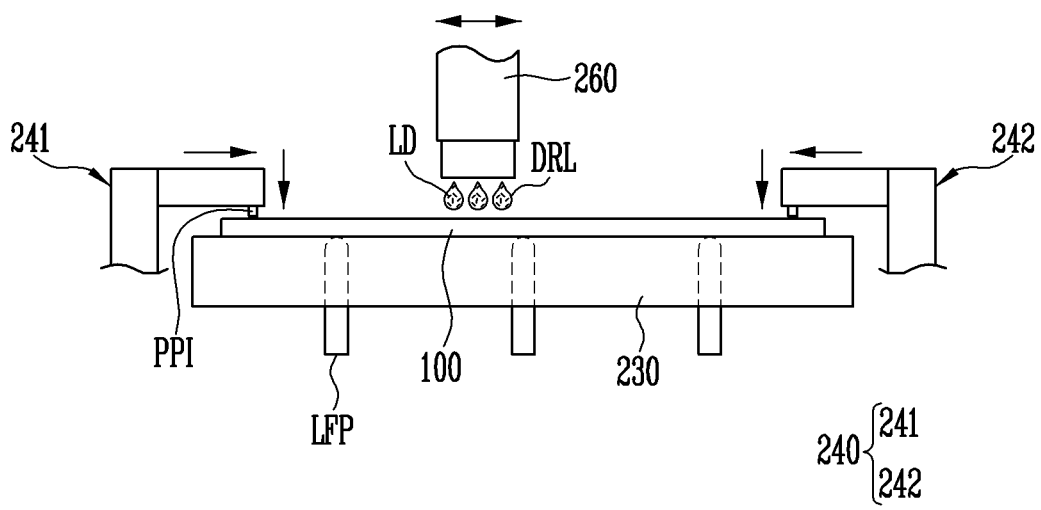
Figure 31G:
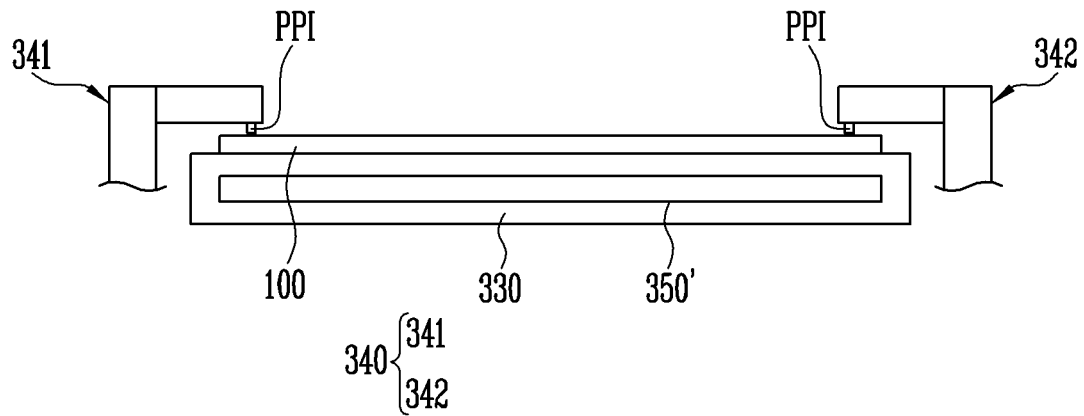
Figure 32:
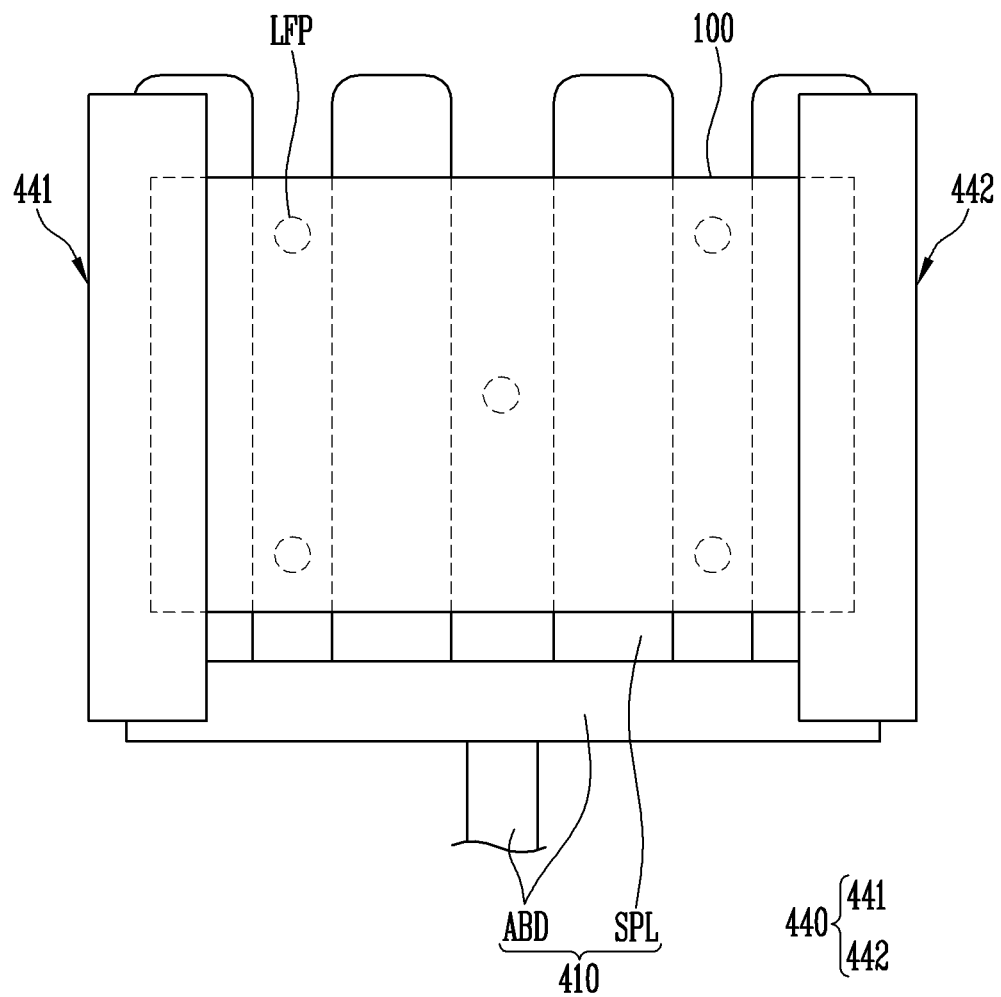
FIG. 32 schematically illustrates a state in which a base substrate is disposed on the apparatus for manufacturing the light emitting display device in accordance with the embodiment of FIGS. 25 to 30.

FIGS. 31A to 31G illustrate a method of manufacturing a light emitting display device in accordance with an embodiment. Although FIGS. 31A to 31G illustrate an embodiment in which light emitting display panels 110 are manufactured on the base substrate 100 at once, the disclosure is not limited thereto. For example, in another embodiment, the process of supplying and aligning the light emitting elements LD, the process of transferring the substrate 111, and the process of removing the solvent SOL may be performed on the individual substrate 111 for manufacturing each light emitting display panel 110. Furthermore, FIG. 32 illustrates a state in which the base substrate 100 is disposed on the manufacturing apparatus of the light emitting display device according to the embodiment of FIGS. 25 to 30, e.g. the third manufacturing apparatus 400 including the substrate transfer stage 410 on which the electric-field application module 440 is mounted. In FIGS. 31A to 32, the same reference numerals will be used to designate components similar or identical to those of the previous embodiments, and detailed descriptions thereof will be omitted.

Referring to FIGS. 1 to 31A, the base substrate 100 (or the substrate 111 of the light emitting display device) in which the first and second pixel electrodes ELT1 and ELT2 are formed may be provided in each emission area EA as shown in FIG. 20B, and the base substrate 100 may be disposed on the stage 230 (hereinafter referred to as the "first stage") of the first manufacturing apparatus 200. Lift pins LFP may be provided in the first stage 230, and the lift pins LFP may maintain a state in which the lift pins LFP do not protrude upwards from the first stage 230 until the subsequent process of supplying and aligning the light emitting elements LD is completed.

Referring to FIGS. 1 to 31B, a light-emitting-element solution containing the light emitting elements LD may be supplied to each emission area EA while a predetermined alignment voltage is applied to the first and second pixel electrodes ELT1 and ELT2 of the base substrate 100 by using the electric-field application module 240 of the first manufacturing apparatus 200. In an embodiment, the light-emitting-element solution may be supplied to each emission area EA in the form of the droplet DRL by the printing method using the printing head 260.

In an embodiment, a step of supplying the light-emitting-element solution may include a step of applying a predetermined alignment voltage (or an electric field generated by the alignment voltage) to the first and second pixel electrodes ELT1 and ELT2 by driving at least one electric-field application module 240 provided on at least one side of the first stage 230, and a step of supplying the light-emitting-element solution to each emission area EA using the printing head 260 during a period in which the alignment voltage is applied. In other words, in an embodiment, the supply process and the aligning process of the light emitting elements LD may be simultaneously performed by supplying the light emitting elements LD in the form of a solution while forming a predetermined electric field in each emission area EA by using the first manufacturing apparatus 200 (e.g. the inkjet printer) including at least one electric-field application module 240.

Referring to FIGS. 1 to 31C, after the supply process and the aligning process of the light emitting elements LD are completed, the electric-field application module 240 of the first manufacturing apparatus 200 may be moved to separate the probe pin PPI of the electric-field application module 240 from the base substrate 100.

Referring to FIGS. 1 to 31D, after the supply process and the aligning process of the light emitting elements LD using the first manufacturing apparatus 200 are completed, the lift pins LFP may be lifted to protrude upwards from the first stage 230. Thus, the base substrate 100 may be separated from the first stage 230.

Referring to FIGS. 1 to 31E and 32, the base substrate 100 may be lifted by inserting the substrate transfer stage 410 on which at least one electric-field application module 440 is mounted, particularly, the support plates SPL of the substrate transfer stage 410, into the lower portion of the base substrate 100, and by using the support plate SPL. For example, the base substrate 100 may be lifted by moving the support plates SPL upwards while inserting the support plates SPL between the lift pins LFP and supporting the base substrate 100. Thus, the base substrate 100 may be separated from the first stage 230.

Referring to FIGS. 1 to 31F and 32, the base substrate 100 may be transferred using the substrate transfer stage 410 while causing at least one electric-field application module 440 mounted on at least one side of the substrate transfer stage 410 to contact the base substrate 100, and applying a predetermined alignment voltage to the base substrate 100 through the electric-field application module 440. For example, in a state in which the base substrate 100 is disposed on the support plates SPL of the third manufacturing apparatus 400, a predetermined alignment voltage may be applied to the conductive pads 102 of the base substrate 100 by using the electric-field application module 440 of the third manufacturing apparatus 400. The alignment voltage may be transmitted to the first and second pixel electrodes ELT1 and ELT2 formed in each emission area EA. In a state in which the alignment voltage is applied to the first and second pixel electrodes ELT1 and ELT2, the base substrate 100 may be disposed on the stage 330 (hereinafter referred to as the "second stage") of the second manufacturing apparatus 300 by using the substrate transfer stage 410. If the base substrate 100 is disposed on the second stage 330, the third manufacturing apparatus 400 including the substrate transfer stage 410 may be separated from the base substrate 100.

Referring to FIGS. 1 to 31G, the light emitting elements LD may be stably disposed between the first and second pixel electrodes ELT1 and ELT2, by removing the solvent SOL of the light-emitting-element solution while applying a predetermined alignment voltage to the base substrate 100 on the second stage 330. In an embodiment, the step of removing the solvent SOL of the light-emitting-element solution may include a step of applying a predetermined alignment voltage to the first and second pixel electrodes ELT1 and ELT2 by driving the electric-field application module 340 disposed on at least one side of the second stage 330, and a step of supplying heat to the base substrate 100 by driving the heating element disposed around the base substrate 100, e.g. the heating elements 350 and 350' disposed around or on the second stage 330 during a period in which the alignment voltage is applied. For example, in a state in which the electric field is formed between the first and second pixel electrodes ELT1 and ELT2 by applying a predetermined alignment voltage to the base substrate 100, the heating elements 350 and 350' may be driven to increase the temperature of the base substrate 100, thereby performing the drying process of the solvent SOL. Thus, the solvent SOL that has been supplied to the base substrate 100 along with the light emitting elements LD may be removed.

If the solvent SOL is removed in a state in which the alignment voltage is applied to the first and second pixel electrodes ELT1 and ELT2, the misalignment of the light emitting elements LD may be prevented in the process of removing the solvent SOL. Thus, the light emitting elements LD may be stably aligned in each emission area EA, and the quality of the alignment may be improved.

In the embodiments of FIGS. 6 to 32, the first manufacturing apparatus 200 including the printing head 260 for supplying the light emitting elements LD, the second manufacturing apparatus 300 including the heating elements 350 and 350' for drying the solvent SOL, and the third manufacturing apparatus 400 including the substrate transfer stage 410 for transferring the base substrate 100 (or the substrate 111 of the light emitting display device) are illustrated and described as separate configurations, but the disclosure is not limited thereto. For example, in another embodiment, a versatile manufacturing apparatus may be configured or formed by at least partially combining at least some of the features of the first, second, and/or third manufacturing apparatuses 200, 300, and/or 400 described above. For instance, the apparatus for manufacturing the light emitting display device including the printing head 260, the heating element 350 or 350', the substrate transfer stage 410, and at least one electric-field application module 240, 340, 340', 440, or 440' by combining at least some of the embodiments of FIGS. 6 to 32.

According to the above-described embodiments, a predetermined alignment voltage (e.g. an alignment signal of an AC waveform) may be applied to the first and second pixel electrodes ELT1 and ELT2 by using each of the electric-field application modules 240, 340, 340', 440, and 440', in a step for supplying the light emitting elements LD to each emission area EA and stably disposing the light emitting elements LD between the first and second pixel electrodes ELT1 and ELT2, for example, in all of multiple steps including a printing step for supplying and aligning the light emitting elements LD, a transfer step for transferring the base substrate 100 (or the substrate 111 of the light emitting display device), and a drying step for removing the solvent SOL of the light-emitting-element solution. Thus, the misalignment of the light emitting elements LD that may occur after the light emitting elements LD are supplied and aligned may be effectively prevented or reduced. Therefore, according to the above-described embodiments, the light emitting elements LD may be stably aligned in each emission area EA, and the quality of the alignment may be improved.

While the scope of the disclosure are described by detailed embodiments, it should be noted that the above-described embodiments are merely descriptive and should not be considered limiting. It should be understood by those skilled in the art that various changes, substitutions, and alternations may be made herein without departing from the scope of the disclosure as defined by the following claims.

The scope of the disclosure is not limited by detailed descriptions of the disclosure and should be defined by the accompanying claims. Furthermore, all changes or modifications of the disclosure derived from the meanings and scope of the claims, and equivalents thereof should be construed as being included in the scope of the disclosure.

What is claimed is:

1. An apparatus for manufacturing a light emitting display device, comprising:
    a substrate transfer stage including a plurality of support plates arranged at an interval in a first direction, each of the plurality of support plates extending in a second direction; and
    at least one electric-field application module disposed on at least a first side of the substrate transfer stage,
    wherein the at least one electric-field application module comprises:
        a probe head including at least one probe pin; and
        a driver connected to the probe head to move the probe head at least up and down;
    wherein the plurality of support plates comprise:
        a first support plate disposed on a first edge of the substrate transfer stage;
        a second support plate disposed on a second edge of the substrate transfer stage; and
        at least one third support plate disposed between the first support plate and the second support plate;
    wherein the at least one electric-field application module further comprises:
    a first electric-field application module connected to the first support plate; and
    a second electric-field application module connected to the second support plate.

2. The apparatus according to claim 1, wherein the at least one electric-field application module comprises:
    a first electric-field application module disposed on a first side of the substrate transfer stage; and
    a second electric-field application module disposed on a second side of the substrate transfer stage to face the first electric-field application module.

3. The apparatus according to claim 2, wherein the first and second electric-field application modules are driven independently of each other.

4. The apparatus according to claim 2, wherein the first and second electric-field application modules are driven simultaneously.

5. The apparatus according to claim 1, wherein the driver comprises at least one of:
    a first driver that horizontally moves the probe head forwards and backwards or leftwards and rightwards; and
    a second driver that vertically moves the probe head up and down.

6. The apparatus according to claim 1, wherein the at least one electric-field application module comprises at least one sensor unit that senses a position of the probe head.

7. The apparatus according to claim 1, wherein the at least one electric-field application module comprises:
    a body connected to the probe head and the driver; and
    at least one linear motion guide connected to the body.

8. The apparatus according to claim 1, wherein the probe head comprises:
    at least one first probe pin electrically connected to a first power line; and
    at least one second probe pin electrically connected to a second power line.

9. The apparatus according to claim 8, further comprising a power supply component electrically connected to the first and second probe pins through the first and second power lines.

10. The apparatus according to claim 1, wherein the first electric-field application module is driven to apply a first voltage through the at least one probe pin.

11. The apparatus according to claim 10, wherein the second electric-field application module is driven to apply a second voltage through the at least one probe pin.

12. The apparatus according to claim 5, the first driver includes a first motor and a first ball screw connected to the first motor.

13. The apparatus according to claim 12, the second driver includes a second motor and a second ball screw connected to the second motor.

14. The apparatus according to claim 13, each of the first and second motors is a servomotor.

* * * * *